US009859392B2

(12) United States Patent
Lim et al.

(10) Patent No.: US 9,859,392 B2
(45) Date of Patent: Jan. 2, 2018

(54) INTEGRATED CIRCUIT DEVICE AND METHOD OF MANUFACTURING THE SAME

(71) Applicant: Samsung Electronics Co., Ltd., Suwon-si (KR)

(72) Inventors: Ha-jin Lim, Seoul (KR); Gi-gwan Park, Suwon-si (KR); Weon-hong Kim, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/269,001

(22) Filed: Sep. 19, 2016

(65) Prior Publication Data

US 2017/0084711 A1    Mar. 23, 2017

Related U.S. Application Data

(60) Provisional application No. 62/221,299, filed on Sep. 21, 2015.

(30) Foreign Application Priority Data

Nov. 6, 2015  (KR) .................. 10-2015-0155796

(51) Int. Cl.
| | |
|---|---|
| *H01L 29/49* | (2006.01) |
| *H01L 29/51* | (2006.01) |
| *H01L 27/088* | (2006.01) |
| *H01L 29/423* | (2006.01) |
| *H01L 27/092* | (2006.01) |
| *H01L 29/78* | (2006.01) |

(52) U.S. Cl.
CPC ........ *H01L 29/4966* (2013.01); *H01L 27/088* (2013.01); *H01L 27/0886* (2013.01); *H01L 27/092* (2013.01); *H01L 29/42356* (2013.01); *H01L 29/51* (2013.01); *H01L 29/785* (2013.01)

(58) Field of Classification Search
CPC ......... H01L 29/4966; H01L 21/823842; H01L 21/823857; H01L 29/517; H01L 27/092; H01L 29/49; H01L 29/4908; H01L 29/4983; H01L 29/51
USPC .......... 257/369, E29.255; 438/287, 592, 199
See application file for complete search history.

(56) References Cited

U.S. PATENT DOCUMENTS

| | | | |
|---|---|---|---|
| 6,458,695 B1 | 10/2002 | Lin et al. | |
| 6,645,798 B2 | 11/2003 | Hu | |
| 7,538,001 B2 | 5/2009 | Ramaswamy et al. | |
| 7,820,476 B2 | 10/2010 | Nakajima | |
| 8,330,227 B2 | 12/2012 | Hung et al. | |
| 8,343,839 B2 | 1/2013 | Ando et al. | |
| 9,013,000 B2 | 4/2015 | Choi | |

(Continued)

FOREIGN PATENT DOCUMENTS

KR    10-2007-0116455    12/2007

*Primary Examiner* — Jonathan Han
(74) *Attorney, Agent, or Firm* — Muir Patent Law, PLLC

(57) ABSTRACT

An integrated circuit device includes a first gate stack formed on a first high dielectric layer and comprising a first work function adjustment metal containing structure and a second gate stack formed on a second high dielectric layer and comprising a second work function adjustment metal containing structure having an oxygen content that is greater than that of the first work function adjustment metal containing structure.

20 Claims, 51 Drawing Sheets

(56) References Cited

U.S. PATENT DOCUMENTS

| | | |
|---|---|---|
| 2006/0084217 A1 | 4/2006 | Luo et al. |
| 2009/0152636 A1 | 6/2009 | Chudzik et al. |
| 2012/0025327 A1* | 2/2012 | Ji .................... H01L 21/823462 257/411 |
| 2012/0256276 A1* | 10/2012 | Hwang ........... H01L 21/823842 257/410 |
| 2013/0099323 A1 | 4/2013 | Zhu et al. |
| 2013/0149852 A1 | 6/2013 | Nakamura et al. |
| 2014/0106556 A1 | 4/2014 | Schram et al. |
| 2014/0239407 A1 | 8/2014 | Manabe et al. |
| 2015/0187653 A1 | 7/2015 | Niimi et al. |
| 2015/0221559 A1* | 8/2015 | Kang .............. H01L 21/823842 257/369 |

* cited by examiner

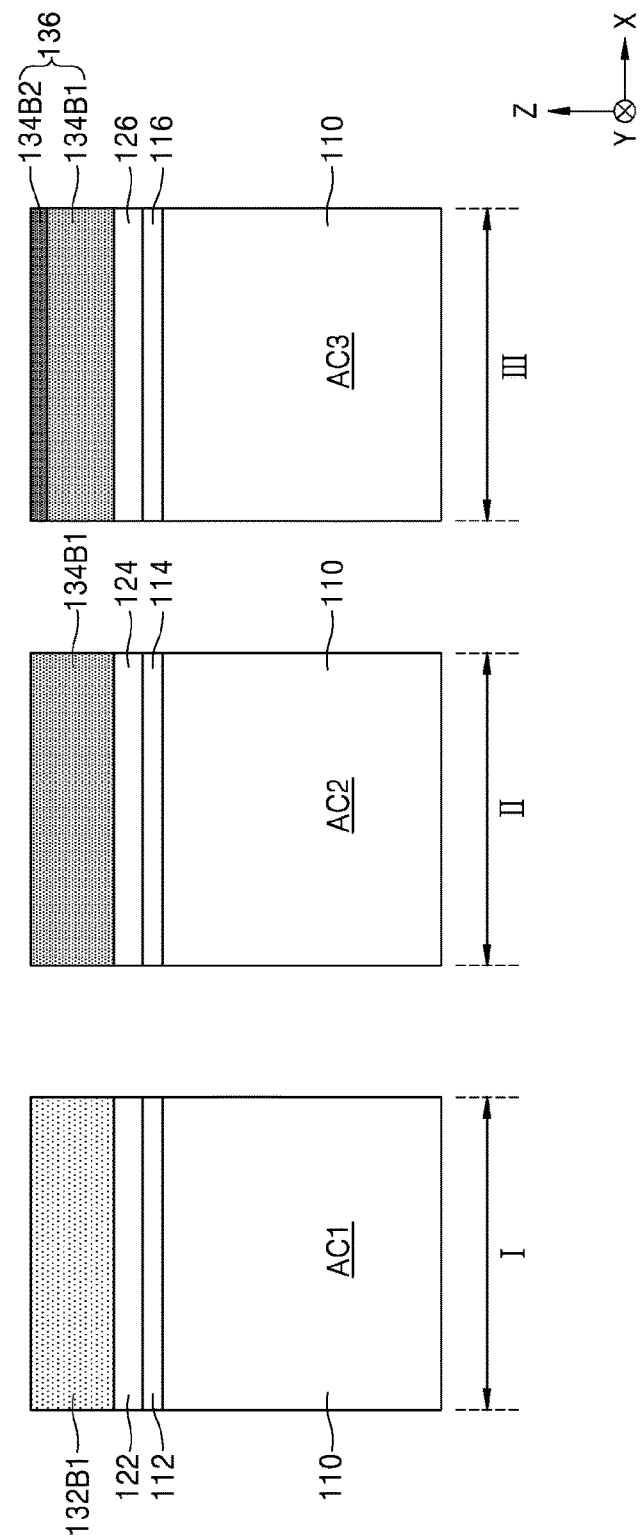

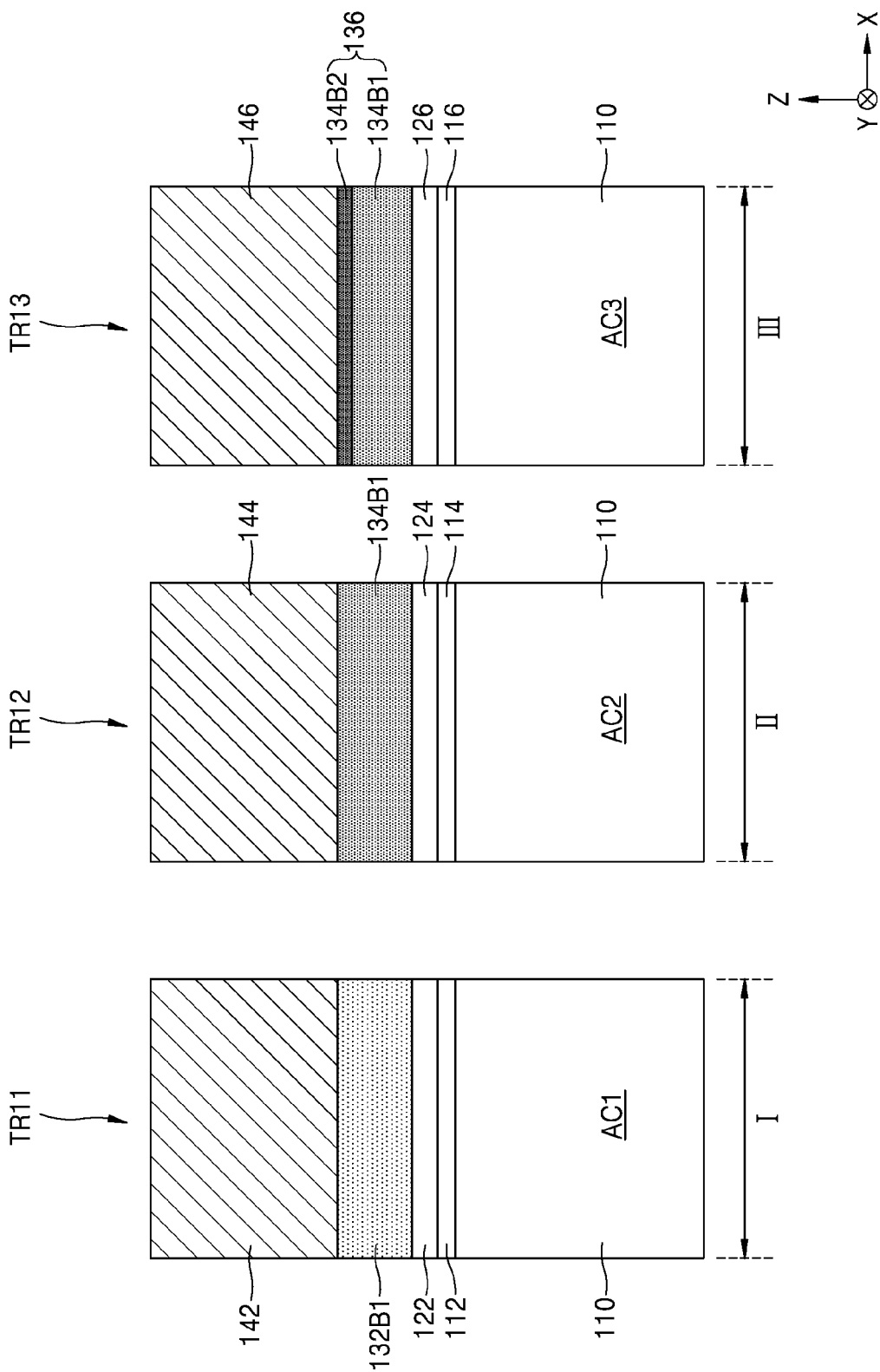

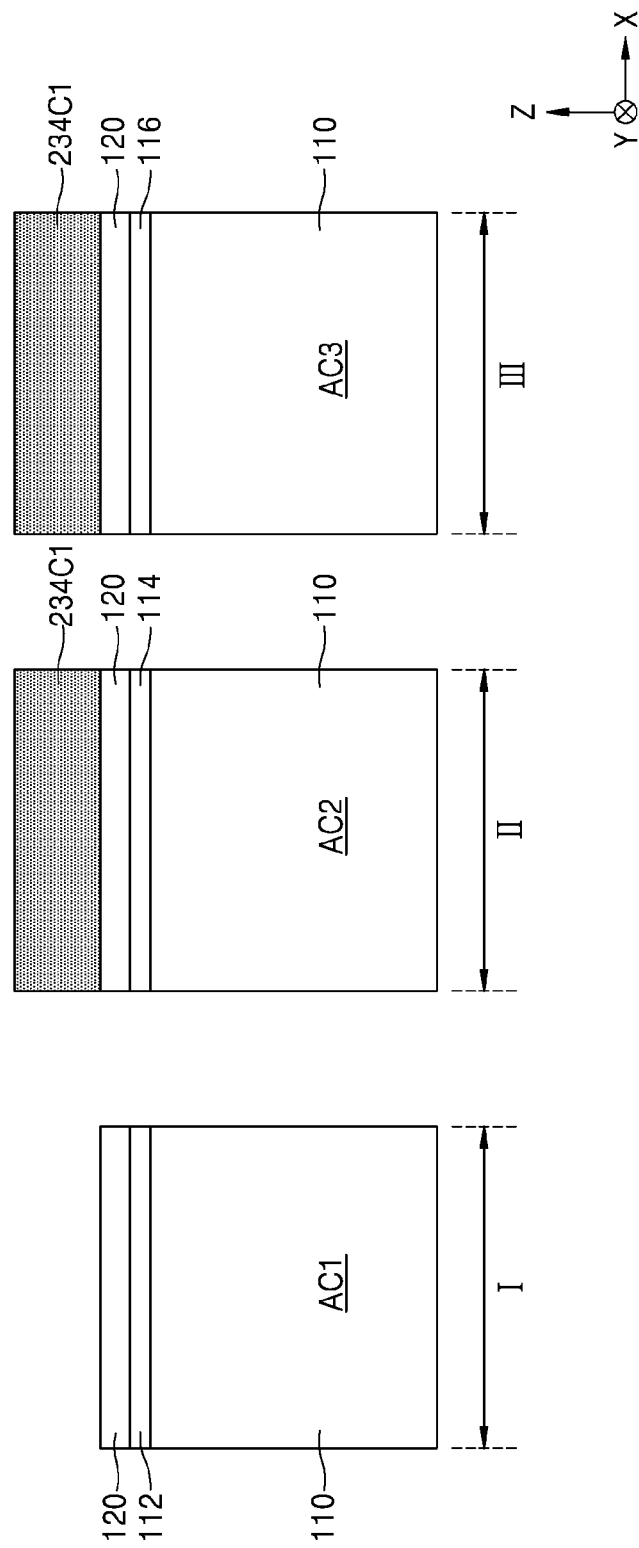

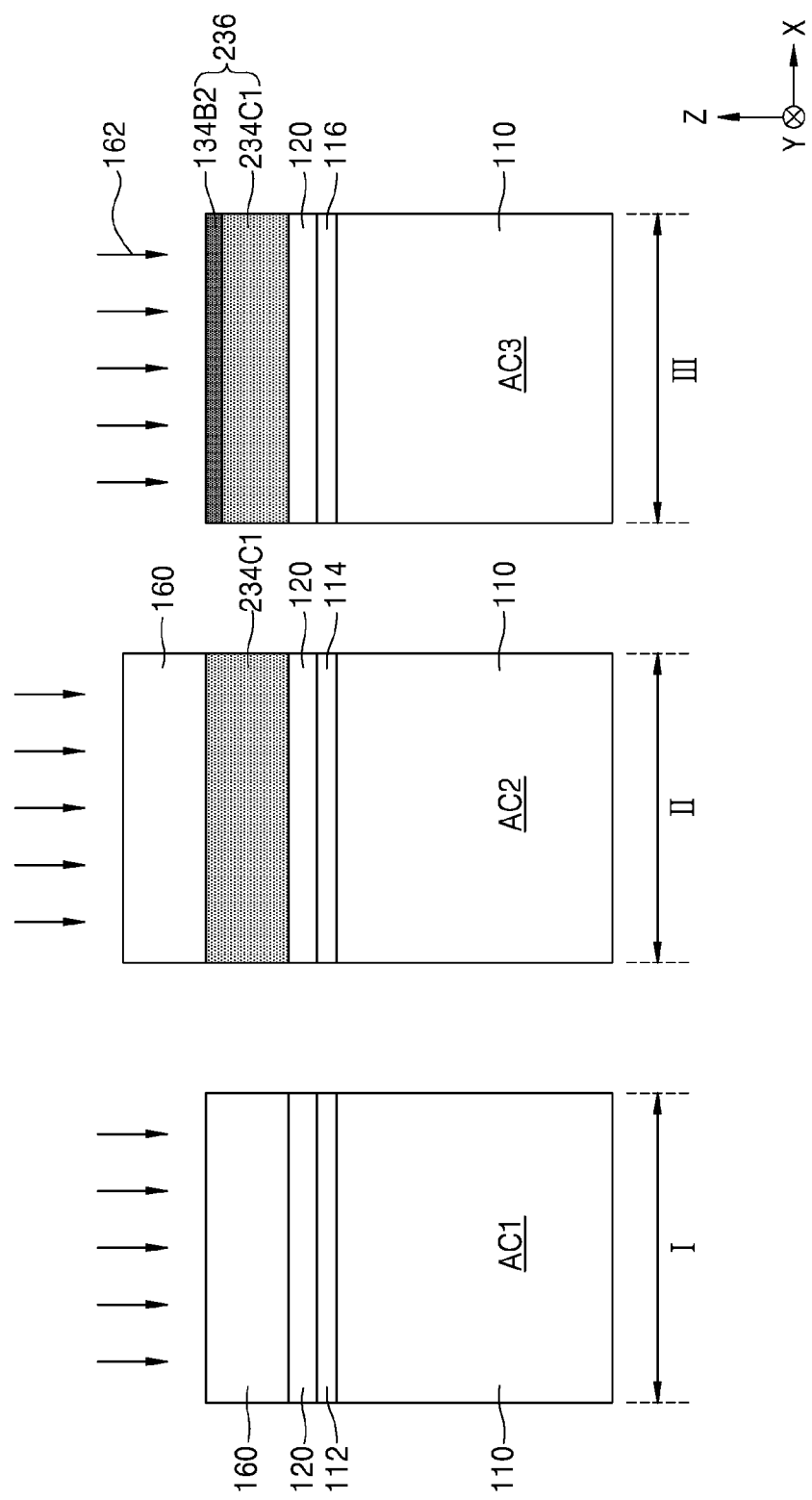

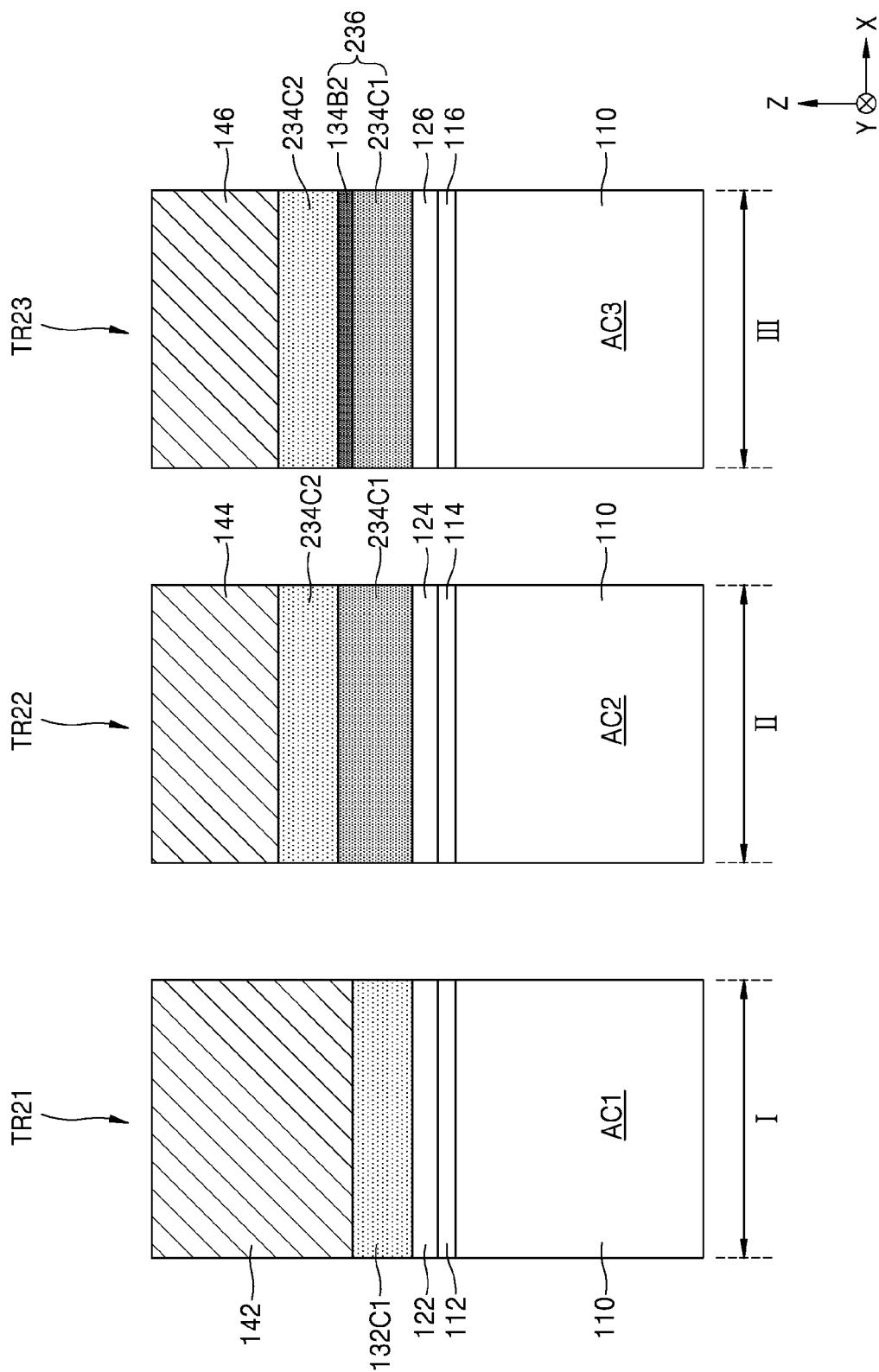

INTEGRATED CIRCUIT DEVICE AND METHOD OF MANUFACTURING THE SAME

CROSS-REFERENCE TO RELATED APPLICATIONS

This application claims the benefit of priority to U.S. Provisional Application No. 62/221,299, filed on Sep. 21, 2015, in the United States Patent and Trademark Office and claims the benefit of priority under 35 U.S.C. §119 to Korean Patent Application No. 10-2015-0155796, filed on Nov. 6, 2015, in the Korean Intellectual Property Office, the disclosure of both of which are incorporated herein in their entireties by reference.

BACKGROUND

The disclosed concepts relate to an integrated circuit device and a method of manufacturing the same, and more particularly, to an integrated circuit device including a metal-oxide-semiconductor (MOS) and a method of manufacturing the same.

Owing to the development of electronic technology, semiconductor devices have been rapidly down-scaled recently. In such down-scaled semiconductor devices, demand for high operation speeds and operation accuracy has increased. Therefore, research into an optimized structure of transistors included in semiconductor devices have been carried out.

SUMMARY

In some exemplary embodiments, the disclosure is directed to an integrated circuit device comprising: a first high dielectric layer on a first active area of a substrate; a first gate stack on the first high dielectric layer and comprising a first work function adjustment metal containing structure having a first oxygen content; a second high dielectric layer formed on a second active area of the substrate; and a second gate stack formed on the second high dielectric layer and comprising a second work function adjustment metal containing structure having a second oxygen content that is greater than the first oxygen content of the first work function adjustment metal containing structure.

In further exemplary embodiments, the disclosure is directed to an integrated circuit device comprising: a first gate structure comprising: a first high dielectric layer formed on a first active area of a substrate and having a first oxygen vacancy density, and a first work function adjustment metal containing structure formed on the first high dielectric layer and comprising a first conductive layer having a first oxygen content; and a second gate structure comprising: a second high dielectric layer formed on a second active area of the substrate and having a second oxygen vacancy density lower than the first oxygen vacancy density, and a second work function adjustment metal containing structure formed on the second high dielectric layer and comprising a second conductive layer having a second oxygen content that is greater than the first oxygen content.

In further exemplary embodiments, the disclosure is directed to a method of manufacturing an integrated circuit device, the method comprising: forming a first dielectric layer on a substrate in a first area and a second dielectric layer on the substrate in a second area; and forming a first work function adjustment metal containing structure covering the first dielectric layer in the first area and a second work function adjustment metal containing structure covering the second dielectric layer in the second area, wherein the first work function adjustment metal containing structure has a first oxygen content and the second work function adjustment metal containing structure has a second oxygen content that is greater than the first oxygen content of the first work function adjustment metal containing structure.

BRIEF DESCRIPTION OF THE DRAWINGS

The disclosed embodiments will be more clearly understood from the following detailed description taken in conjunction with the accompanying drawings in which:

FIGS. 14A through 14D are cross-sectional views for describing a method of manufacturing an integrated circuit device, according to other exemplary embodiments;

FIGS. 15A through 15F are cross-sectional views for describing a method of manufacturing an integrated circuit device, according to other exemplary embodiments;

FIG. 16A is a perspective view illustrating main components of the integrated circuit device including transistors having a FinFET structure, FIG. 16B is a cross-sectional view of the integrated circuit device taken along lines B1-B1' and B2-B2' of FIG. 16A, and FIG. 16C is a cross-sectional view of the integrated circuit device taken along lines C1-C1' and C2-C2' of FIG. 16A;

FIG. 17A is a plan layout diagram of the integrated circuit device including transistors having a FinFET structure and FIG. 17B is a cross-sectional view of the integrated circuit device taken along lines B1-B1' and B2-B2' of FIG. 17A;

DETAILED DESCRIPTION OF THE EMBODIMENTS

Figure 1:
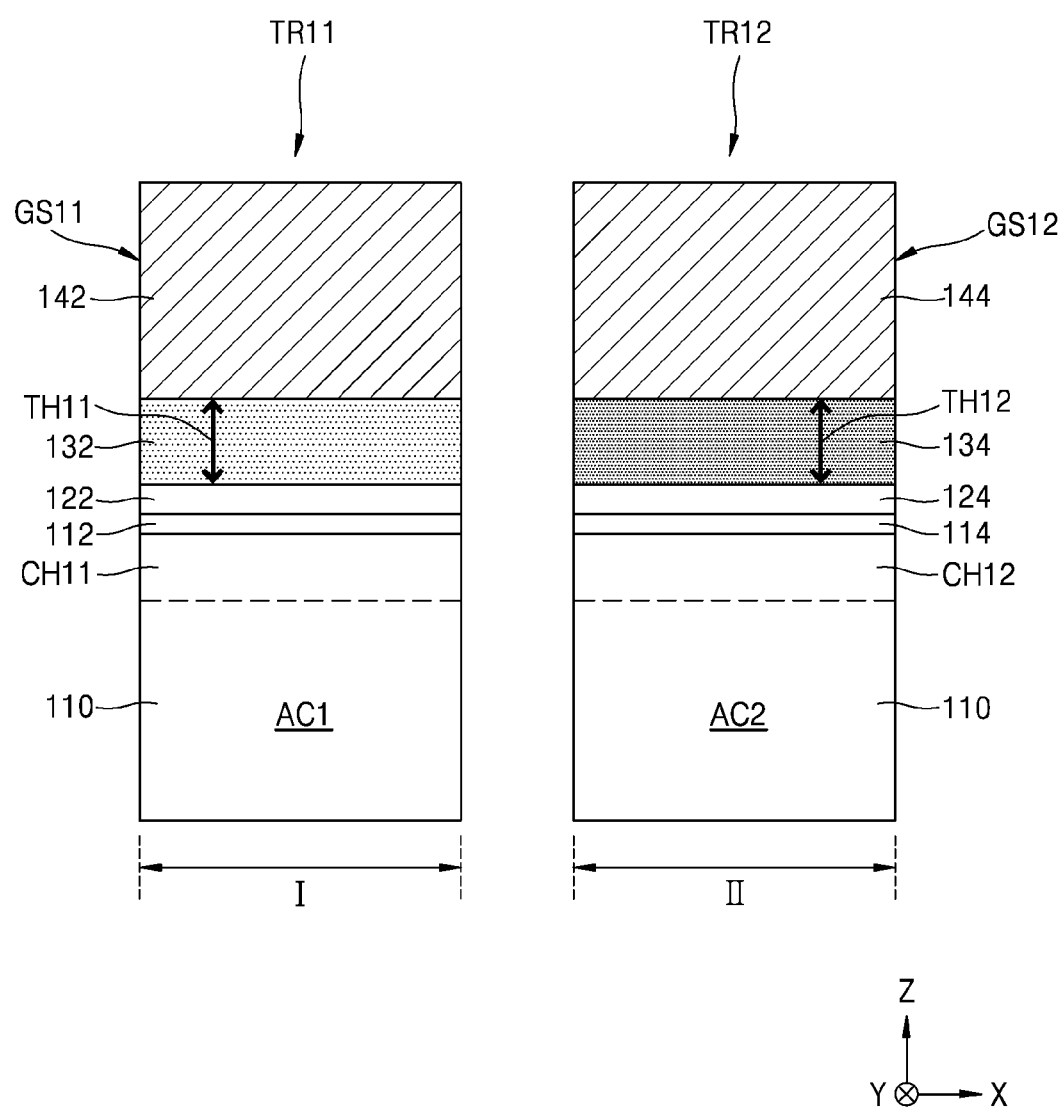
FIG. 1 is a cross-sectional view for describing an integrated circuit device according to exemplary embodiments.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

It will be understood that when an element is referred to as being "connected" or "coupled" to, or "on" another element, it can be directly connected or coupled to, or on the other element or intervening elements may be present. In contrast, when an element is referred to as being "directly connected," "directly coupled," or "directly on" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a direct connection (i.e., touching) unless the context indicates otherwise.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The term "substrate" may denote a substrate itself, or a stack structure including a substrate and predetermined layers or films formed on a surface of the substrate. In addition, the term "surface of a substrate" may denote an exposed surface of the substrate itself, or an external surface of a predetermined layer or a film formed on the substrate. The term "high dielectric layer" may denote a dielectric layer including metal oxide having a dielectric constant greater than a silicon dioxide ($SiO_2$) layer. The term "oxygen content" may denote the number of oxygen atoms per unit volume unless otherwise defined.

FIG. 1 is a cross-sectional view for describing an integrated circuit device 100 according to exemplary embodiments.

Referring to FIG. 1, the integrated circuit device 100 may include a substrate 110 including a first area I in which a first active area AC1 is formed and a second area II in which a second active area AC2 is formed.

The first area I and the second area II may denote different areas of the substrate 110 and may be areas performing different functions on the substrate 110. The first area I and the second area II may be areas spaced apart from each other in an X-direction and/or may be areas connected to each other.

In some embodiments, a first transistor TR11 and a second transistor TR12 requiring different threshold voltages may be formed in the first area I and the second area II, respectively.

The first transistor TR11 formed in the first area I may include a first interface layer 112, a first high dielectric layer 122, and a first gate stack GS11 that are sequentially formed on the first active area AC1. For example, the first gate stack GS11 may be formed on the first high dielectric layer 122, the first high dielectric layer 122 may be formed on the first interface layer 112, and the first interface layer 112 may be formed on the first active area AC1. The first gate stack GS11 may include a first work function adjustment metal containing structure 132 formed on the first high dielectric layer 122 and a first upper gate layer 142 covering the first work function adjustment metal containing structure 132. For example, the first upper gate layer 142 may be formed on and cover a top surface of the first work function adjustment metal containing structure 132.

The second transistor TR12 formed in the second area II may include a second interface layer 114, a second high dielectric layer 124, and a second gate stack GS12 that are sequentially formed on the second active area AC2. For example, the second gate stack GS12 may be formed on the second high dielectric layer 124, the second high dielectric layer 124 may be formed on the second interface layer 114, and the second interface layer 114 may be formed on the second active area AC2. The second gate stack GS12 may include a second work function adjustment metal containing structure 134 formed on the second high dielectric layer 124 and a second upper gate layer 144 covering the second work function adjustment metal containing structure 134. For example, the second upper gate layer 144 may be formed on and cover a top surface of the second work function adjustment metal containing structure 134.

In some embodiments, different conductive channels may be formed in a first channel area CH11 of the first transistor TR11 and a second channel area CH12 of the second transistor TR12. For example, the first area I may be an NMOS transistor area, and an N-type channel may be formed in the first channel area CH11. The second channel area CH12 may be a PMOS transistor area and a P-type channel may be formed in the second channel area CH12. In this case, the first work function adjustment metal containing structure 132 constituting the first transistor TR11 may have a work function ranging from about 4.1 to about 4.5 eV, and the second work function adjustment metal containing structure 134 constituting the second transistor TR12 may have a work function ranging from about 4.8 to about 5.2 eV.

In some other embodiments, the same conductive channels may be formed in the first channel area CH11 formed in the first active area AC1 and the second channel area CH12 formed in the second active area AC2.

As an example, the first area I and the second area II may be NMOS transistor areas. In this case, the first area I may be a low voltage NMOS transistor area requiring a threshold voltage lower than that of the second area II, and the second area II may be a high voltage NMOS transistor area requiring a threshold voltage higher than that of the first area I.

As another example, the first area I and the second area II may be PMOS transistor areas. In this case, the first area I may be a high voltage PMOS transistor area requiring a threshold voltage higher than that of the second area II, and the second area II may be a low voltage PMOS transistor area requiring a threshold voltage lower than that of the first area I.

In some other embodiments, the first area I may be an area in which transistors having a lower threshold voltage and a faster switching speed than those of the second area II are formed, and the second area II may be an area in which transistors having a higher threshold voltage and a high reliability but slower switching speed than those of the first area I are formed. For example, the first area I may be a cell array area in which unit memory cells are arranged in a matrix form. In some embodiments, the second area II may be a logic cell area or a memory cell area. The second area II may be a peripheral circuit area in which are formed peripheral circuits performing a function of inputting data from the outside an internal circuit of the integrated circuit device 100 or outputting the data of the internal circuit of the integrated circuit device 100 to the outside. In some embodiments, the second area II may configure a part of an input/output (I/O) circuit device. However, the above descriptions are merely examples, and the disclosed embodiments are not limited thereto. For example, the first area I may be a logic cell area or a memory cell area, and the second area II may be a peripheral circuit area.

The first interface layer 112 and the second interface layer 114 may include layers obtained by oxidizing surfaces of the first active area AC1 and the second active area AC2, respectively. The first interface layer 112 may cure an interfacial defect between the first active area AC1 and the first high dielectric layer 122. The second interface layer 114 may cure an interfacial defect between the second active area AC2 and the second high dielectric layer 124.

In some embodiments, the first interface layer 112 and the second interface layer 114 may include a low dielectric material layer having a dielectric constant of 9 or less, e.g., a silicon oxide layer, a silicon oxynitride layer, or a combination thereof. In other exemplary embodiments, the first interface layer 112 and the second interface layer 114 may include silicate, a combination of silicate and a silicon oxide layer, or a combination of silicate and a silicon oxynitride layer. In some embodiments, the first interface layer 112 and the second interface layer 114 may have a thickness in a range from about 5 Å to about 20 Å, but are not limited thereto. In other exemplary embodiments, the first interface layer 112 and the second interface layer 114 may be omitted.

The first high dielectric layer 122 and the second high dielectric layer 124 may include a metal oxide material having a dielectric constant greater than that of the silicon oxide layer. For example, the first high dielectric layer 122 and the second high dielectric layer 124 may have a dielectric constant of about 10 to about 25. The first high dielectric layer 122 and the second high dielectric layer 124 may include a material selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof, but are not limited thereto.

The first high dielectric layer 122 and the second high dielectric layer 124 may be formed by an atomic layer deposition (ALD), a chemical vapour deposition (CVD), or a physical vapour deposition (PVD) process. The first high dielectric layer 122 and the second high dielectric layer 124 may have a thickness in a range from about 10 Å to about 40 Å, but are not limited thereto.

In some exemplary embodiments, the first high dielectric layer 122 and the second high dielectric layer 124 may include metal oxide layers having different oxygen vacancy densities. In some embodiments, the second high dielectric layer 124 may have a lower oxygen vacancy density than the first high dielectric layer 122. For example, the oxygen vacancy density of the first high dielectric layer 122 may be higher than about $1\times10^{12}$ cm$^{-3}$, and the oxygen vacancy density of the second high dielectric layer 124 may be lower than about $1\times10^{12}$ cm$^{-3}$ but these are merely examples. The embodiments are not limited thereto.

In other exemplary embodiments, the first high dielectric layer 122 and the second high dielectric layer 124 may include metal oxide layers having different oxygen content. In this regard, the "oxygen content" may denote the number of oxygen atoms per unit volume of each of the first high dielectric layer 122 and the second high dielectric layer 124. In some embodiments, the first high dielectric layer 122 may include a non-stoichiometric oxygen-deficient metal oxide layer, and the second high dielectric layer 124 may include a stoichiometric metal oxide layer or a non-stoichiometric oxygen-rich metal oxide layer. For example, when the first high dielectric layer 122 and the second high dielectric layer 124 include hafnium oxide, the first high dielectric layer 122 may include an $HfO_{2-x}(0.6 \leq x \leq 1)$ layer, and the second high dielectric layer 124 may include an $HfO_x(x \geq 2)$ layer.

The first high dielectric layer 122 and the second high dielectric layer 124 may be crystalline or amorphous. The oxygen vacancy density and/or the oxygen content of the first high dielectric layer 122 and the second high dielectric layer 124 may influence a threshold voltage of each of the first transistor TR11 and the second transistor TR12. For example, the first high dielectric layer 122 may be formed to have a relatively low oxygen vacancy density, and the second high dielectric layer 124 may be formed to have a relatively high oxygen vacancy density, and thus a desired threshold voltage may be obtained in each of the first transistor TR11 and the second transistor TR12. The first high dielectric layer 122 may be formed to have an oxygen content that is less than the stoichiometric oxygen content, and the second high dielectric layer 124 may be formed to have an oxygen content that is greater than the oxygen content of the first high dielectric layer 122 or may be formed to have the stoichiometric oxygen content, and thus the desired threshold voltage may be obtained in each of the first transistor TR11 and the second transistor TR12.

Figure 2:
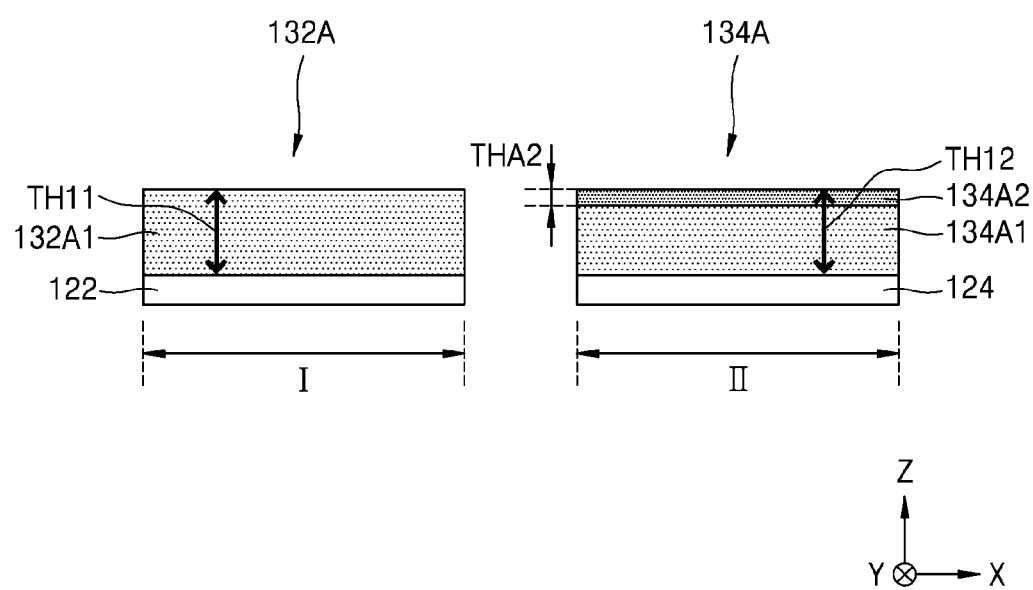
FIG. 2 is a cross-sectional view of an example of a first work function adjustment metal containing structure and a second work function adjustment metal containing structure of an integrated circuit device according to exemplary embodiments.
Figure 3:
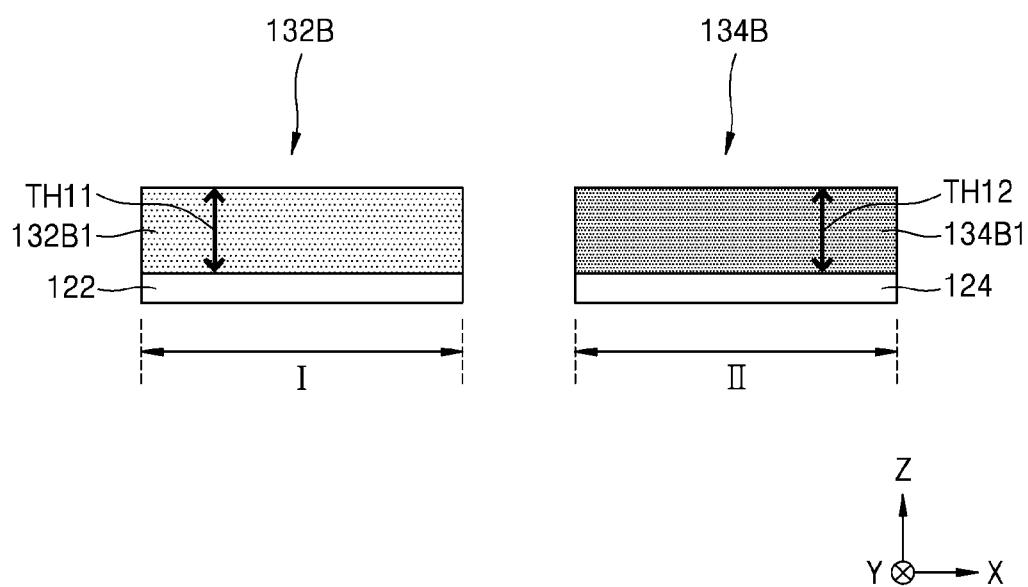
FIG. 3 is a cross-sectional view of another example of a first work function adjustment metal containing structure and a second work exemplary function adjustment metal containing structure of an integrated circuit device according to exemplary embodiments.

In the first area I, the first work function adjustment metal containing structure 132 may include a first conductive layer contacting the first high dielectric layer 122 and having a first oxygen content. In the second area II, the second work function adjustment metal containing structure 134 may include a second conductive layer contacting the second high dielectric layer 124 and having a second oxygen content that is greater than the first oxygen content of the first conductive layer. In this regard, the "oxygen content" may denote the number of oxygen atoms per unit volume of each of the first conductive layer and the second conductive layer. The first conductive layer formed in the first area I may be a first conductive layer 132A1, as shown in FIG. 2, or a first conductive layer 132B1, as shown in FIG. 3. The second conductive layer formed in the second area II may be second conductive layers 134A1 and 134A2, as shown in FIG. 2, or a second conductive layer 134B1, as shown in FIG. 3. The first conductive layer 132A1, the first conductive layer 132B1, the second conductive layers 134A1 and 134A2, and the second conductive layer 134B1 will be described in more detail with reference to FIGS. 2 and 3.

The first conductive layer constituting the first work function adjustment metal containing structure 132 in the first area I and the second conductive layer constituting the second work function adjustment metal containing structure 134 in the second area II may include metal including Ti, Ta, Al, or a combination of these. The different work function adjustment metal containing structures may be formed of the same materials, or different materials. In some embodiments, for example, the first conductive layer may include a Ti layer, a TiN layer, a TiON layer, a TiO layer, a Ta layer, a TaN layer, a TaON layer, an oxygen doped TiAlN (hereinafter referred to as "TiAlN(O)") layer, an oxygen doped TaAlN (hereinafter referred to as "TaAlN(O)") layer, or a combination of these. The second conductive layer may include a TiON layer, a TiO layer, a TaON layer, a TiAlN(O) layer, a TaAlN(O) layer, or a combination of these.

In some embodiments, the first work function adjustment metal containing structure 132 may include a single layer having a first thickness TH11, and the second work function adjustment metal containing structure 134 may include a single layer or multiple layers (i.e., a multilayer) having a second thickness TH12. The second thickness TH12 may be the same as or similar to the first thickness TH11.

The first upper gate layer 142 covering the first work function adjustment metal containing structure 132 and the second upper gate layer 144 covering the second work function adjustment metal containing structure 134 may include the same material.

In some embodiments, although not illustrated, each of the first upper gate layer 142 and the second upper gate layer 144 may include an upper work function adjustment layer, a conductive barrier layer, and a gap-fill metal layer that are sequentially stacked on the first work function adjustment metal containing structure 132 and the second work function adjustment metal containing structure 134, or a combination of these. For example, one or both of the first upper gate layer 142 and the second upper gate layer 144 may include an upper work function adjustment layer formed on a respective one of the first work function adjustment metal containing structure 132 and the second work function adjustment metal containing structure 134, a conductive barrier layer formed on the upper work function adjustment layer, and a gap-fill metal layer formed on the conductive barrier layer.

The upper work function adjustment layer may include TiAl, TiAlC, TiAlN, TiC, TaC, HfSi, or a combination of these, but it is not limited thereto.

The conductive barrier layer may include TiN, TaN, or a combination of these, but it is not limited thereto.

The gap-fill metal layer may be formed to fill a gate space remaining on the conductive barrier layer. The gap-fill metal layer may include tungsten (W).

The upper work function adjustment layer, the conductive barrier layer, and the gap-fill metal layer may be formed by an ALD process, a CVD process, or a PVD process. In some embodiments, at least one of the upper work function adjustment layer, the conductive barrier layer, and the gap-fill metal layer may be independently omitted in the first area I and the second area II.

In certain disclosed embodiments, a work function can be changed by controlling an oxygen vacancy density in a work function layer to thereby implement devices having various threshold voltages. The disclosed embodiments may allow for threshold voltage modulation across a wide range, and permit a threshold control method having high reproducibility through more accurate control of oxygen vacancy density.

FIG. 2 is a cross-sectional view for describing an example of some more detailed configurations of the integrated circuit device 100 shown in FIG. 1. The same reference numerals between FIGS. 1 and 2 denote the same terms, and thus detailed descriptions thereof are omitted.

FIG. 2 illustrates a first work function adjustment metal containing structure 132A and a second work function adjustment metal containing structure 134A that may be employed as the first work function adjustment metal containing structure 132 and the second work function adjustment metal containing structure 134, respectively.

Referring to FIG. 2, the first work function adjustment metal containing structure 132A may include the first conductive layer 132A1 including a single layer contacting the first high dielectric layer 122 and having the first thickness TH11. The first conductive layer 132A1 may include a Ti layer, a TiN layer, a TiON layer, a TiO layer, a Ta layer, a TaN layer, a TaON layer, a TiAlN(O) layer, a TaAlN(O) layer, or a combination of these.

The second work function adjustment metal containing structure 134A may include the second conductive layers 134A1 and 134A2 formed at the same level as the first conductive layer 132A1. In some embodiments, all or a portion of each of the first work function adjustment metal containing structure 132A and the second work function adjustment metal containing structure 134A may be formed at the same vertical level. The multilayer structure of the second work function adjustment metal containing structure 134A may have the second thickness TH12. The second thickness TH12 may be the same as or similar to the first thickness TH11.

The second conductive layers 134A1 and 134A2 may include the lower second conductive layer 134A1 directly contacting the second high dielectric layer 124 and the upper second conductive layer 134A2 covering the lower second conductive layer 134A1. The upper second conductive layer 134A2 may have greater oxygen content than the first conductive layer 132A1 formed in the first area I.

In some embodiments, the lower second conductive layer 134A1 may have an oxygen content that is the same as or is similar to that of the first conductive layer 132A1 formed in the first area I. For example, the lower second conductive layer 134A1 may include a Ti layer, a TiN layer, a TiON layer, a TiO layer, a Ta layer, a TaN layer, a TaON layer, a TiAlN(O) layer, a TaAlN(O) layer, or the combination of these.

In some embodiments, the lower second conductive layer 134A1 may include a metal containing layer excluding oxygen. For example, the lower second conductive layer 134A1 may include a Ti layer, a TiN layer, a Ta layer, a TaN layer, or a combination of these.

In some embodiments, the upper second conductive layer 134A2 may include a metal containing layer including oxygen. For example, the upper second conductive layer 134A2 may include a TiON layer, a TiO layer, a TaON layer, a TiAlN(O) layer, a TaAlN(O) layer, or a combination of these.

In some embodiments, the first conductive layer 132A1 formed in the first area I and the lower second conductive layer 134A1 formed in the second area II may include the same material having the same composition. The first conductive layer 132A1, the lower second conductive layer 134A1, and the upper second conductive layer 134A2 may include the same metal. As an example, the first conductive layer 132A1 and the lower second conductive layer 134A1 may include a TiN layer, and the upper second conductive layer 134A2 may include a TiON layer. As another example, each of the first conductive layer 132A1, the lower second conductive layer 134A1, and the upper second conductive layer 134A2 may include a TiON layer, and an oxygen content of the upper second conductive layer 134A2 may be greater than that of each of the first conductive layer 132A1 and the lower second conductive layer 134A1. For example, the oxygen content of the upper second conductive layer 134A2 may be greater by about 5~30 atom % per unit volume than that of each of the first conductive layer 132A1 and the lower second conductive layer 134A1.

A thickness THA2 of the upper second conductive layer 134A2 may be less than the first thickness TH11 and less than the second thickness TH12. In some embodiments, the thickness THA2 of the upper second conductive layer 134A2 may range from about 10~about 90% of the first thickness TH11 or range from about 10~about 90% of the second thickness TH12, but the concepts are not limited thereto. A sum of a thickness of the lower second conductive layer 134A1 and the thickness THA2 of the upper second conductive layer 134A2 may be the same as the first thickness TH11 of the first conductive layer 132A1 formed in the first area I. And a sum of a thickness of the lower second conductive layer 134A1 and the thickness THA2 of the upper second conductive layer 134A2 may be the same as the second thickness TH12.

FIG. 3 is a cross-sectional view for describing another example of some more detailed configurations of the integrated circuit device 100 shown in FIG. 1. The same reference numerals in FIGS. 1, 2, and 3 denote the same terms, and thus detailed descriptions thereof are omitted.

FIG. 3 illustrates a first work function adjustment metal containing structure 132B and a second work function adjustment metal containing structure 134B that may be employed as the first work function adjustment metal containing structure 132 and the second work function adjustment metal containing structure 134, respectively.

Referring to FIG. 3, the first work function adjustment metal containing structure 132B may include the first conductive layer 132B1 including a single layer contacting the first high dielectric layer 122 and having the first thickness TH11. A more detailed configuration of the first conductive layer 132B1 is substantially the same as that of the first conductive layer 132A1 described with reference to FIG. 2 above.

The second work function adjustment metal containing structure 134B may include the second conductive layer 134B1 formed at the same level as the first conductive layer 132B1 and including a single layer having the second thickness TH12.

The first thickness TH11 of the first conductive layer 132B1 may be the same as or similar to the second thickness TH12 of the second conductive layer 134B1.

The second conductive layer 134B1 may directly contact the second high dielectric layer 124 and may have a greater oxygen content than the first conductive layer 132B1 formed in the first area I.

In some embodiments, the first conductive layer 132B1 and the second conductive layers 134B1 may include the same metal.

In some embodiments, the first conductive layer 132B1 may include a metal containing layer excluding oxygen, and the second conductive layer 134B1 may include a metal containing layer including oxygen.

In some other embodiments, the first conductive layer 132B1 and the second conductive layer 134B1 may include a metal containing layer including oxygen, and the oxygen content of the first conductive layer 132B1 may be smaller by about 5~30 atom % per unit volume than that of the second conductive layer 134B1.

In some embodiments, the first conductive layer 132B1 may include a Ti layer, a TiN layer, a TiON layer, a TiO layer, a Ta layer, a TaN layer, a TaON layer, a TiAlN(O) layer, a TaAlN(O) layer, or a combination of these. In some embodiments, the second conductive layer 134B1 may include a TiON layer, a TiO layer, a TaON layer, a TiAlN(O) layer, a TaAlN(O) layer, or a combination of these. As an example, the first conductive layer 132B1 may include a TiN layer, and the second conductive layer 134B1 may include a TiON layer. As another example, each of the first conductive layer 132B1 and the second conductive layer 134B1 may include a TiON layer, and the oxygen content of the second conductive layer 134B1 may be greater than that of first conductive layer 132B1.

Figure 4:
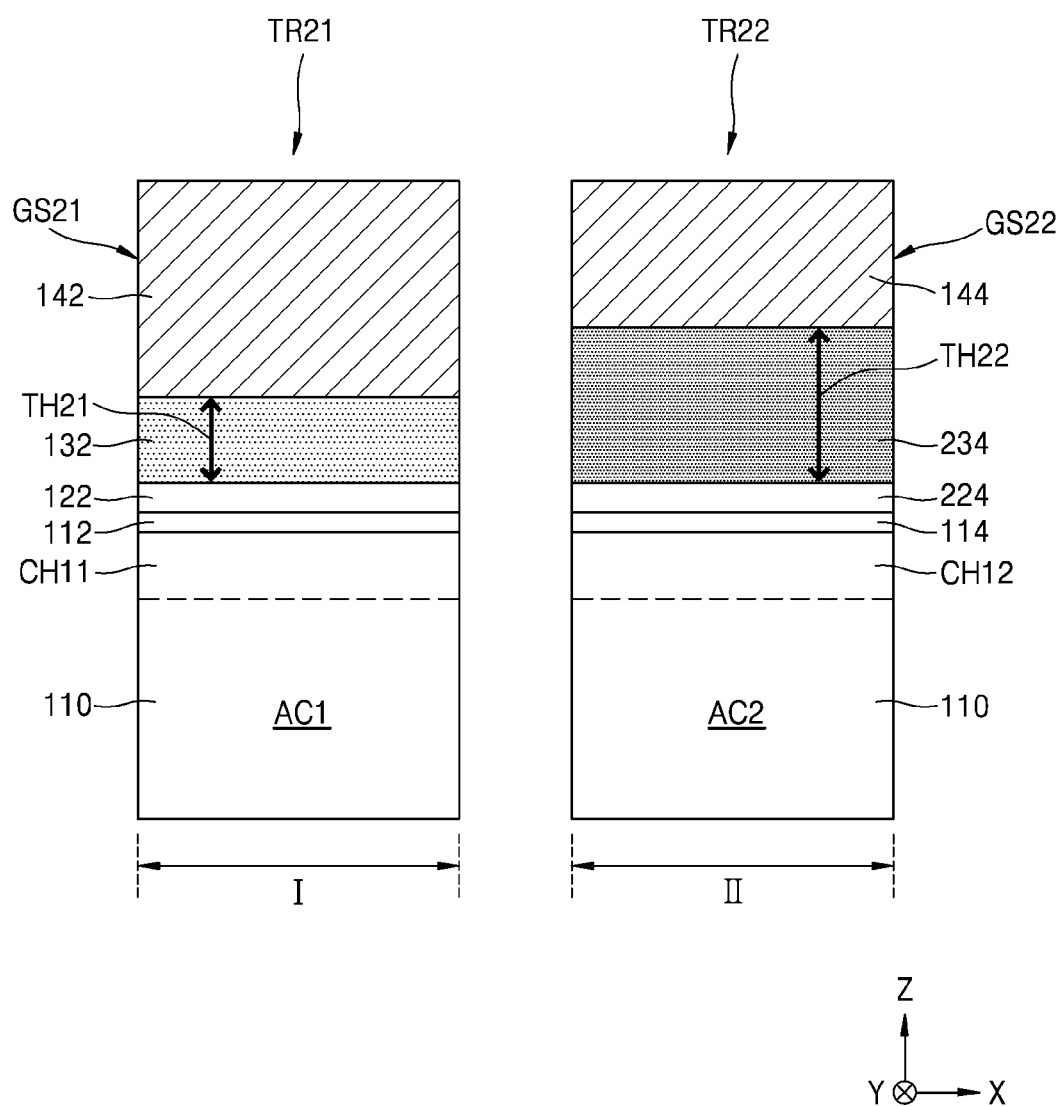
FIG. 4 is a cross-sectional view for describing an integrated circuit device according to other embodiments.

FIG. 4 is a cross-sectional view for describing an integrated circuit device 200 according to other exemplary embodiments. The same reference numerals in FIGS. 1 through 4 denote the same terms, and thus detailed descriptions thereof are omitted.

Referring to FIG. 4, the integrated circuit device 200 may include a first transistor TR21 formed in the first area I and a second transistor TR22 formed in the second area II.

The first transistor TR21 may include the first interface layer 112, the first high dielectric layer 122, and a first gate stack GS21 that are sequentially formed on the first active area AC1. For example, the first gate stack GS21 may be formed on the first high dielectric layer 122, the first high dielectric layer 122 may be formed on the first interface layer 112, and the first interface layer 112 may be formed on the first active area AC1. The first gate stack GS21 may include the first work function adjustment metal containing structure 132 formed on the first high dielectric layer 122 and the first upper gate layer 142 covering the first work function adjustment metal containing structure 132. For example, the first upper gate layer 142 may be formed on and cover a top surface of the first work function adjustment metal containing structure 132.

The second transistor TR22 may include the second interface layer 114, a second high dielectric layer 224, and a second gate stack GS22 that are sequentially formed on the second active area AC2. The second high dielectric layer 224 may have substantially the same configuration as the second high dielectric layer 124 described with reference to FIG. 1 above. The second gate stack GS22 may include a second work function adjustment metal containing structure 234 formed on the second high dielectric layer 224 and the second upper gate layer 144 covering the second work function adjustment metal containing structure 234. For example, the second upper gate layer 144 may be formed on and cover a top surface of the second work function adjustment metal containing structure 234.

In some embodiments, the first high dielectric layer 122 and the second high dielectric layer 224 may include metal oxide layers having different oxygen vacancy densities. In some embodiments, the second high dielectric layer 224 may have a lower oxygen vacancy density than that of the first high dielectric layer 122.

In some other embodiments, the first high dielectric layer 122 and the second high dielectric layer 224 may include metal oxide layers having different oxygen contents. In some embodiments, the first high dielectric layer 122 may include a non-stoichiometric oxygen-deficient metal oxide layer, and the second high dielectric layer 224 may include a stoichiometric metal oxide layer or a non-stoichiometric oxygen-rich metal oxide layer. For example, the first high dielectric layer 122 may include an $HfO_{2-x}(0.6 \le x \le 1)$ layer, and the second high dielectric layer 224 may include an $HfO_x(x \ge 2)$ layer.

The first work function adjustment metal containing structure 132 may include a first conductive layer contacting the first high dielectric layer 122 and having a first oxygen content. The second work function adjustment metal containing structure 234 may include a second conductive layer contacting the second high dielectric layer 224 and having a second oxygen content that is greater than the first oxygen content. In some embodiments, more detailed configurations of the first conductive layer and the second conductive layer may be the same as described with reference to FIG. 1. In some other embodiments, the first conductive layer may be a first conductive layer 132C1 shown in FIG. 5. The second conductive layer may be a second conductive layer 234C1 shown in FIG. 5. The first conductive layer 132C1 and the second conductive layer 234C1 will be described more fully with reference to FIG. 5.

In some embodiments, the first work function adjustment metal containing structure 132 may include a single layer having a first thickness TH21, and the second work function adjustment metal containing structure 234 may include a single layer or multiple layers (i.e., a multilayer) having a second thickness TH22. The second thickness TH22 may be greater than the first thickness TH21.

Figure 5:
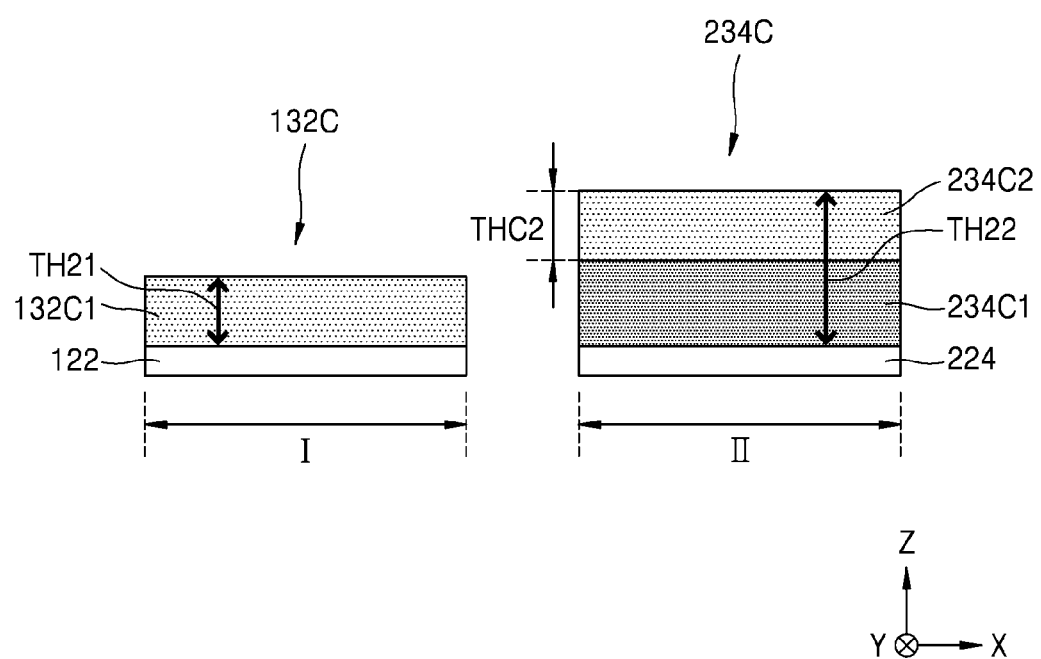
FIG. 5 is a cross-sectional view of another example of a first work function adjustment metal containing structure and a second work function adjustment metal containing structure of an integrated circuit device according to exemplary embodiments.

FIG. 5 is a cross-sectional view for describing an example of some more detailed configurations of the integrated circuit device 200 shown in FIG. 4. The same reference numerals in FIGS. 1 to 5 denote the same terms, and thus detailed descriptions thereof are omitted.

FIG. 5 illustrates a first work function adjustment metal containing structure 132C and a second work function adjustment metal containing structure 234C that may be employed as the first work function adjustment metal containing structure 132 and the second work function adjustment metal containing structure 234, respectively.

The first work function adjustment metal containing structure 132C formed in the first area I may include the first conductive layer 132C1 including a single layer directly contacting the first high dielectric layer 122 and having the first thickness TH21. The first conductive layer 132C1 may include a Ti layer, a TiN layer, a TiON layer, a TiO layer, a Ta layer, a TaN layer, a TaON layer, a TiAlN(O) layer, a TaAlN(O) layer, or a combination of these.

The second work function adjustment metal containing structure 234C formed in the second area II may include second conductive layers 234C1 and 234C2 that, as a multilayer structure, have the second thickness TH22. The second thickness TH22 may be greater than the first thickness TH21.

The second conductive layers 234C1 and 234C2 may include the lower second conductive layer 234C1 directly contacting the second high dielectric layer 224 and the upper second conductive layer 234C2 covering the lower second conductive layer 234C1. The lower second conductive layer 234C1 may have greater oxygen content than the first conductive layer 132C1 formed in the first area I. The upper second conductive layer 234C2 may have smaller oxygen content than the lower second conductive layer 234C1. In some embodiments, the upper second conductive layer 234C2 may have an oxygen content that is the same as that of the first conductive layer 132C1 formed in the first area I. For example, each of the first conductive layer 132C1 and the upper second conductive layer 234C2 may have an oxygen content smaller by about 5~30 atom % per unit volume than the lower second conductive layer 234C1, but the disclosed embodiments are not limited thereto.

In some embodiments, the first conductive layer 132C1 and the upper second conductive layer 234C2 may include a metal containing layer excluding oxygen. For example, the first conductive layer 132C1 and the upper second conductive layer 234C2 may include a Ti layer, a TiN layer, a Ta layer, a TaN layer, or a combination of these.

In some other embodiments, the first conductive layer 132C1 and the upper second conductive layer 234C2 may include a metal containing layer including oxygen. In this case, an oxygen content of each of the first conductive layer 132C1 and the upper second conductive layer 234C2 may be less than that of the lower second conductive layer 234C1.

In some embodiments, the first conductive layer 132C1 formed in the first area I and the upper second conductive layer 234C2 formed in the second area II may include the same material having the same composition.

The first conductive layer 132C1 formed in the first area I and at least one of the lower second conductive layer 234C1 and the upper second conductive layer 234C2 formed in the second area II may include the same metal. As an example, the first conductive layer 132C1 and the upper second conductive layer 234C2 may include a TiN layer, and the lower second conductive layer 234C1 may include a TiON layer. As another example, each of the first conductive layer 132C1, the lower second conductive layer 234C1, and the upper second conductive layer 234C2 may include a TiON layer, and an oxygen content of the lower second conductive layer 234C1 may be greater than that of each of the first conductive layer 132C1 and the upper second conductive layer 234C2.

In some embodiments, a thickness THC2 of the upper second conductive layer 234C2 may be the same as the first thickness TH21 of the first conductive layer 132C1.

Figure 6:
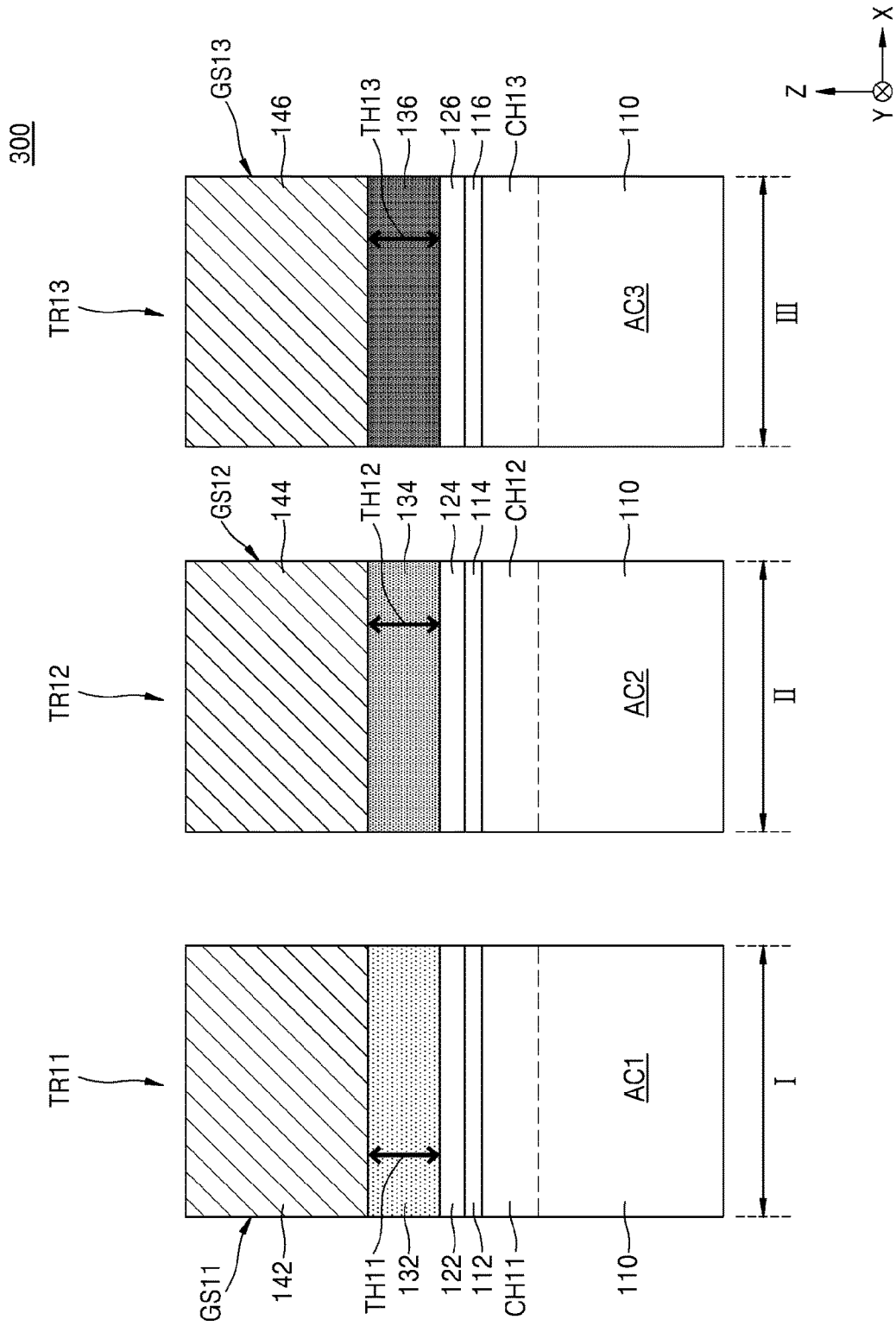
FIG. 6 is a cross-sectional view for describing an integrated circuit device according to other exemplary embodiments.

FIG. 6 is a cross-sectional view for describing an integrated circuit device 300 according to other embodiments. The same reference numerals between FIGS. 1 through 6 denote the same terms, and thus detailed descriptions thereof are omitted.

Referring to FIG. 6, the integrated circuit device 300 may have substantially the same configuration as the integrated circuit device 100 described with reference to FIG. 1 above, except that the integrated circuit device 300 further includes a third transistor TR13 formed in a third area III of the substrate 110.

The third transistor TR13 may include a third interface layer 116, a third high dielectric layer 126, and a third gate stack GS13 that are sequentially formed on a third active area AC3 of the third area III of the substrate 110. For example, the third gate stack GS13 may be formed on the third high dielectric layer 126, the third high dielectric layer 126 may be formed on the third interface layer 116, and the third interface layer 116 may be formed on the third active area AC3. The third gate stack GS13 may include a third work function adjustment metal containing structure 136 formed on the third high dielectric layer 126 and a third upper gate layer 146 covering the third work function adjustment metal containing structure 136. For example, the third upper gate layer 146 may be formed on and cover a top surface of the third work function adjustment metal containing structure 136.

The third area III may be an area spaced apart from the first area I and the second area II in the X-direction and/or an area connected to at least one of the first area I and the second area II.

In some embodiments, the first transistor TR11, the second transistor TR12, and the third transistor TR13 may require different threshold voltages.

In some embodiments, the same conductive channel as that of at least one of the first channel area CH11 of the first transistor TR11 and the second channel area CH12 of the second transistor TR12 may be formed in a third channel area CH13 of the third transistor TR13. For example, an N-type channel or a P-type channel may be formed in the third channel area CH13.

In some other embodiments, the same conductive channel as that of one of the first channel area CH11 of the first transistor TR11 and the second channel area CH12 of the second transistor TR12 may be formed in the third channel area CH13 of the third transistor TR13, and an opposite conductive channel to that of the other one may be formed in the third channel area CH13 of the third transistor TR13. As an example, two of the first through third transistors TR11, TR12, and TR13 may be NMOS transistors, and the other one may be a PMOS transistor. As another example, one of the first through third transistors TR11, TR12, and TR13 may be an NMOS transistor, and other two may be PMOS transistors.

In some embodiments, the same conductive channel may be formed in the first channel area CH11 that is formed in the first active area AC1, the second channel area CH12 that is formed in the second active area AC2, and the third channel area CH13 that is formed in the third active area AC3.

As an example, the first area I, the second area II, and the third area III may be NMOS transistor areas, and an N-type channel may be formed in each of the first channel area CH11, the second channel area CH12, and the third channel area CH13. In this case, the first area I may be a low voltage NMOS transistor area requiring a threshold voltage lower than that of the second area II, the third area III may be a high voltage NMOS transistor area requiring a threshold voltage higher than that of the first area I, and the second area II may be a medium voltage NMOS transistor area requiring a threshold voltage higher than that of the first area I and lower than that of the third area III.

As another example, the first area I, the second area II, and the third area III may be PMOS transistor areas, and a P-type channel may be formed in each of the first channel area CH11, the second channel area CH12, and the third channel area CH13. In this case, the first area I may be a high voltage PMOS transistor area requiring a threshold voltage higher than that of the second area II, the third area III may be a low voltage PMOS transistor area requiring a threshold voltage lower than that of the first area I, and the second area II may be a medium voltage PMOS transistor area requiring a threshold voltage lower than that of the first area I and higher than that of the third area III.

In some embodiments, each of the first area I, the second area II, and the third area III may be independently a logic cell area, a memory cell area, or a peripheral circuit area.

In the integrated circuit device 300 shown in FIG. 6, the third interface layer 116 may include a layer obtained by oxidizing a surface of the third active area AC3 of the third interface layer 116. The third interface layer 116 may cure an interfacial defect between the third active area AC3 and the third high dielectric layer 126. A more detailed configuration of the third interface layer 116 is substantially the same as those of the first interface layer 112 and the second interface layer 114 described with reference to FIG. 1 above. In some embodiments, the third interface layer 116 may be omitted.

The third high dielectric layer 126 may have substantially the same configuration as the first high dielectric layer 122 and the second high dielectric layer 124 described with reference to FIG. 1 above. However, the first high dielectric layer 122, the second high dielectric layer 124, and the third high dielectric layer 126 may have different oxygen vacancy densities. In some embodiments, the third high dielectric layer 126 may have a lower oxygen vacancy density than the first high dielectric layer 122 and the second high dielectric layer 124.

The first high dielectric layer 122, the second high dielectric layer 124, and the third high dielectric layer 126 may have different oxygen contents. In some embodiments, the third high dielectric layer 126 may have a higher oxygen content than that of the first high dielectric layer 122 and/or the second high dielectric layer 124.

For example, the first high dielectric layer 122, the second high dielectric layer 124, and the third high dielectric layer 126 may include hafnium oxide. In this case, the first high dielectric layer 122 and the second high dielectric layer 124 may include an $HfO_{2-x}(0.6 \leq x \leq 1)$ layer, the second high dielectric layer 124 may have a higher oxygen content than the first high dielectric layer 122, and the third high dielectric layer 126 may include an $HfO_x(x \geq 2)$ layer. Alternatively, the first high dielectric layer 122 may include an $HfO_{2-x}(0.6 \leq x \leq 1)$ layer, the second high dielectric layer 124 and the third high dielectric layer 126 may include an $HfO_x(x \geq 2)$ layer, and the third high dielectric layer 126 may have higher oxygen content than the second high dielectric layer 124.

The third work function adjustment metal containing structure 136 may be formed to contact the third high dielectric layer 126. The third work function adjustment metal containing structure 136 may include a third conductive layer having a third oxygen content that is greater than a second oxygen content of the second work function adjustment metal containing structure 134 formed in the second area II. The third conductive layer may include a metal containing layer having a greater oxygen content than the second conductive layer constituting the second work function adjustment metal containing structure 134. The third conductive layer may include a single layer or a multilayer having a third thickness TH13. The third thickness TH13 may be the same as or similar to the first thickness TH11. In some embodiments, the third conductive layer may include a TiON layer, a TiO layer, a TaON layer, a TiAlN(O) layer, a TaAlN(O) layer, or a combination of these.

The third upper gate layer 146 covering the third work function adjustment metal containing structure 136 may include the same material as the first upper gate layer 142 formed in the first area I and/or the second upper gate layer 144 formed in the second area II. In some embodiments, the third upper gate layer 146 may include an upper work function adjustment layer, a conductive barrier layer, and a gap-fill metal layer, or a combination of these, similarly to the first upper gate layer 142 and the second upper gate layer 144. More detailed configurations of the upper work function adjustment layer, the conductive barrier layer, and the gap-fill metal layer are described with respect to an upper work function adjustment layer, a conductive barrier layer, and a gap-fill metal layer constituting the first upper gate layer 142 and the second upper gate layer 144 with reference to FIG. 1 above. In some embodiments, at least one of the upper work function adjustment layer, the conductive barrier layer, and the gap-fill metal layer may be omitted.

In some embodiments, the third work function adjustment metal containing structure 136 included in the third transistor TR13 may have the same structure as the second work function adjustment metal containing structure 134A described with reference to FIG. 2, and may have a greater oxygen content than the second work function adjustment metal containing structure 134A.

In some other embodiments, the third work function adjustment metal containing structure 136 included in the third transistor TR13 may have the same structure as the second work function adjustment metal containing structure 134B described with reference to FIG. 3, and may have a greater oxygen content than the second work function adjustment metal containing structure 134B.

Figure 7:
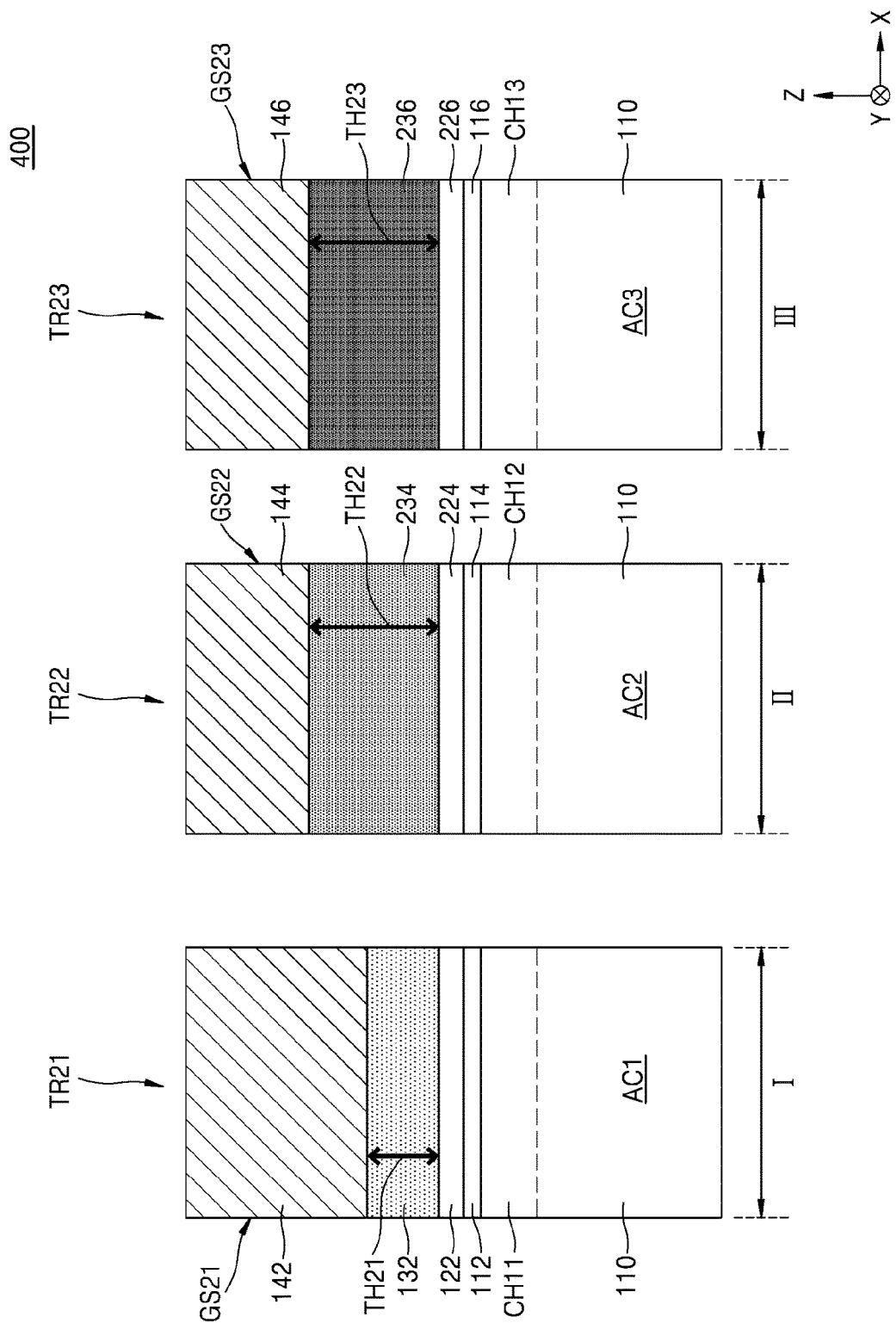
FIG. 7 is a cross-sectional view for describing an integrated circuit device according to other exemplary embodiments.

FIG. 7 is a cross-sectional view for describing an integrated circuit device 400 according to other exemplary embodiments. The same reference numerals between FIGS. 1 through 7 denote the same terms, and thus detailed descriptions thereof are omitted.

Referring to FIG. 7, the integrated circuit device 400 may have substantially the same configuration as the integrated circuit device 200 shown in FIG. 4, except that the integrated circuit device 400 further includes a third transistor TR23 formed in the third area III of the substrate 110.

The third transistor TR23 may include the third interface layer 116, a third high dielectric layer 226, and a third gate stack GS23 that are sequentially formed on the third active area AC3 of the third area III of the substrate 110. For example, the third gate stack GS23 may be formed on the third high dielectric layer 226, the third high dielectric layer 226 may be formed on the third interface layer 116, and the third interface layer 1126 may be formed on the third active area AC3. The third gate stack GS23 may include a third work function adjustment metal containing structure 236 formed on the third high dielectric layer 226 and the third upper gate layer 146 covering the third work function adjustment metal containing structure 236. For example, the third upper gate layer 146 may be formed on and cover a top surface of the third work function adjustment metal containing structure 236.

In some embodiments, the first transistor TR21, the second transistor TR22, and the third transistor TR23 may require different threshold voltages.

In some embodiments, a more detailed description of the third transistor TR23 is substantially the same as that of the third transistor TR13 provided with reference to FIG. 6 above. However, in the integrated circuit device 400 shown in FIG. 7, the third work function adjustment metal containing structure 236 may have substantially the same configuration as the second work function adjustment metal containing structure 234 formed in the second area II and may include a third conductive layer having a third oxygen content that is greater than a second oxygen content of the second work function adjustment metal containing structure 234.

The third work function adjustment metal containing structure 236 may include a multilayer having a third thickness TH23. The third thickness TH23 may be greater than the first thickness TH21 and may be the same as or similar to the second thickness TH22. In some embodiments, the third conductive layer included in the third work function adjustment metal containing structure 236 may include a TiON layer, a TiO layer, a TaON layer, a TiAlN(O) layer, a TaAlN(O) layer, or a combination of these.

In some embodiments, the third work function adjustment metal containing structure 236 included in the third transistor TR23 may have the same structure as the second work function adjustment metal containing structure 234C described with reference to FIG. 5 and may have greater oxygen content than the second work function adjustment metal containing structure 234C.

A method of manufacturing an integrated circuit device based on a process order, according to embodiments, will be described in detail.

FIGS. 8A through 8D are cross-sectional views for describing a method of manufacturing an integrated circuit device, according to embodiments. The same reference numerals between FIGS. 1 through 7 and FIGS. 8A through 8D denote the same terms, and thus detailed descriptions thereof are omitted.

Figure 8A:
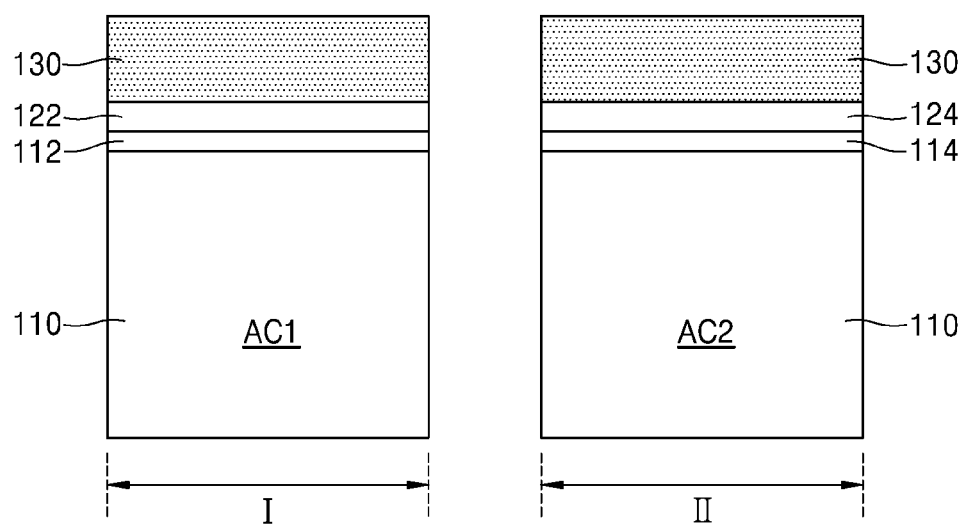
FIGS. 8A through 8D are cross-sectional views for describing a method of manufacturing an integrated circuit device, according to exemplary embodiments.

Referring to FIG. 8A, the substrate 110 including the first area I and the second area II may be prepared.

The substrate 110 may include semiconductor such as Si and Ge, or compound semiconductor such as SiGe, SiC, GaAs, InAs, and InP. In some embodiments, the substrate 110 may include at least one of a group III-V material and a group IV material. The group III-V material may include a binary, a trinary, or a quaternary compound including at least one group III element and at least one group V element. The group III-V material may be a compound including at least one element of In, Ga, and Al as the group III element and at least one element of As, P, and Sb as the group V element. For example, the group III-V material may be selected from InP, $In_zGa_{1-z}As$ ($0 \leq z \leq 1$), and $Al_zGa_{1-z}As$ ($0 \leq z \leq 1$). The binary compound may be one of, for example, InP, GaAs, InAs, InSb and GaSb. The trinary compound may be one of InGaP, InGaAs, AlInAs, InGaSb, GaAsSb and GaAsP. The group IV material may be Si or Ge. However, the disclosed embodiments are not limited to the above examples of the group III-V material and the group IV material. The group III-V material and the group IV material such as Ge may be used as channel materials for forming a transistor having a low power consumption and a high operating speed. A high performance complementary metal oxide semiconductor (CMOS) may be fabricated by using a semiconductor substrate including the group III-V material, e.g., GaAs, having a higher electron mobility than that of an Si substrate, and a semiconductor substrate having a semiconductor material, e.g., Ge, having a higher hole mobility than that of the Si substrate. In some embodiments, when an NMOS transistor is formed on the substrate 110, the substrate 110 may include one of the group III-V materials explained above. In some other embodiments, when a PMOS transistor is formed on the substrate 110, at least a part of the substrate 110 may include Ge. In other embodiments, the substrate 110 may have a silicon-on-insulator (SOI) structure. The substrate 110 may include a conductive area, for example, a well doped with impurities or a structure doped with impurities.

The first interface layer 112 may be formed on the first active area AC1 of the first area I. The second interface layer 114 may be formed on the second active area AC2 of the second area II.

The first interface layer 112 and the second interface layer 114 may be simultaneously formed. For example, the first interface layer 112 and the second interface layer 114 may be formed by the same deposition process. The first interface layer 112 and the second interface layer 114 may include a low dielectric material layer having a dielectric constant of 9 or less, e.g., a silicon oxide layer, a silicon oxynitride layer, or a combination thereof. In some embodiments, the first interface layer 112 and the second interface layer 114 may be obtained by oxidizing surfaces of the first active area AC1 and the second active area AC2, respectively. In some other embodiments, the first interface layer 112 and the second interface layer 114 may include silicate, a combination of silicate and a silicon oxide layer, or a combination of silicate and a silicon oxynitride layer. In some embodiments, the first interface layer 112 and the second interface layer 114 may have a thickness in a range from about 5 Å to about 20 Å, but are not limited thereto.

In the first area I, the first high dielectric layer 122 may be formed on the first interface layer 112. In the second area II, the second high dielectric layer 124 may be formed on the second interface layer 114.

To form the first high dielectric layer 122 and the second high dielectric layer 124, a preparatory high dielectric layer including metal oxide may be formed and then annealed. A more detailed configuration of the preparatory high dielectric layer will be described in a preparatory high dielectric layer 120 with reference to FIG. 9A. Annealing may be performed in an oxygen atmosphere or an inert gas atmosphere, as appropriate.

In some embodiments, the preparatory high dielectric layer may be annealed in the oxygen atmosphere by covering a part of the preparatory high dielectric layer present in the first area I with a mask pattern (not shown) and exposing a part of the preparatory high dielectric layer present in the second area II. In this case, the part of the preparatory high dielectric layer present in the first area I may remain as the first high dielectric layer 122 without a change in the composition, and the part of the preparatory high dielectric layer present in the second area II may be the second high dielectric layer 124 having greater oxygen content than that of the first high dielectric layer 122. As a result, an oxygen vacancy density of the first high dielectric layer 122 may be higher than that of the second high dielectric layer 124. Annealing may be performed at a temperature ranging from about 400° C. to about 1000° C.

In some other embodiments, the preparatory high dielectric layer may be annealed in the inert gas atmosphere, for example, a nitrogen atmosphere. In this case, there may be no substantial change in the oxygen content of the preparatory high dielectric layer in the first area I and the second area II, and there may be no substantial change in the oxygen vacancy density of each of the first high dielectric layer 122 and the second high dielectric layer 124.

A work function adjustment metal containing layer 130 may be formed on the first high dielectric layer 122 and the second high dielectric layer 124 in the respective first area I and the second area II.

In some embodiments, the work function adjustment metal containing layer 130 may include a Ti layer, a TiN layer, a TiON layer, a TiO layer, a Ta layer, a TaN layer, a TaON layer, a TiAlN(O) layer, a TaAlN(O) layer, or a combination of these, but the embodiments are not limited to these examples.

Figure 8B:
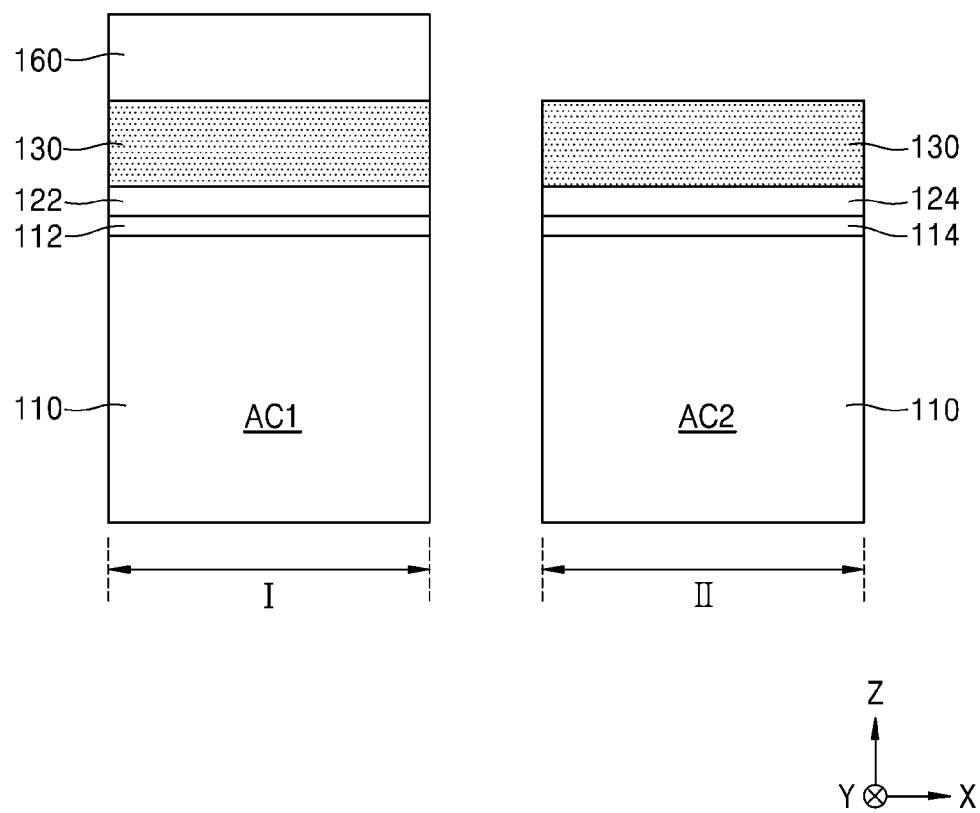

Referring to FIG. 8B, a mask pattern 160 selectively covering only a part of the work function adjustment metal containing layer 130 present in the first area I may be formed.

After the mask pattern 160 is formed, the work function adjustment metal containing layer 130 may be exposed in the second area II. The mask pattern 160 may include, for example, a photoresist pattern or a hard mask pattern. The hard mask pattern may include a silicon oxide layer, a silicon nitride layer, a polysilicon layer, or a combination of these, but the embodiments are not limited to these examples.

Figure 8C:
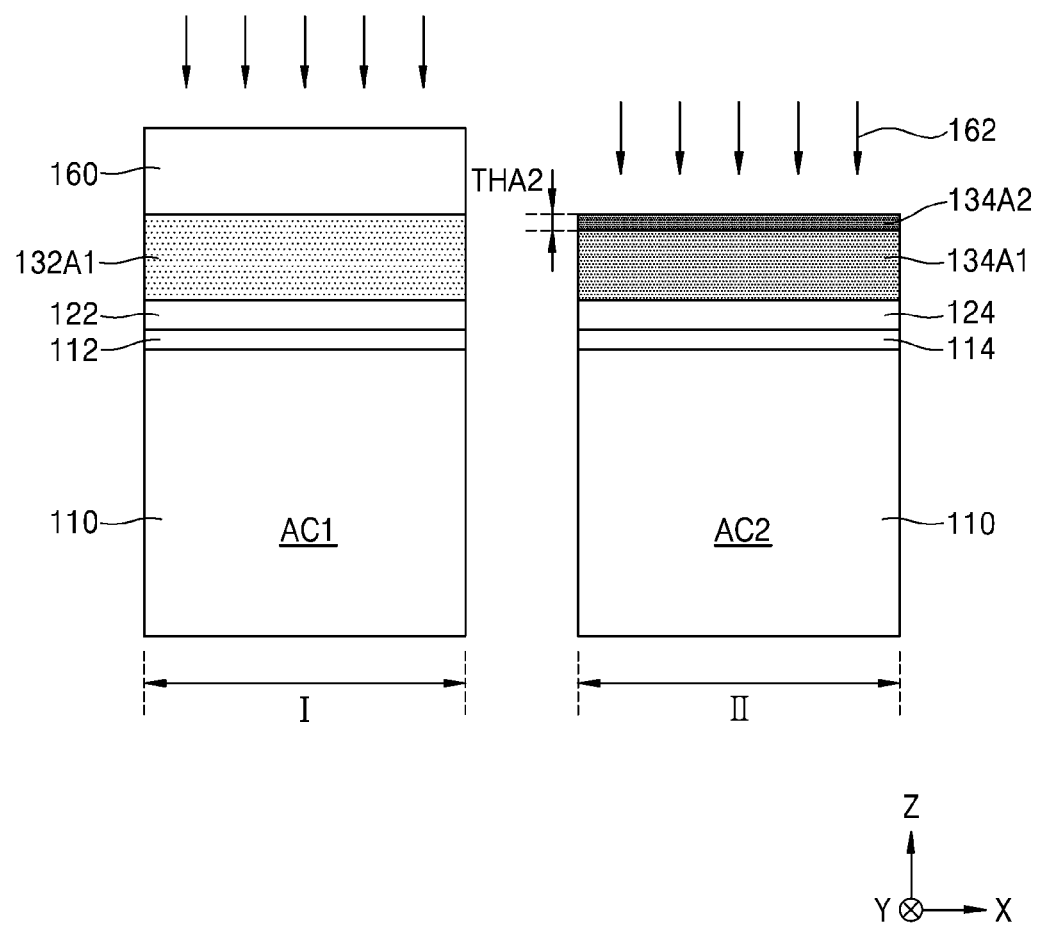

Referring to FIG. 8C, the upper second conductive layer 134A2 may be formed on a part of an upper portion of the work function adjustment metal containing layer 130 in the second area II by oxidizing only to a certain depth of an upper surface of the work function adjustment metal containing layer 130 (see FIG. 8B) of the second area II exposed through the mask pattern 160. A thickness part of the work function adjustment metal containing layer 130 of the second area II, excluding the upper second conductive layer 134A2, may remain as the lower second conductive layer 134A1.

An oxidation atmosphere 162 may be used to oxidize only to the certain depth of the upper surface of the work function adjustment metal containing layer 130 of the second area II. In some embodiments, the oxidation atmosphere 162 may include ozone water. For example, the upper surface of the work function adjustment metal containing layer 130 exposed in the second area II may contact the ozone water for about 10 seconds~about 3 minutes so as to form the upper second conductive layer 134A2. The ozone water may be sprayed to the substrate 110 or the substrate 110 may be dipped into the ozone water. While the upper surface of the work function adjustment metal containing layer 130 exposed in the second area II is in contact with the ozone water, a material forming the work function adjustment metal containing layer 130 may be oxidized from the upper surface of the work function adjustment metal containing layer 130 to a certain depth or within a certain thickness range. For example, when the work function adjustment metal containing layer 130 includes a TiN layer, a part of the work function adjustment metal containing layer 130 may be oxidized into TiO by the contact with the ozone water, and thus the upper second conductive layer 134A2 having a greater oxygen content than that of the lower second conductive layer 134A1 may be obtained.

The thickness THA2 of the upper second conductive layer 134A2 may range from about 10%~about 90% of the total thickness of the work function adjustment metal containing layer 130, but the concepts are not limited to this example.

While the upper second conductive layer 134A2 is formed in the second area II, a part of the work function adjustment metal containing layer 130 present in the first area I may remain as the first conductive layer 132A1 without a substantial change.

Figure 8D:
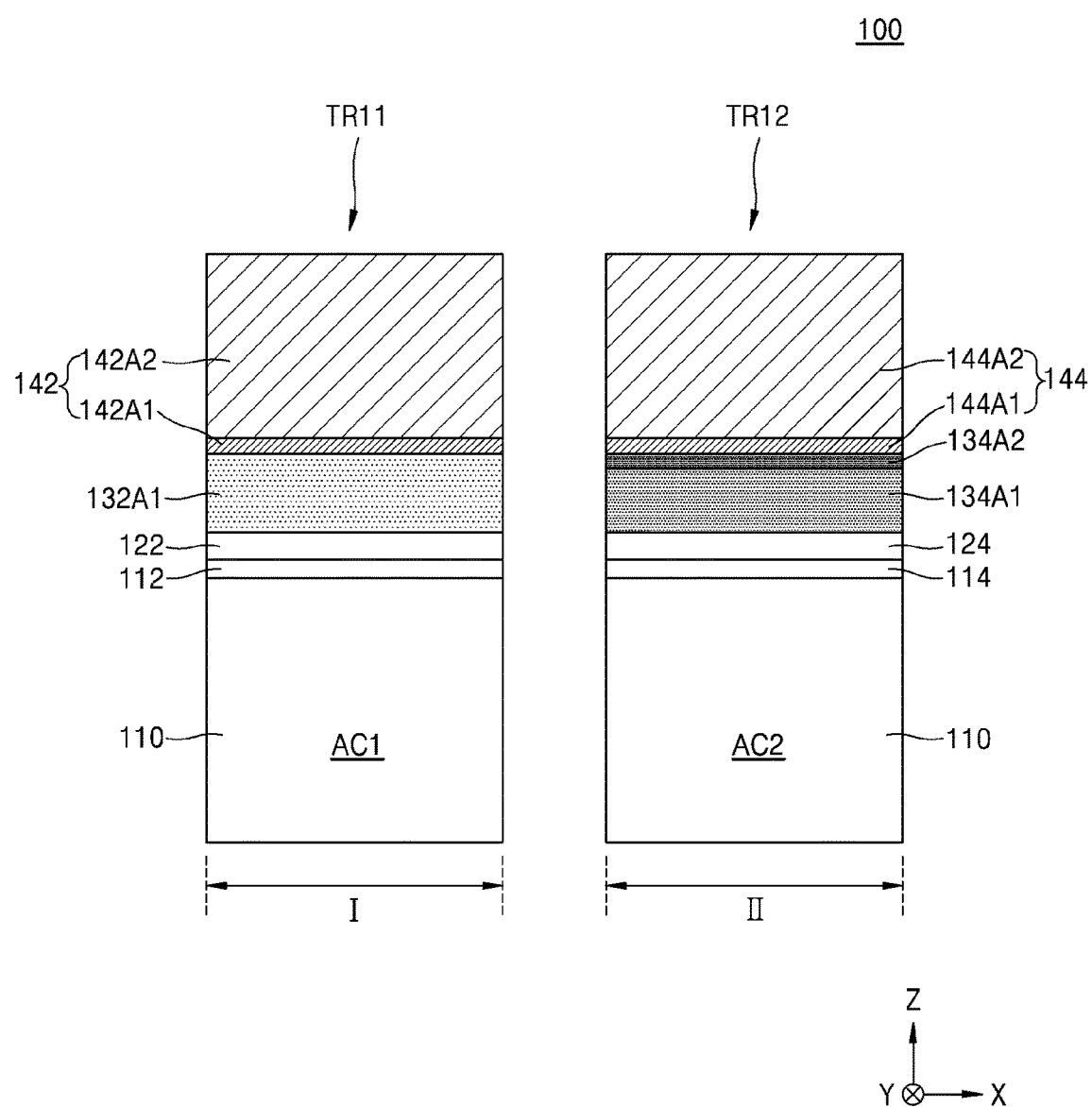

Referring to FIG. 8D, after the mask pattern 160 (see FIG. 8C) covering the first area I is removed, the first upper gate layer 142 may be formed on the first conductive layer 132A1 present in the first area I, and the second upper gate layer 144 may be formed on the upper second conductive layer 134A2 present in the second area II.

FIG. 8D illustrates a case where the first upper gate layer 142 has a stack structure of a first conductive barrier layer 142A1 and a first gap-fill metal layer 142A2, and the second upper gate layer 144 has a stack structure of a second conductive barrier layer 144A1 and a second gap-fill metal layer 144A2.

In some embodiments, each of the first conductive barrier layer 142A1 and the second conductive barrier layer 144A1 may include TiN, TaN, or a combination of these. In some embodiments, the first gap-fill metal layer 142A2 and the second gap-fill metal layer 144A2 may include tungsten (W).

In some embodiments, although not shown, an upper work function adjustment layer may be further formed between the first conductive layer 132A1 and the first upper gate layer 142 and/or the upper second conductive layer 134A2 and the second upper gate layer 144. The upper work function adjustment layer may include TiAlC, TiAlN, TiC, TaC, HfSi, or a combination of these but is not limited to the examples.

The first transistor TR11 and the second transistor TR12 of the integrated circuit device 100 shown in FIG. 1 may be formed by using the method of manufacturing the integrated circuit device described with reference to FIGS. 8A through 8D.

FIGS. 9A through 9E are cross-sectional views for describing a method of manufacturing an integrated circuit device, according to other embodiments. The same reference numerals between FIGS. 1 through 8D and FIGS. 9A through 9E denote the same terms, and thus detailed descriptions thereof are omitted.

Figure 9A:
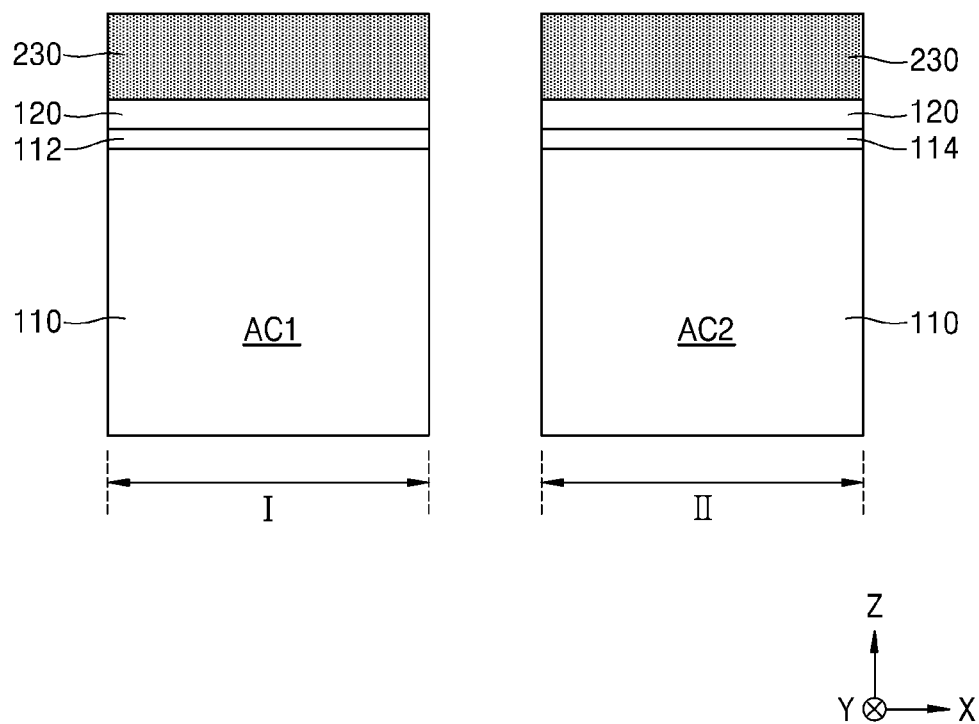
FIGS. 9A through 9E are cross-sectional views for describing a method of manufacturing an integrated circuit device, according to other exemplary embodiments.

Referring to FIG. 9A, in the same manner as described with reference to FIG. 8A, the first interface layer 112 may be formed on the first active area AC1 of the first area I, and the second interface layer 114 may be formed on the second active area AC2 of the second area II.

Thereafter, the preparatory high dielectric layer 120 may be formed on the first interface layer 112 and the second interface layer 114 in the respective first area I and the second area II. The preparatory high dielectric layer 120 may include a material selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof, but is not limited to these examples.

A work function adjustment metal containing layer 230 may be formed on the preparatory high dielectric layer 120 in the first area I and the second area II. The work function adjustment metal containing layer 230 may include a metal containing layer including oxygen. For example, the work function adjustment metal containing layer 230 may include a TiON layer, a TiO layer, a TaON layer, a TiAlN(O) layer, a TaAlN(O) layer, or a combination of these, but is not limited to these examples.

Figure 9B:
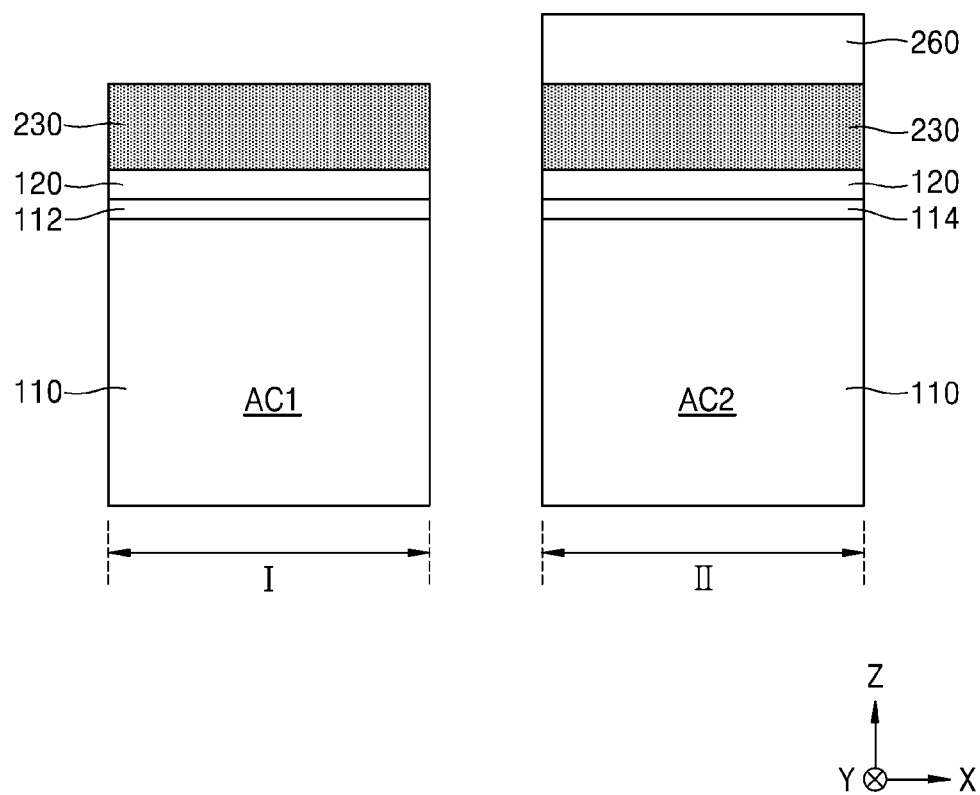

Referring to FIG. 9B, a mask pattern 260 selectively covering only a part of the work function adjustment metal containing layer 230 present in the second area II may be formed. For example, the mask pattern 260 may be formed to selectively cover only the part of the work function adjustment metal containing layer 230 disposed in the second area II.

After the mask pattern 260 is formed, the work function adjustment metal containing layer 230 may be exposed in the first area I.

In some embodiments, the mask pattern 260 may include a photoresist pattern. In some other embodiments, the mask pattern 260 may include a hard mask pattern that may provide etch selectivity between the mask pattern 260 and the work function adjustment metal containing layer 230. The hard mask pattern may include a silicon oxide layer, a silicon nitride layer, a polysilicon layer, or a combination of these, but it is not limited to the examples.

Figure 9C:
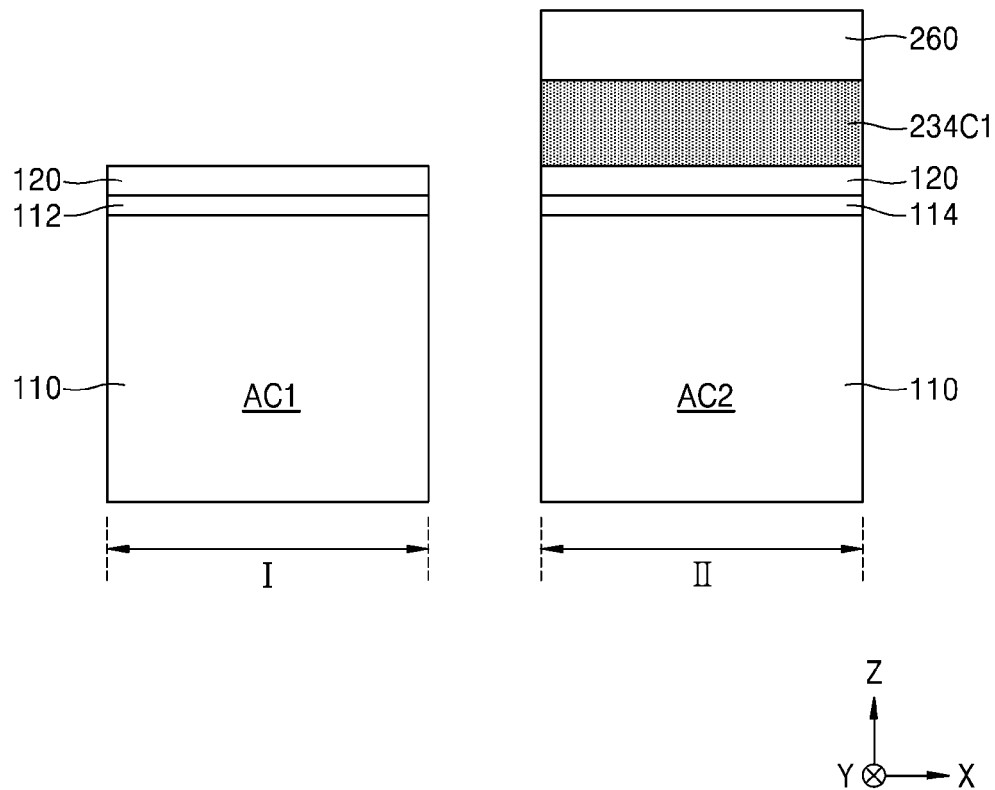

Referring to FIG. 9C, the preparatory high dielectric layer 120 may be exposed in the first area I by removing the work function adjustment metal containing layer 230 (see FIG. 9B) exposed in the first area I.

A part of the work function adjustment metal containing layer 230 remaining in the second area II may be the lower second conductive layer 234C1.

Figure 9D:
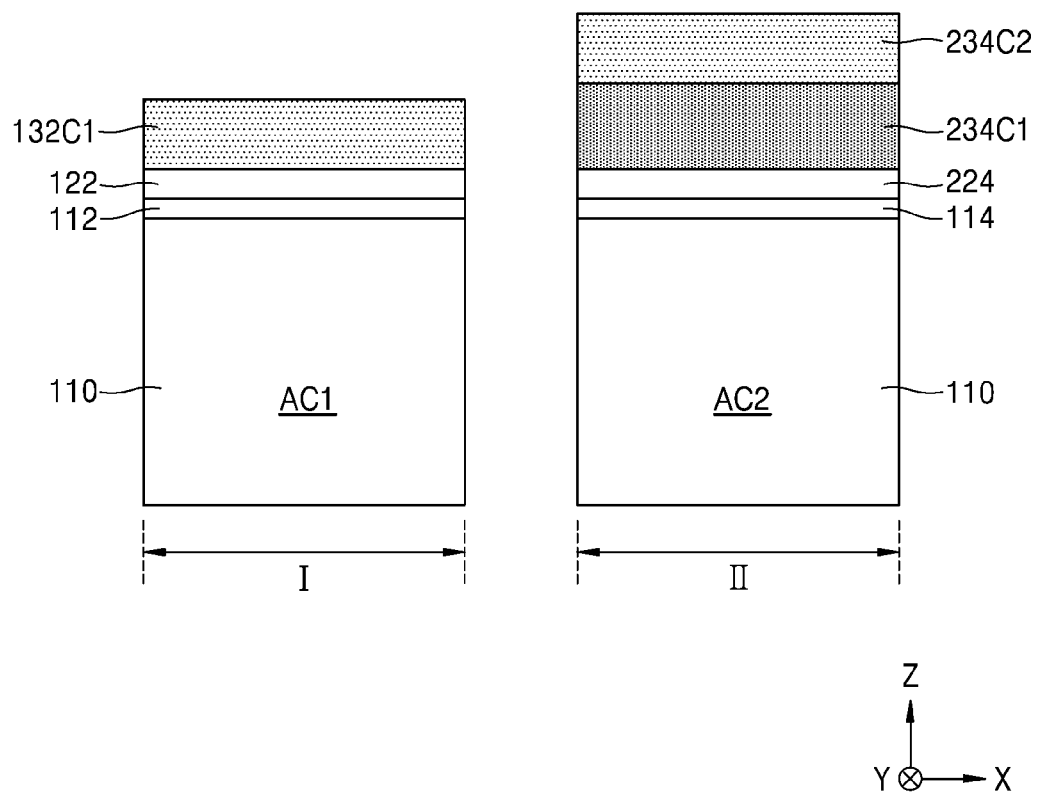

Referring to FIG. 9D, after the mask pattern 260 (see FIG. 9C) covering the second area II is removed, the conductive layers 132C1 and 234C2 may be formed in the respective first area I and the second area II.

The conductive layers 132C1 and 234C2 may include the first conductive layer 132C1 formed on the preparatory high dielectric layer 120 in the first area I and the upper second conductive layer 234C2 formed on the lower second conductive layer 234C1 in the second area II. The conductive layers 132C1 and 234C2 may be simultaneously formed in the respective first area I and the second area II. The conductive layers 132C1 and 234C2 may have a lower oxygen content than that of the lower second conductive layer 234C1 formed in the second area II. In some embodiments, the conductive layers 132C1 and 234C2 may not include oxygen. In some other embodiments, the conductive layers 132C1 and 234C2 may have oxygen content smaller about 5~30 atom % per unit volume than the lower second conductive layer 234C1. In some embodiments, the conductive layers 132C1 and 234C2 may include a Ti layer, a TiN layer, a TiON layer, a TiO layer, a Ta layer, a TaN layer, a TaON layer, a TiAlN(O) layer, a TaAlN(O) layer, or a combination of these, but are not limited to these examples.

The conductive layers 132C1 and 234C2 may have thicknesses greater or less than that of the lower second conductive layer 234C1 formed in the second area II. Alternatively, the conductive layers 132C1 and 234C2 may have the same thicknesses as that of the lower second conductive layer 234C1 formed in the second area II.

In some embodiments, an additional metal containing layer (not shown) may be further formed between the preparatory high dielectric layer 120 and the first conductive layer 132C1 in the first area I and/or between the lower second conductive layer 234C1 and the upper second conductive layer 234C2 in the second area II. For example, the additional metal containing layer may include TiN, TaN, or a combination of these, but it is not limited to these examples.

More detailed configurations of the first conductive layer 132C1, the lower second conductive layer 234C1, and the upper second conductive layer 234C2 are the same as described with reference to FIG. 5 above.

A resultant of the conductive layers 132C1 and 234C2 may be annealed. During the annealing of the resultant, oxygen atoms may diffuse from the first conductive layer 132C1 present in the first area I to the preparatory high dielectric layer 120 (see FIG. 9C). Annealing may be performed on the resultant in an inert gas atmosphere, for example, a nitrogen atmosphere, at a temperature ranging from about 400° C. to about 1000° C. Annealing may be performed on the resultant for about 1 second to about 10 seconds, but it is not limited thereto.

When the first conductive layer 132C1 does not include oxygen atoms, during the annealing of the resultant, oxygen atoms may not diffuse from the first conductive layer 132C1 to the preparatory high dielectric layer 120. Meanwhile, during the annealing of the resultant, oxygen atoms may diffuse from the lower second conductive layer 234C1 formed in the second area II to the preparatory high dielectric layer 120. In this regard, since an oxygen content of the lower second conductive layer 234C1 is greater than that of the first conductive layer 132C1, after annealing is performed on the resultant, a part of the preparatory high dielectric layer 120 present in the first area I may remain as the first high dielectric layer 122 having a relatively small oxygen content, and a part of the preparatory high dielectric layer 120 present in the second area II may remain as the second high dielectric layer 224 having a relatively large oxygen content. An oxygen vacancy density of the first high dielectric layer 122 may be higher than that of the second high dielectric layer 224. More detailed configurations of the first high dielectric layer 122 and the second high dielectric layer 224 are the same as described with reference to FIGS. 1, 4, and 5.

In some embodiments, annealing of the resultant may be omitted.

In some embodiments, during a deposition process for forming the conductive layers 132C1 and 234C2, oxygen atoms may diffuse to the preparatory high dielectric layer 120 at a deposition process temperature. As a result, the first high dielectric layer 122 and the second high dielectric layer 224 may be obtained from the preparatory high dielectric layer 120.

Figure 9E:
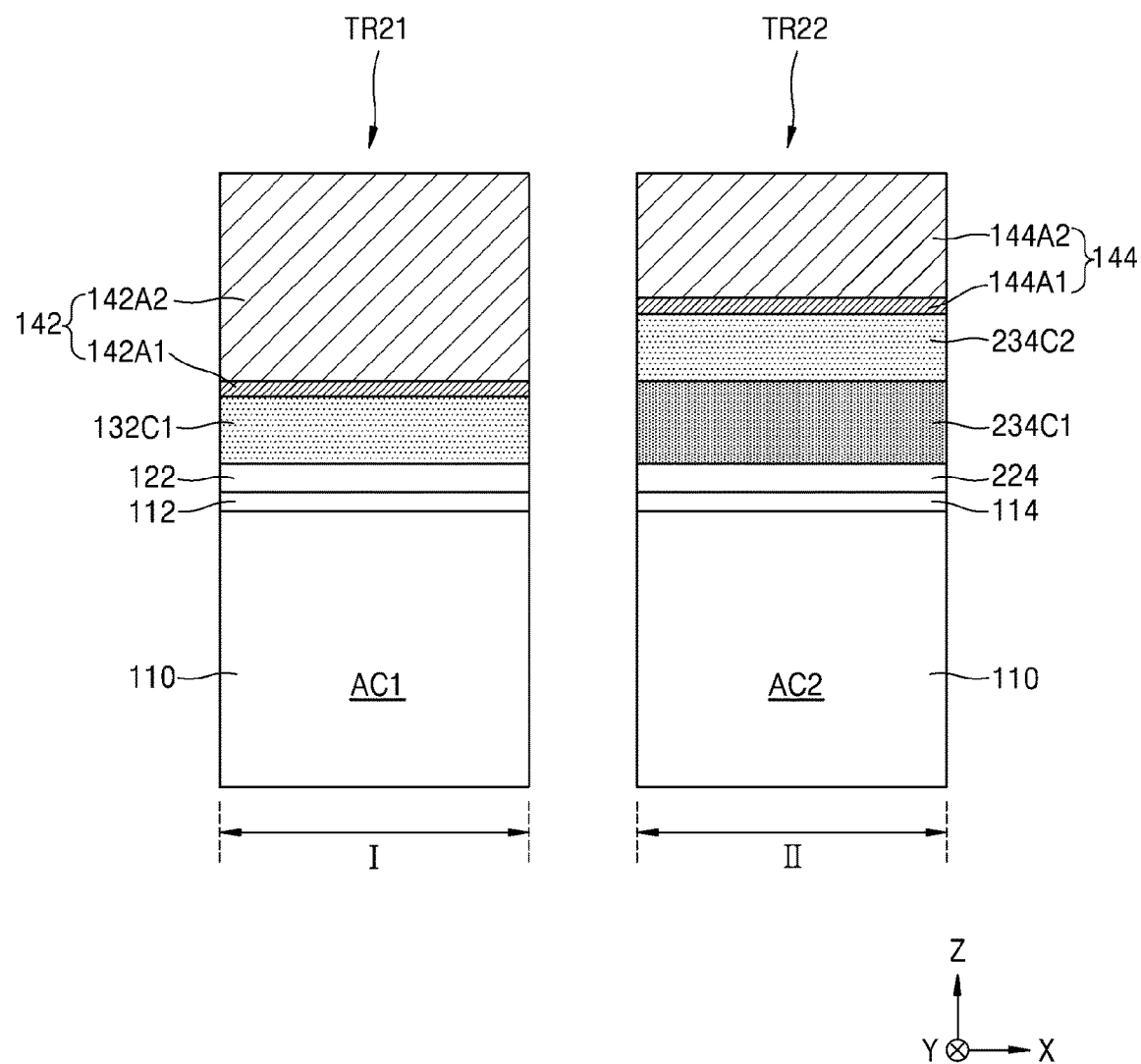

Referring to FIG. 9E, the first upper gate layer 142 may be formed on the first conductive layer 132C1 present in the first area I, and the second upper gate layer 144 may be formed on the upper second conductive layer 234C2 present in the second area II.

More detailed configurations of the first upper gate layer 142 and the second upper gate layer 144 are the same as described with reference to FIG. 8D above.

The first transistor TR21 and the second transistor TR22 of the integrated circuit device 200 shown in FIG. 4 may be formed by using the method of manufacturing the integrated circuit device described with reference to FIGS. 9A through 9E.

FIGS. 10A through 10D are cross-sectional views for describing a method of manufacturing an integrated circuit device, according to other embodiments. The same reference numerals between FIGS. 1 through 9E and FIGS. 10A through 10D denote the same terms, and thus detailed descriptions thereof are omitted.

Figure 10A:
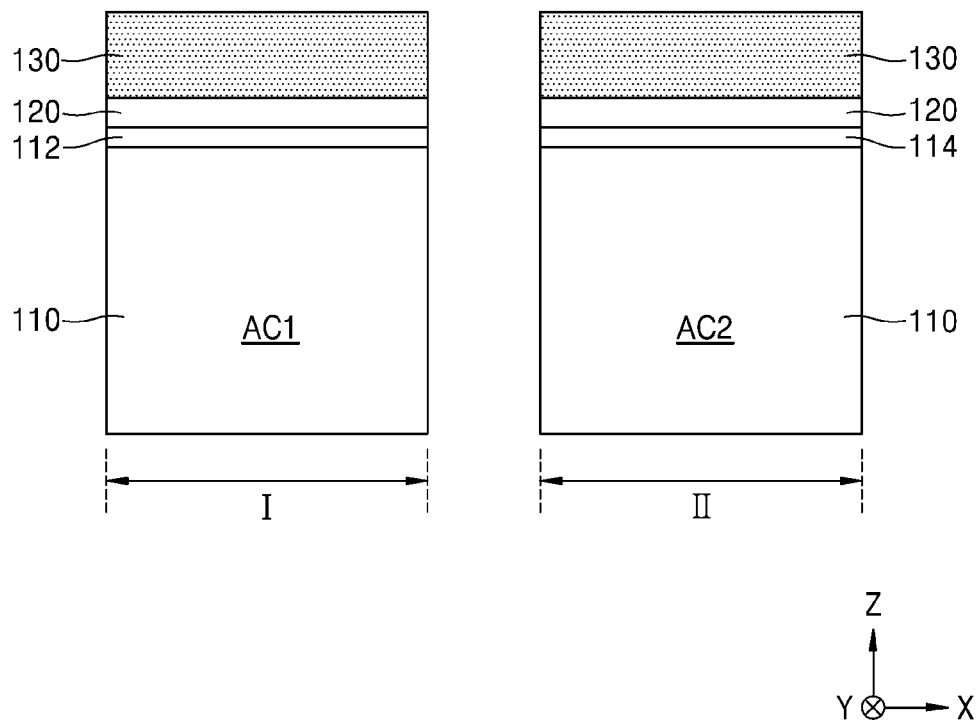
FIGS. 10A through 10D are cross-sectional views for describing a method of manufacturing an integrated circuit device, according to other exemplary embodiments.

Referring to FIG. 10A, in the same manner as described with reference to FIG. 9A, the first interface layer 112 may be formed on the first active area AC1 of the first area I of the substrate 110, and the second interface layer 114 may be formed on the second active area AC2 of the second area II. Thereafter, the preparatory high dielectric layer 120 may be formed on the first interface layer 112 and the second interface layer 114 in the respective first area I and the second area II.

Thereafter, the work function adjustment metal containing layer 130 may be formed on the preparatory high dielectric layer 120 in the first area I and the second area II. A more detailed description of the work function adjustment metal containing layer 130 is the same as described with reference to FIG. 8A.

Figure 10B:
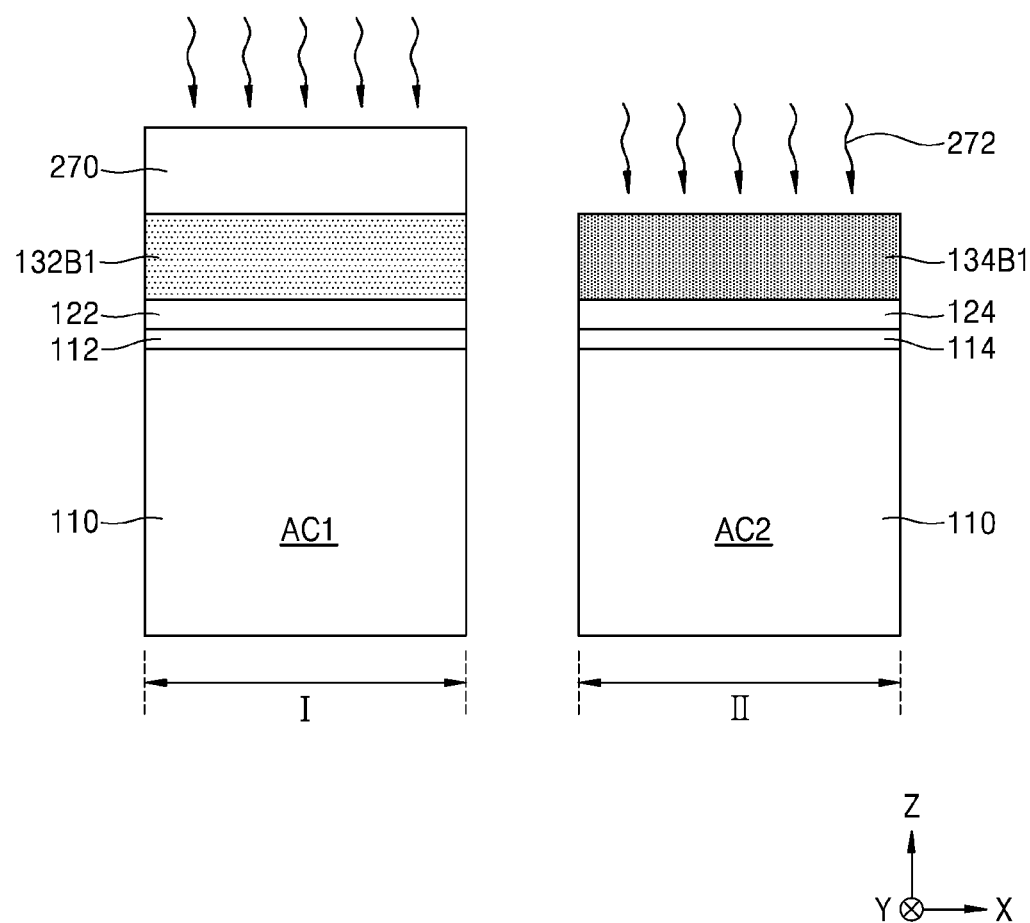

Referring to FIG. 10B, a mask pattern 270 selectively covering only a part of the work function adjustment metal containing layer 130 present in the first area I may be formed. For example, the mask pattern 270 may be formed to selectively cover only the part of the part of the work function adjustment metal containing layer 130 present in the first area I.

After the mask pattern 270 is formed, the work function adjustment metal containing layer 130 may be exposed in the second area II. The mask pattern 270 may include a photoresist pattern or a hard mask pattern. The hard mask pattern may include a silicon oxide layer, a silicon nitride layer, a polysilicon layer, or a combination of these, but it is not limited to these examples.

While the mask pattern 270 covers the first area I, at least a part of the work function adjustment metal containing layer 130 present in the second area II may be oxidized by supplying oxygen atoms to the work function adjustment metal containing layer 130 present in the second area II. To this end, a resultant of the mask pattern 270 may be annealed under an oxygen containing atmosphere 272.

In some embodiments, the oxygen containing atmosphere 272 may be $O_2$, $O_3$, $H_2O$, a combination of these, or a plasma atmosphere of these.

In some embodiments, a rapid thermal annealing (RTA) process may be performed on the resultant of the mask pattern 270 to anneal the resultant. The RTA process may be performed for a period of time ranging from several milliseconds to several seconds, for example, about 1 second to about 10 seconds, at a temperature ranging from about 400° C. to about 1000° C.

During the resultant is annealed under the oxygen containing atmosphere 272, the second conductive layer 134B1 may be formed by supplying oxygen atoms to the work function adjustment metal containing layer 130 exposed to the oxygen containing atmosphere 272 in the second area II. Some of the oxygen atoms supplied to the work function adjustment metal containing layer 130 may diffuse to the inside of the preparatory high dielectric layer 120 below the work function adjustment metal containing layer 130, and thus the second high dielectric layer 124 having a greater oxygen content than that of the preparatory high dielectric layer 120 before the resultant is annealed may be formed.

Meanwhile, since the work function adjustment metal containing layer 130 is covered by the mask pattern 270 in the first area I, the work function adjustment metal containing layer 130 may not be substantially changed or altered by annealing under the oxygen containing atmosphere 272. As a result, the work function adjustment metal containing layer 130 may remain as the first conductive layer 132B1 having a lower oxygen content than that of the second conductive layer 134B1 in the first area I, and the preparatory high dielectric layer 120 may remain as the first high dielectric layer 122 having a lower oxygen content than that of the second high dielectric layer 124 in the first area I. An oxygen vacancy density of the first high dielectric layer 122 may be higher than that of the second high dielectric layer 124. More detailed configurations of the first high dielectric layer 122 and the second high dielectric layer 124 are the same as described with reference to FIGS. 1 through 3 above.

Figure 10C:
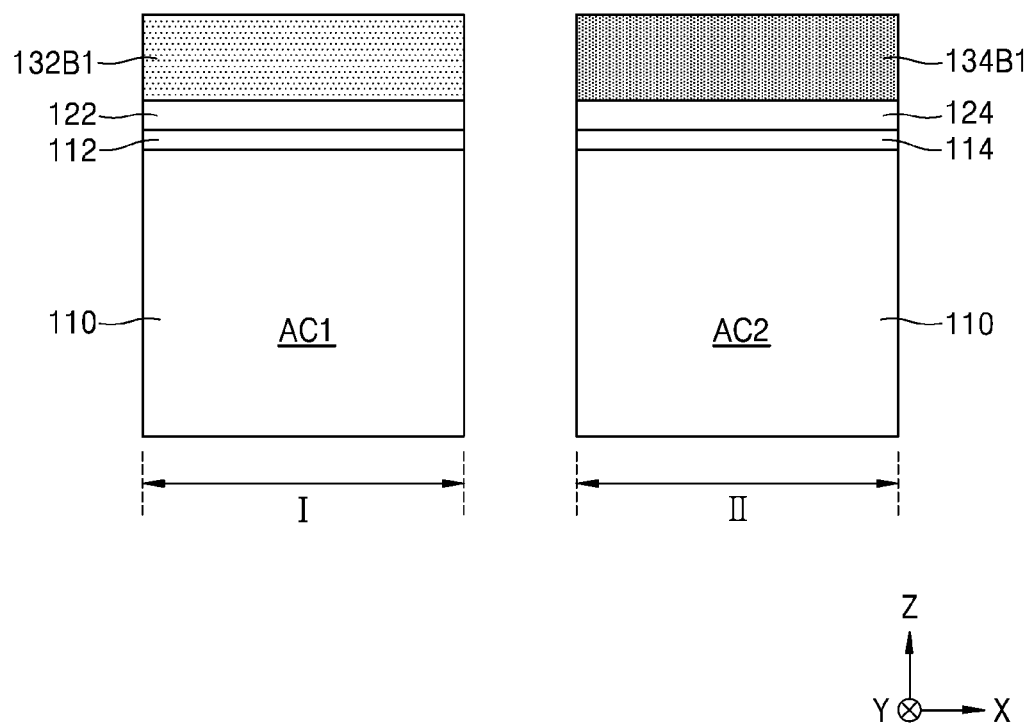

Referring to FIG. 10C, the first conductive layer 132B1 may be exposed in the first area I by removing the mask pattern 270 (see FIG. 10B).

Figure 10D:
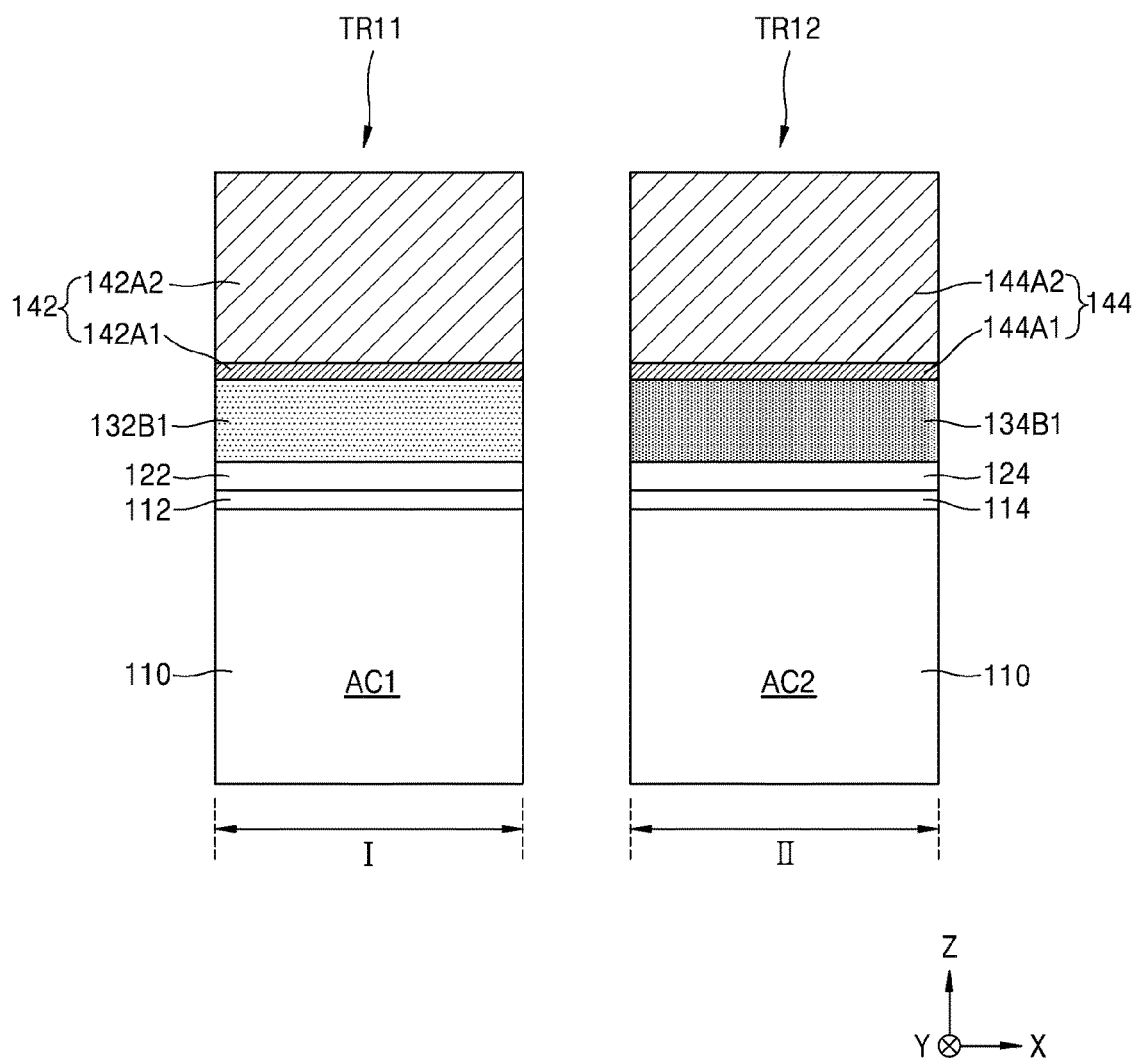

Referring to FIG. 10D, the first upper gate layer 142 may be formed on the first conductive layer 132B1 present in the first area I, and the second upper gate layer 144 may be formed on the second conductive layer 134B1 present in the second area II.

More detailed configurations of the first upper gate layer 142 and the second upper gate layer 144 are the same as described with reference to FIG. 8D above.

The first transistor TR11 and the second transistor TR12 of the integrated circuit device 100 shown in FIG. 1 may be formed by using the method of manufacturing the integrated circuit device described with reference to FIGS. 10A through 10D.

Figure 11A:
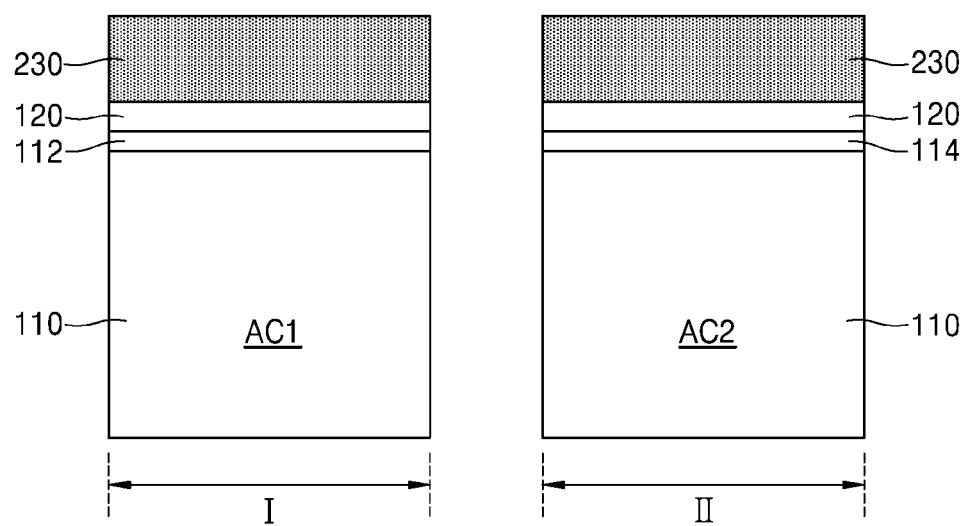
FIGS. 11A through 11C are cross-sectional views for describing a method of manufacturing an integrated circuit device, according to other exemplary embodiments.
Figure 11A:
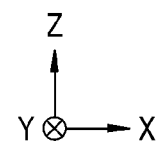
Figure 11B:
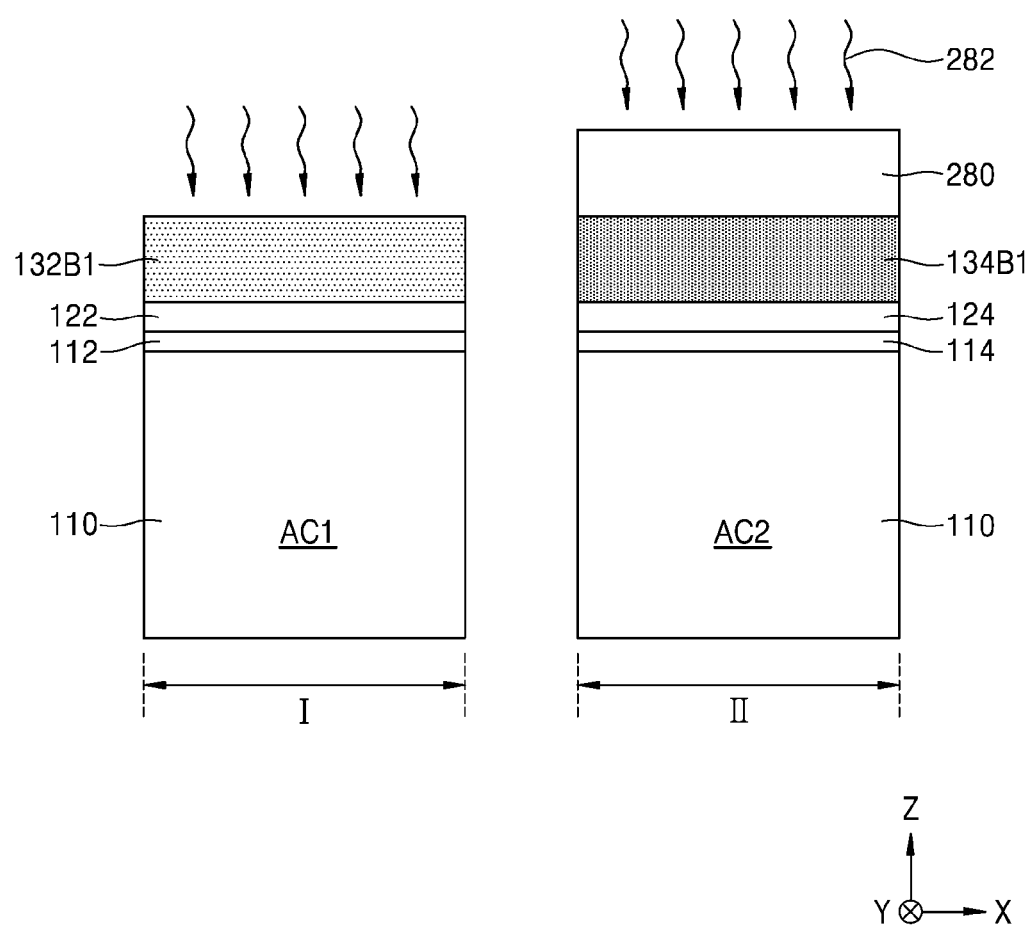
Figure 11C:
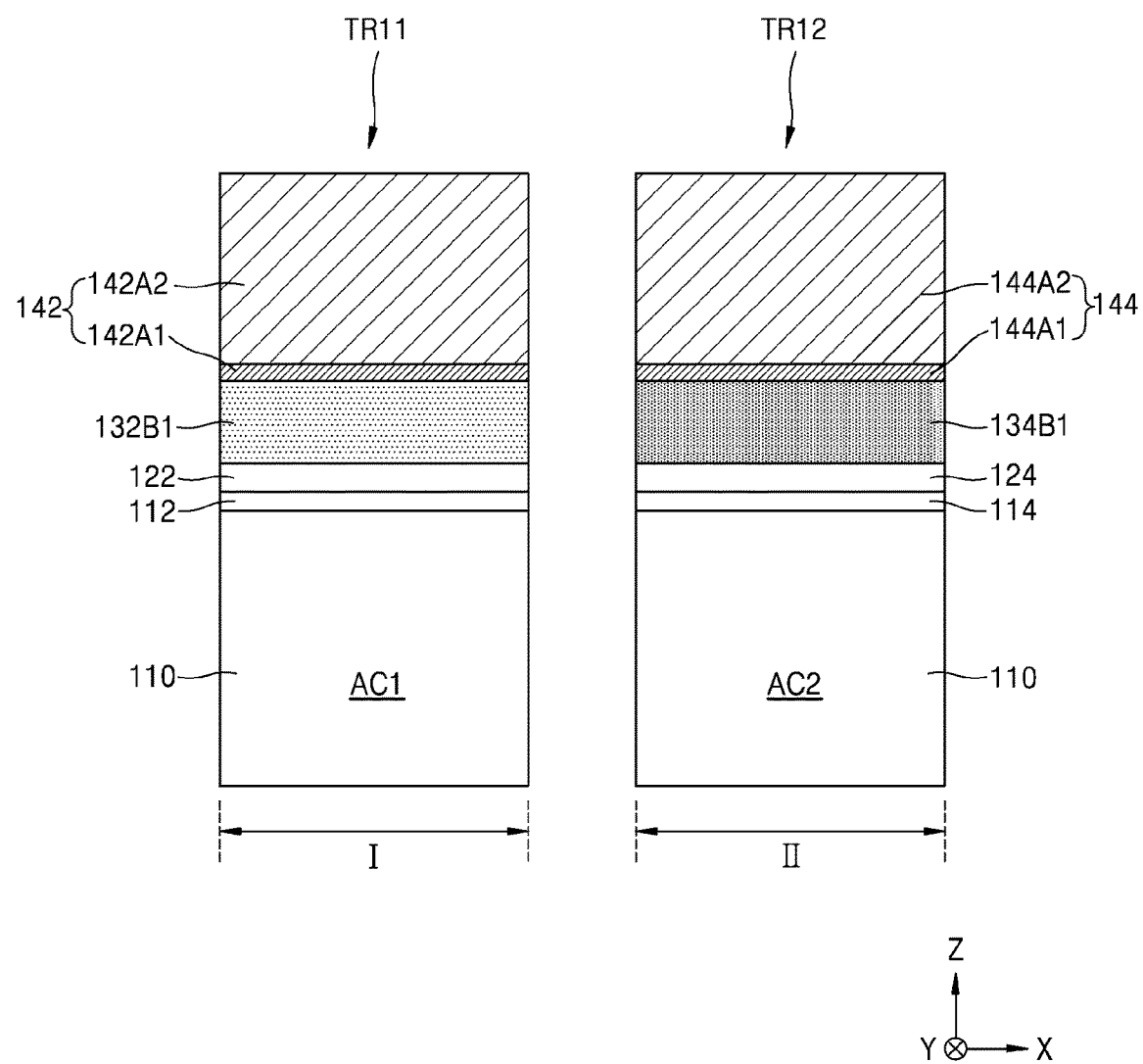

FIGS. 11A through 11C are cross-sectional views for describing a method of manufacturing an integrated circuit device, according to other embodiments. The same reference numerals between FIGS. 1 through 10D and FIGS. 11A through 11C denote the same terms, and thus detailed descriptions thereof are omitted.

Referring to FIG. 11A, in the same manner as described with reference to FIG. 9A, the first interface layer 112 may be formed on the first active area AC1 of the first area I of the substrate 110, and the second interface layer 114 may be formed on the second active area AC2 of the second area II. Thereafter, the preparatory high dielectric layer 120 and the work function adjustment metal containing layer 230 may be sequentially formed on the first interface layer 112 and the second interface layer 114 in the first area I and the second area II. The work function adjustment metal containing layer 230 may include a metal containing layer including oxygen.

Referring to FIG. 11B, a mask pattern 280 selectively covering only a part of the work function adjustment metal containing layer 230 present in the second area II may be formed.

The mask pattern 280 may have the same configuration as that of the mask pattern 260 described with reference to FIG. 9B.

While the mask pattern 280 covers the work function adjustment metal containing layer 230 in the second area II, at least a part of the work function adjustment metal containing layer 230 present in the first area I may be deoxidized by supplying deoxidization gas to the work function adjustment metal containing layer 230 present in the first area I. To this end, a resultant of the mask pattern 280 may be annealed under a deoxidization gas atmosphere 282.

In some embodiments, the deoxidization gas atmosphere 282 may be $NH_3$, light hydrogen molecules $H_2$, heavy hydrogen molecules $D_2$, a combination of these, or a plasma atmosphere of these.

In some embodiments, the resultant of the mask pattern 280 may be annealed under the deoxidization gas atmosphere 282 for a period of time ranging from several milliseconds to several minutes, for example, about 1 second to about 60 seconds, at a temperature ranging from about 400° C. to about 700° C.

As the resultant is annealed under the deoxidization gas atmosphere 282, a deoxidization reaction may be performed in at least an area of the work function adjustment metal containing layer 230 exposed to the deoxidization gas atmosphere 282 in the first area I, and thus the first conductive layer 132B1 having a lower oxygen content than that of the work function adjustment metal containing layer 230 before the resultant is annealed may be obtained. Some deoxidization gas atoms supplied to the work function adjustment metal containing layer 230 may diffuse to the inside of the preparatory high dielectric layer 120 below the work function adjustment metal containing layer 230, and thus the deoxidization reaction may be performed in the first area I. As a result, the first high dielectric layer 122 having a lower oxygen content than that of the preparatory high dielectric layer 120 before the resultant is annealed may be formed in the first area I.

Meanwhile, since the work function adjustment metal containing layer 230 is covered by the mask pattern 280 in the second area II, the work function adjustment metal containing layer 230 may not be substantially changed or altered by annealing under the deoxidization gas atmosphere 282. As a result, the work function adjustment metal containing layer 230 may remain as the second conductive layer 134B1 having a higher oxygen content than that of the first conductive layer 132B1 in the second area II, and the preparatory high dielectric layer 120 may remain as the second high dielectric layer 124 having a greater oxygen content than that of the first high dielectric layer 122 in the second area II. An oxygen vacancy density of the first high dielectric layer 122 may be higher than that of the second high dielectric layer 124. More detailed configurations of the first high dielectric layer 122 and the second high dielectric layer 124 are the same as described with reference to FIGS. 1 through 3 above.

Referring to FIG. 11C, after the mask pattern 280 (see FIG. 11B) is removed, the first upper gate layer 142 may be formed on the first conductive layer 132B1 present in the first area I, and the second upper gate layer 144 may be formed on the second conductive layer 134B1 present in the second area II.

More detailed configurations of the first upper gate layer 142 and the second upper gate layer 144 are the same as described with reference to FIG. 8D above.

The first transistor TR11 and the second transistor TR12 of the integrated circuit device 100 shown in FIG. 1 may be formed by using the method of manufacturing the integrated circuit device described with reference to FIGS. 11A through 11C.

Figure 12A:
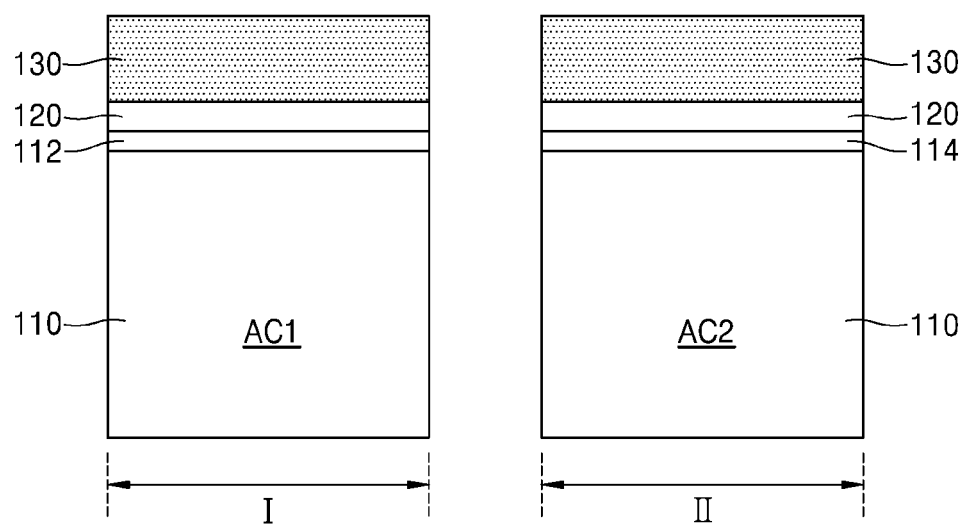
FIGS. 12A through 12C are cross-sectional views for describing a method of manufacturing an integrated circuit device, according to other exemplary embodiments.
Figure 12B:
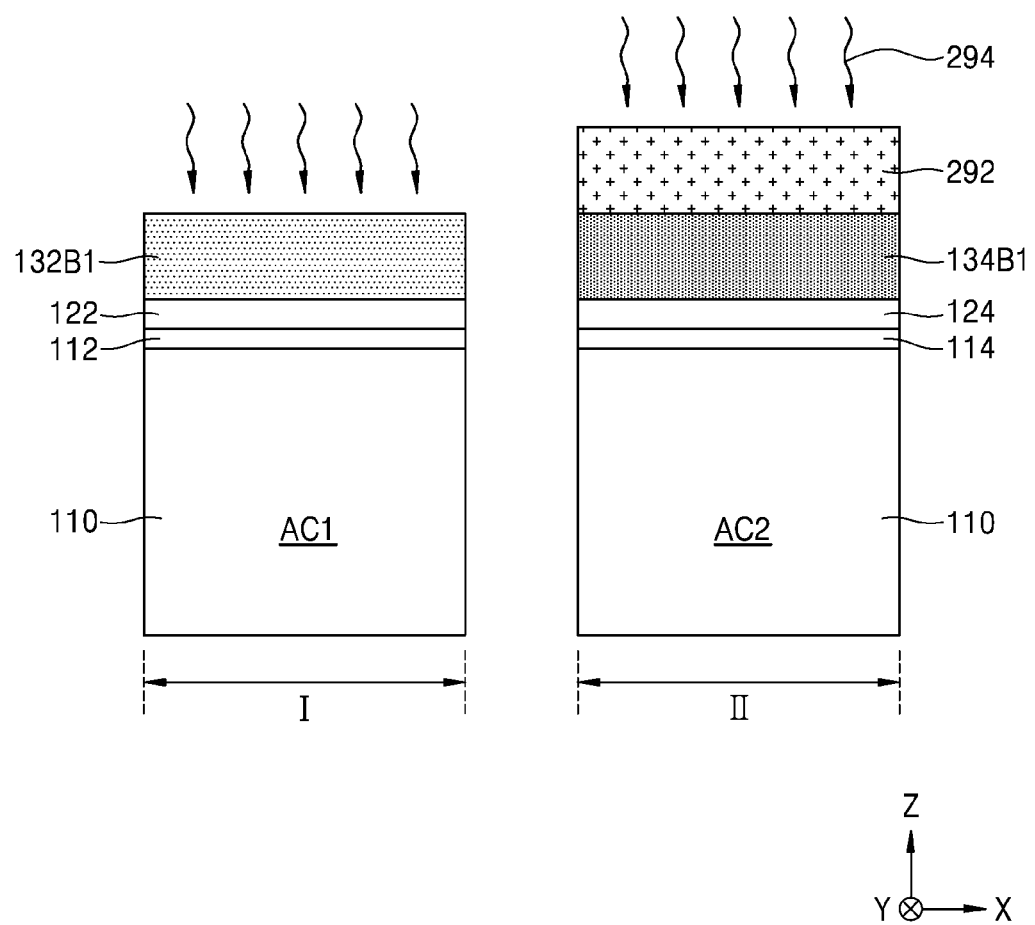
Figure 12C:
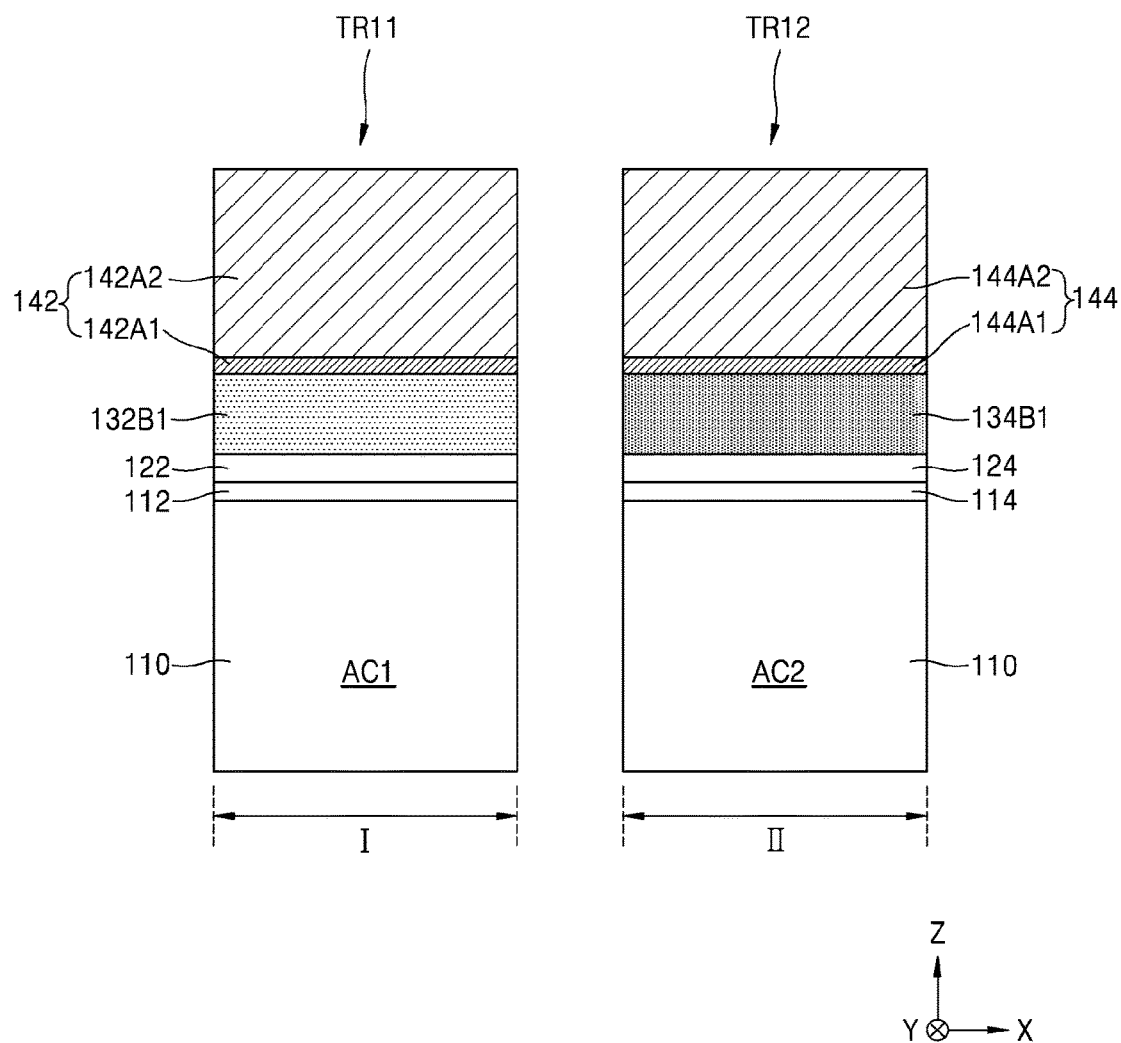

FIGS. 12A through 12C are cross-sectional views for describing a method of manufacturing an integrated circuit device, according to other embodiments. The same reference numerals between FIGS. 1 through 11C and FIGS. 12A through 12C denote the same terms, and thus detailed descriptions thereof are omitted.

Referring to FIG. 12A, in the same manner as described with reference to FIG. 10A, the first interface layer 112 may be formed on the first active area AC1 of the first area I of the substrate 110, and the second interface layer 114 may be formed on the second active area AC2 of the second area II. Thereafter, the preparatory high dielectric layer 120 and the work function adjustment metal containing layer 130 may be sequentially formed on the first interface layer 112 and the second interface layer 114 in the respective first area I and the second area II. The work function adjustment metal containing layer 130 may include a metal containing layer including oxygen or a metal containing layer excluding oxygen.

Referring to FIG. 12B, an oxygen containing layer 292 selectively covering only a part of the work function adjustment metal containing layer 130 present in the second area II may be formed. For example, the oxygen containing layer 292 may be formed to selectively cover the part of the work function adjustment metal containing layer 130 disposed in the second area II.

The oxygen containing layer 292 may be a layer supplying oxygen to the surroundings during annealing, and may include a hafnium oxide layer, a zirconium oxide layer, a silicon oxide layer, but it is not limited thereto.

A resultant having the oxygen containing layer 292 in the second area II may be annealed under an inert atmosphere 294, for example, a nitrogen atmosphere or an argon atmosphere, thereby diffusing oxygen atoms included in the oxygen containing layer 292 into the work function adjustment metal containing layer 130 in the second area II, and may oxidize at least a part of the work function adjustment metal containing layer 130 present in the second area II. In some embodiments, the resultant may be annealed for a period of time ranging from several milliseconds to several seconds, for example, about 1 second to about 10 seconds, at a temperature ranging from about 400° C. to about 1000° C.

While annealing the resultant having the oxygen containing layer 292 under the inert atmosphere 294, the oxygen atoms included in the oxygen containing layer 292 in the second area II may diffuse to the work function adjustment metal containing layer 130, and thus the second conductive layer 134B1 having greater oxygen content than that of the work function adjustment metal containing layer 130 before the resultant is annealed may be formed. Some of the oxygen atoms diffused to the work function adjustment metal containing layer 130 may diffuse to the inside of the preparatory high dielectric layer 120 below the work function adjustment metal containing layer 130, and thus the second high dielectric layer 124 having greater oxygen content than that of the preparatory high dielectric layer 120 before the resultant is annealed may be formed.

Meanwhile, the first area I may not be substantially changed or altered by the oxygen containing layer 292. As a result, the work function adjustment metal containing layer 130 may remain as the first conductive layer 132B1 having a lower oxygen content than that of the second conductive layer 134B1 in the first area I, and the preparatory high dielectric layer 120 may remain as the first high dielectric layer 122 having a lower oxygen content than that of the second high dielectric layer 124 in the first area I. An oxygen vacancy density of the first high dielectric layer 122 may be higher than that of the second high dielectric layer 124.

Referring to FIG. 12C, after the oxygen containing layer 292 (see FIG. 12B) is removed, the first upper gate layer 142 may be formed on the first conductive layer 132B1 present in the first area I, and the second upper gate layer 144 may be formed on the second conductive layer 134B1 present in the second area II, thereby forming the first transistor TR11 and the second transistor TR12.

Figure 13A:
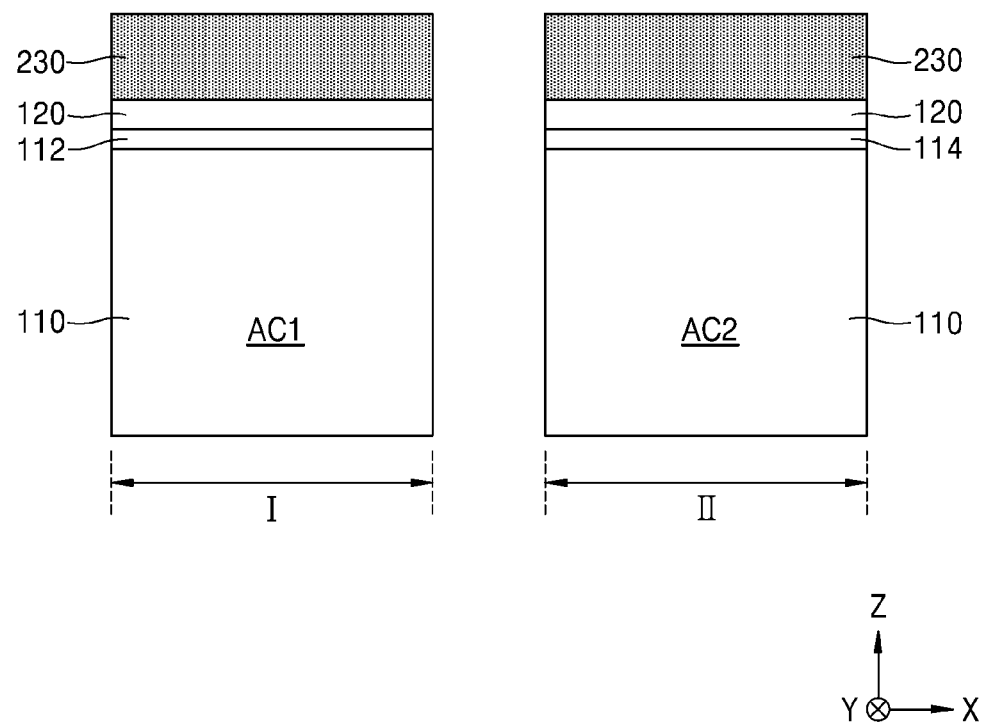
FIGS. 13A through 13C are cross-sectional views for describing a method of manufacturing an integrated circuit device, according to other exemplary embodiments.
Figure 13B:
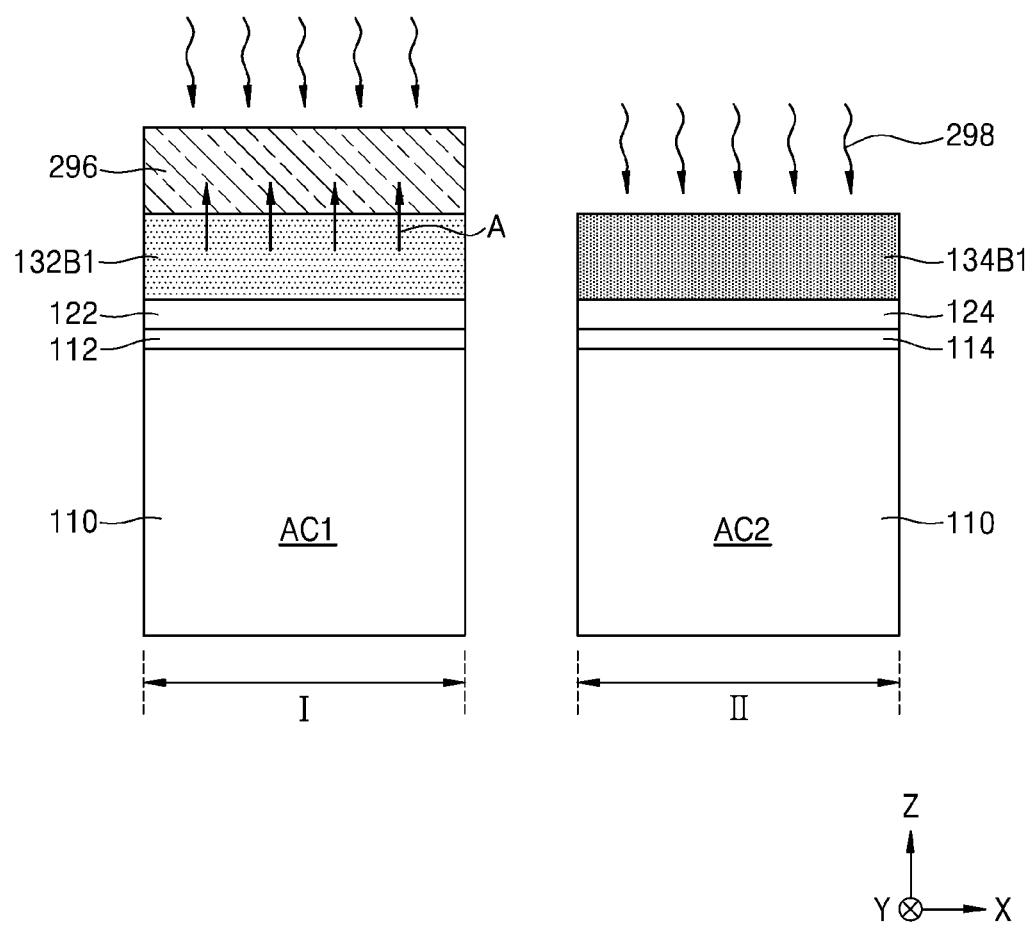
Figure 13C:
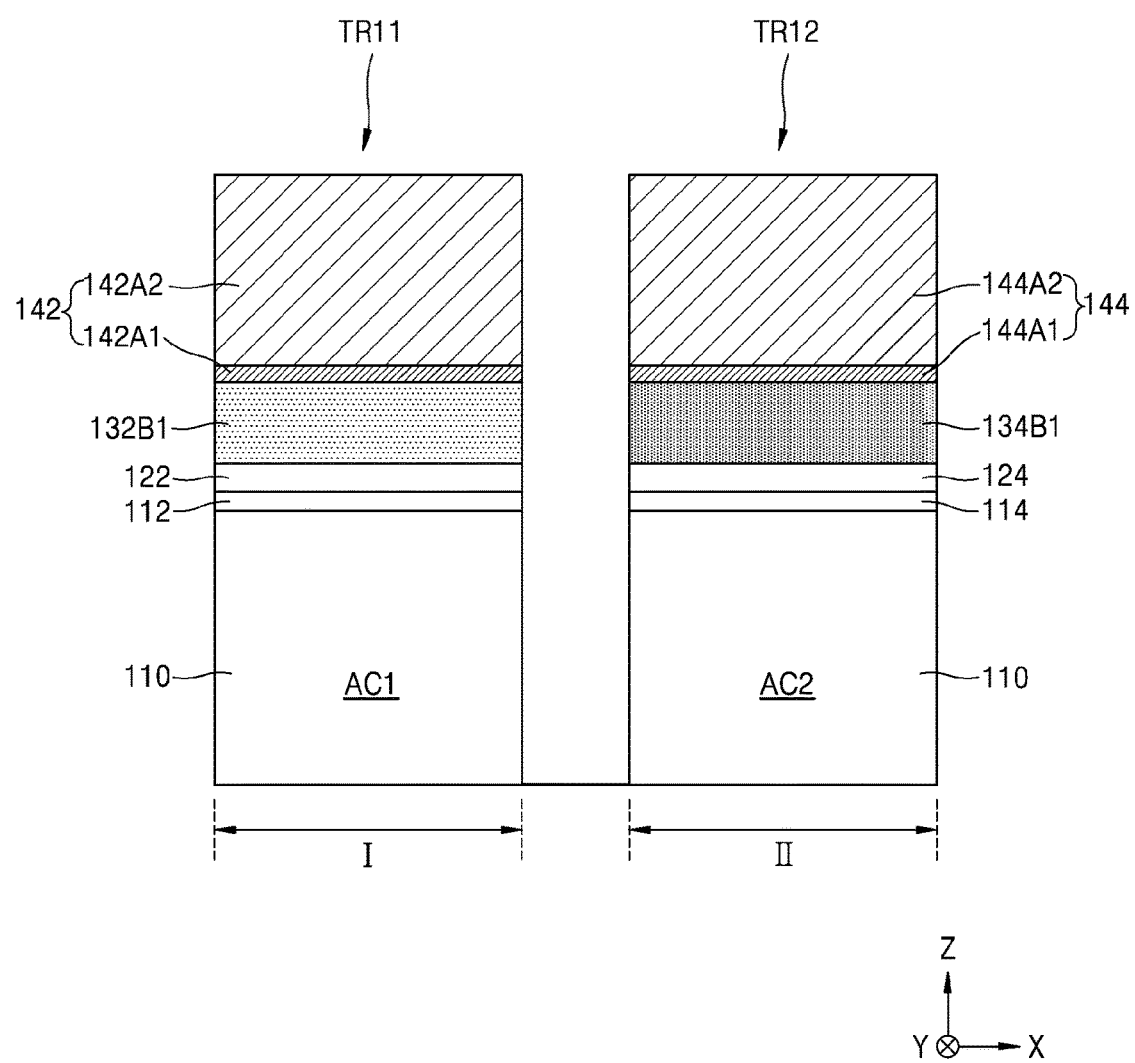

FIGS. 13A through 13C are cross-sectional views for describing a method of manufacturing an integrated circuit device, according to other embodiments. The same reference numerals between FIGS. 1 through 12C and FIGS. 13A through 13C denote the same terms, and thus detailed descriptions thereof are omitted.

Referring to FIG. 13A, in the same manner as described with reference to FIG. 9A, the first interface layer 112 may be formed on the first active area AC1 of the first area I of the substrate 110, and the second interface layer 114 may be formed on the second active area AC2 of the second area II. Thereafter, the preparatory high dielectric layer 120 and the work function adjustment metal containing layer 230 may be sequentially formed on the first interface layer 112 and the second interface layer 114 in the first area I and the second area II. The work function adjustment metal containing layer 230 may include a metal containing layer including oxygen.

Referring to FIG. 13B, an oxygen gettering layer 296 selectively covering only a part of the work function adjustment metal containing layer 230 present in the first area I may be formed, and may perform an annealing process under an inert atmosphere 298. For example, the oxygen gettering layer 296 may be formed to selectively cover only the part of the work function adjustment metal containing layer 230 disposed in the first area I, upon which the annealing process may be performed.

The oxygen gettering layer 296 may act with getter oxygen atoms from peripheral oxygen containing layers and may include a material having a lower chemical coupling energy with oxygen than that of the work function adjustment metal containing layer 230. Thus, oxygen atoms present in the work function adjustment metal containing layer 230 may diffuse in a direction of an arrow A, moving to the oxygen gettering layer 296 in the first area I through the annealing process under the inert atmosphere 298.

In some embodiments, the oxygen gettering layer 296 may include metal, for example, Al, Ti, Mg, Zn, La, Ta, Zr, Cu, or a combination of these. In some other embodiments, the oxygen gettering layer 296 may include a partially oxidized metal oxide layer. For example, the oxygen gettering layer 296 may include TiO, TaO, AlO, or a combination of these. In some embodiments, the oxygen gettering layer 296 may have a thickness ranging from about 1 nm to about 100 nm.

The annealing process under the inert atmosphere 298 may be performed for a period of time ranging from several milliseconds to several seconds, for example, about 1 second to about 10 seconds, at a temperature ranging from about 400° C. to about 1000° C.

While the annealing process is performed under the inert atmosphere 298, oxygen atoms included in the work function adjustment metal containing layer 230 may diffuse to the oxygen gettering layer 296, and thus the first conductive layer 132B1 having a lower oxygen content than that of the work function adjustment metal containing layer 230 before the annealing process may be formed in the first area I. During the annealing process under the inert atmosphere 298, oxygen atoms present in the preparatory high dielectric layer 120 below the work function adjustment metal containing layer 230 may diffuse in the direction of the arrow A in the first area I, and thus the first high dielectric layer 122 having a lower oxygen content than that of the preparatory high dielectric layer 120 before the annealing process may be formed.

Meanwhile, during the annealing process under the inert atmosphere 298, the work function adjustment metal containing layer 230 and the preparatory high dielectric layer 120 present in the second area II may not be substantially changed or altered. As a result, the work function adjustment metal containing layer 230 may remain as the second conductive layer 134B1 having a greater oxygen content than that of the first conductive layer 132B1 in the second area II, and the preparatory high dielectric layer 120 may remain as the second high dielectric layer 124 having a greater oxygen content than that of the first high dielectric layer 122 in the second area II.

Referring to FIG. 13C, after the oxygen gettering layer 296 (see FIG. 13B) is removed, the first upper gate layer 142 may be formed on the first conductive layer 132B1 present in the first area I, and the second upper gate layer 144 may be formed on the second conductive layer 134B1 present in the second area II, thereby forming the first transistor TR11 and the second transistor TR12.

FIGS. 14A through 14D are cross-sectional views for describing a method of manufacturing an integrated circuit device, according to other embodiments. The same reference numerals between FIGS. 1 through 13C and FIGS. 14A through 14D denote the same terms, and thus detailed descriptions thereof are omitted.

Figure 14A:
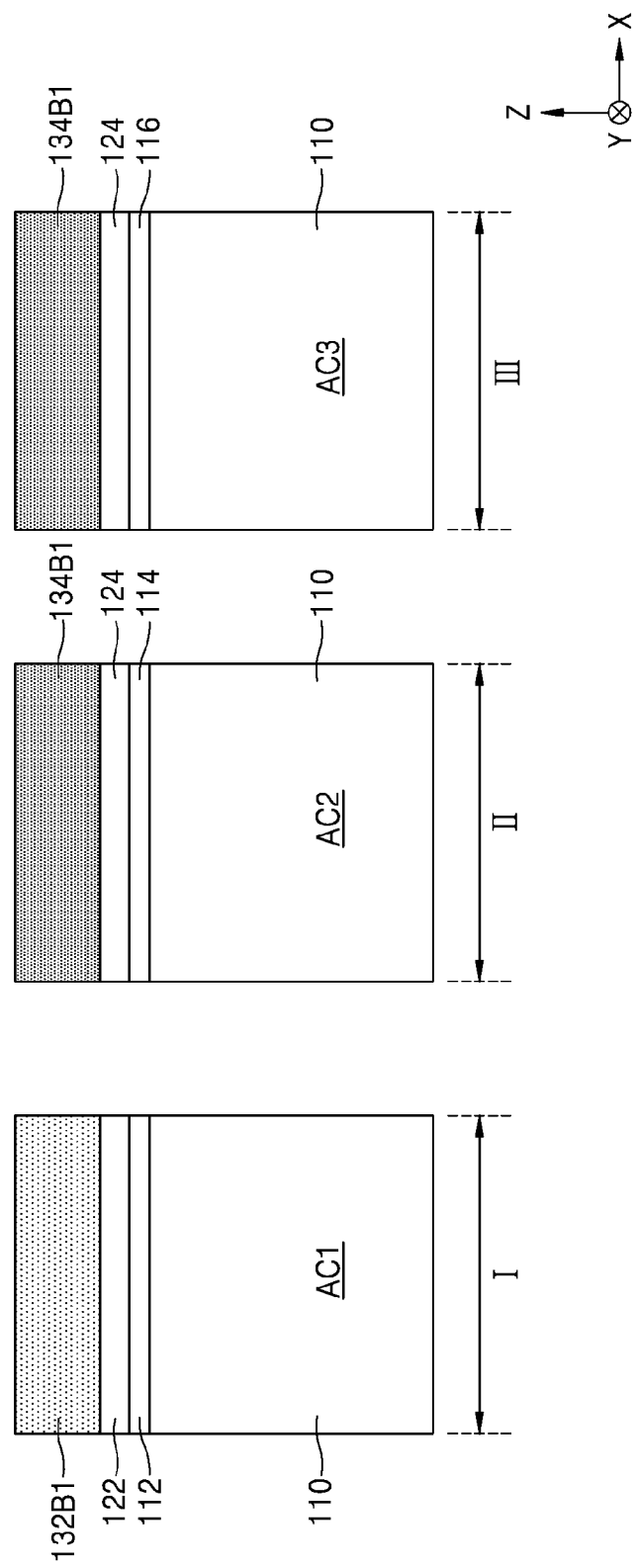

Referring to FIG. 14A, the substrate 110 including the first area I, the second area II, and the third area III may be prepared. Thereafter, in the same manner as described with reference to FIGS. 10A through 10C, a structure in which the first interface layer 112, the first high dielectric layer 122, and the first conductive layer 132B1 are sequentially stacked may be formed on the first active area AC1 of the first area I, and a structure in which the second interface layer 114, the second high dielectric layer 124, and the second conductive layer 134B1 are sequentially stacked may be formed on the second active area AC2 of the second area II. In this regard, the same process as performed in the second area II may be simultaneously performed in the third area III, and thus a structure in which the third interface layer 116, the second high dielectric layer 124, and the second conductive layer 134B1 are sequentially stacked may be formed on the third active area AC3 in the third area III.

Figure 14B:
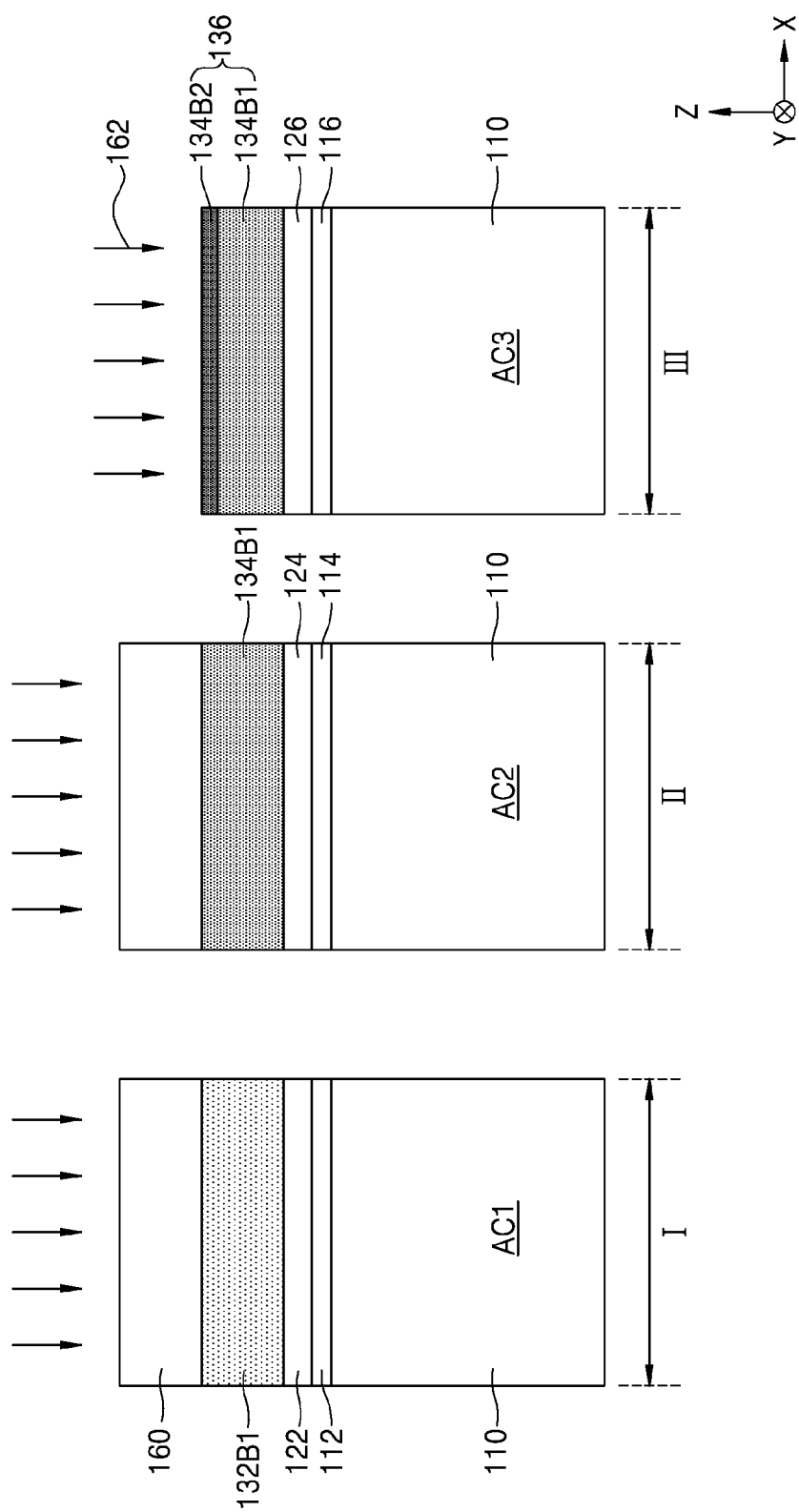

Referring to FIG. 14B, in the same manner as described with reference to FIG. 8B, the mask pattern 160 covering the first conductive layer 132B1 present in the first area I and covering the second conductive layer 134B1 present in the second area II may be formed. The mask pattern 160 may not be formed in the third area III. In a similar manner as described with reference to FIG. 8C, the upper second conductive layer 134B2 may be formed by oxidizing only to a certain depth of an upper surface of the second conductive layer 134B1 exposed to the third area III by using the oxidization atmosphere 162. The upper second conductive layer 134B2 and the second conductive layer 134B1 remaining in the third area III may comprise the third work function adjustment metal containing layer 136.

In the third work function adjustment metal containing layer 136, the upper second conductive layer 134B2 may have a greater oxygen content than that of the second conductive layer 134B1 therebelow.

The oxidization atmosphere 162 may be used to form the upper second conductive layer 134B2 and to perform additional annealing so that oxygen atoms may diffuse from the third work function adjustment metal containing layer 136 to the second high dielectric layer 124 in the third area III. As a result, the third high dielectric layer 126 having a greater oxygen content than that of the second high dielectric layer 124 present in the second area II may be obtained in a lower portion of the third work function adjustment metal containing layer 136 in the third area III.

Referring to FIG. 14C, the first conductive layer 132B1 present in the first area I and the second conductive layer 134B1 present in the second area II may be exposed by removing the mask pattern 160 (see FIG. 14B) covering the first area I and the second area II.

Referring to FIG. 14D, the first upper gate layer 142 may be formed on the first conductive layer 132B1 present in the first area I, the second upper gate layer 144 may be formed on the second conductive layer 134B1 present in the second area II, and the third upper gate layer 146 may be formed on the third work function adjustment metal containing layer 136 in the third area III, thereby forming the first transistor TR11, the second transistor TR12, and the third transistor TR13.

FIGS. 15A through 15F are cross-sectional views for describing a method of manufacturing an integrated circuit device, according to other embodiments. The same reference numerals between FIGS. 1 through 14D and FIGS. 15A through 15F denote the same terms, and thus detailed descriptions thereof are omitted.

Figure 15A:
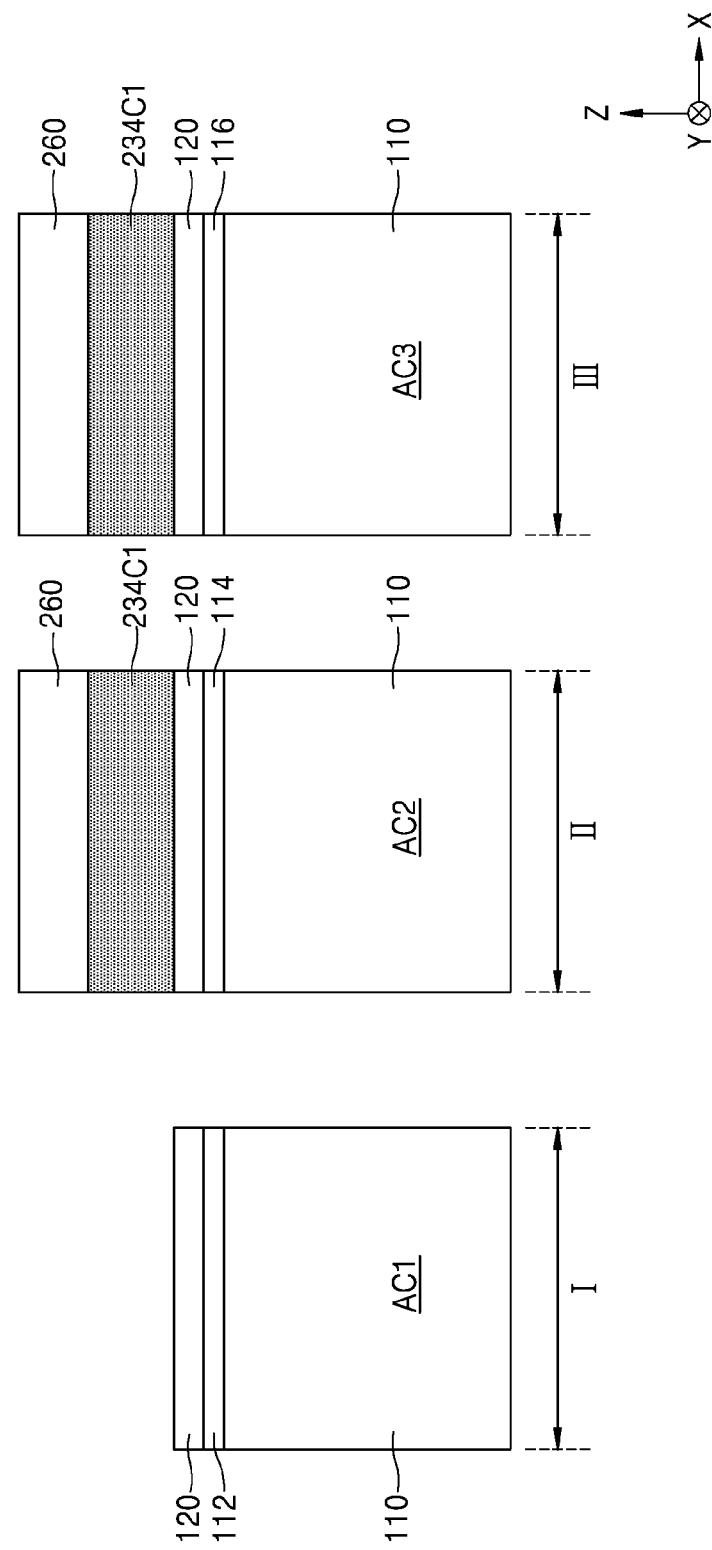

Referring to FIG. 15A, the substrate 110 including the first area I, the second area II, and the third area III may be prepared. Thereafter, in the same manner as described with reference to FIGS. 9A through 9C, a structure in which the first interface layer 112 and the preparatory high dielectric layer 120 are sequentially stacked may be formed on the first active area AC1 of the first area I, and a structure in which the second interface layer 114, the preparatory high dielectric layer 120, the lower second conductive layer 234C1, and the mask pattern 260 are sequentially stacked may be formed on the second active area AC2 of the second area II. In this regard, the same process as performed in the second area II may be simultaneously performed in the third area III, and thus a structure in which the third interface layer 116, the preparatory high dielectric layer 120, the lower second conductive layer 234C1, and the mask pattern 260 are sequentially stacked may be formed on the third active area AC3 in the third area III.

Referring to FIG. 15B, the lower second conductive layer 234C1 may be exposed by removing the mask pattern 260 (see FIG. 15A) from the second area II and the third area III.

Referring to FIG. 15C, in the same manner as described with reference to FIG. 14B, the mask pattern 160 covering the preparatory high dielectric layer 120 present in the first area I and the lower second conductive layer 234C1 present in the second area II may be formed. The mask pattern 160 may not be formed in the third area III. In a similar manner as described with reference to FIG. 8C, only a certain depth of an upper surface of the lower second conductive layer 234C1 exposed in the third area III may be oxidized by using the oxidization atmosphere 162. As a result, a part of the upper surface of the lower second conductive layer 234C1 present in the third area III may be oxidized, and the upper second conductive layer 134B2 may be formed. The upper second conductive layer 134B2 and a remaining part of the lower second conductive layer 234C1 (e.g., the un-oxidized part of the lower second conductive layer 234C1) may comprise the third work function adjustment metal containing layer 236 in the third area III. In the third work function adjustment metal containing layer 236, the upper second conductive layer 134B2 may have a greater oxygen content than that of the lower second conductive layer 234C1 therebelow.

Figure 15D:
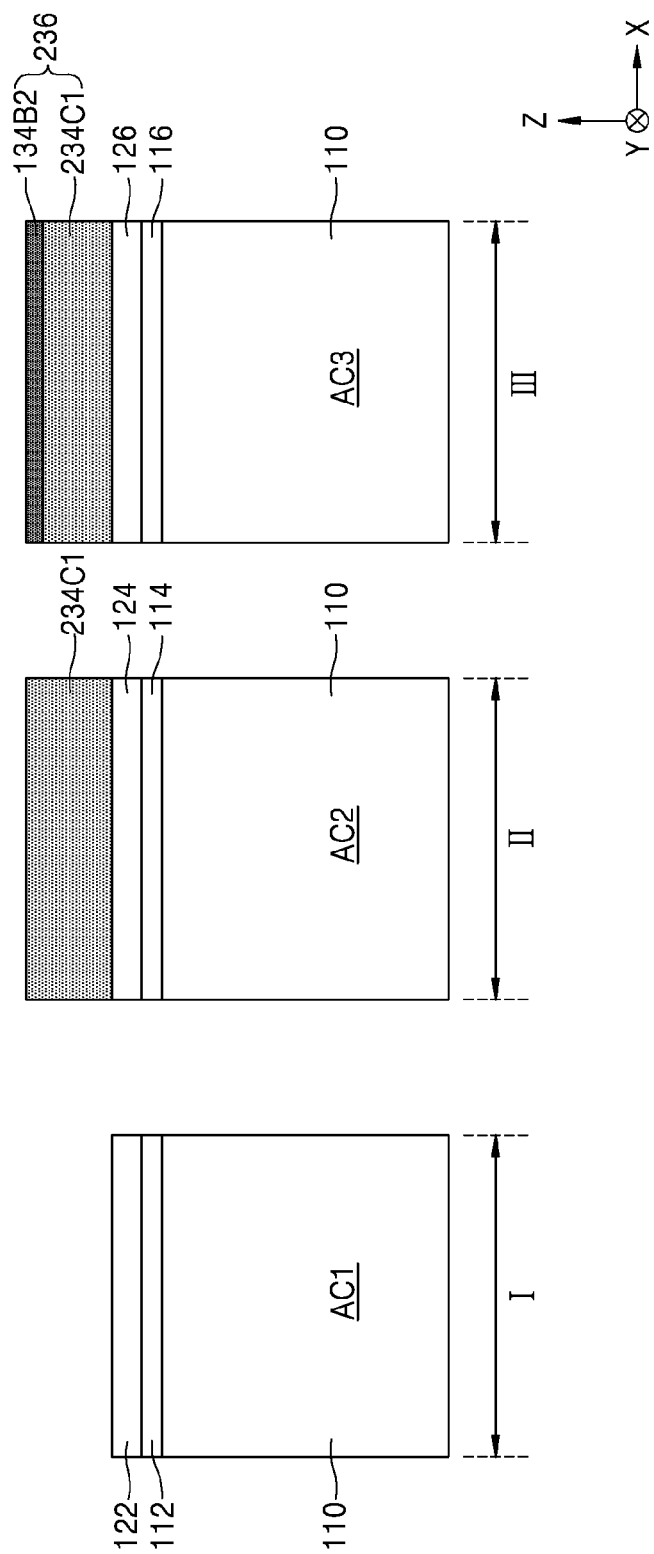

Referring to FIG. 15D, a resultant obtained by removing the mask pattern 160 (see FIG. 15C) may be annealed, and oxygen atoms may diffuse in the second area II from the lower second conductive layer 234C1 to the preparatory high dielectric layer 120, and oxygen atoms may diffuse in the third area III from the third work function adjustment metal containing layer 236 to the preparatory high dielectric layer 120. As a result, the first high dielectric layer 122 present in the first area I, the second high dielectric layer 124 present in the second area II, and the third high dielectric layer 126 present in the third area III may be obtained from the preparatory high dielectric layer 120.

Figure 15E:
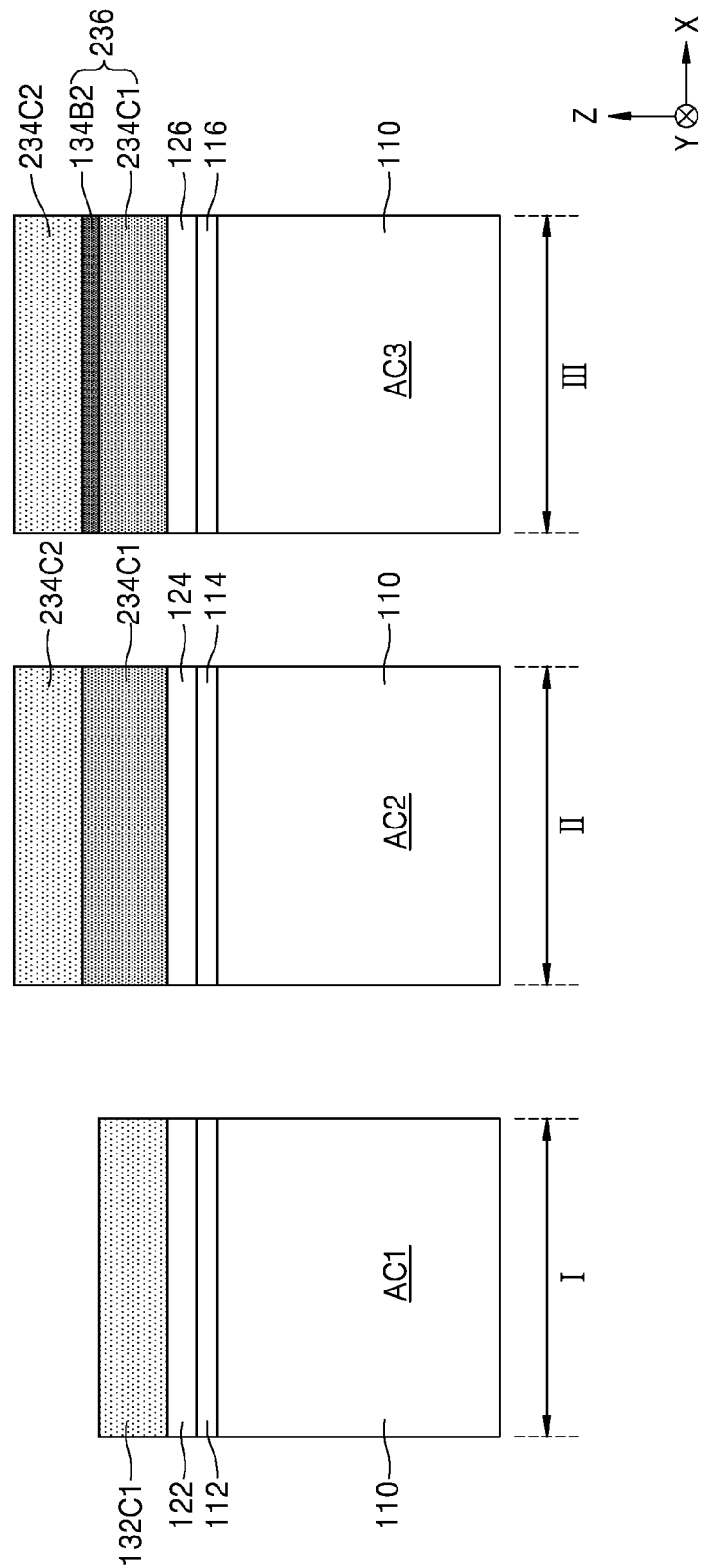

Referring to FIG. 15E, in a similar way to the method of forming the conductive layers 132C1 and 234C2 described with reference to FIG. 9D, the conductive layers 132C1 and 234C2 may be formed in an upper portion of the first high dielectric layer 122 present in the first area I, an upper portion of the lower second conductive layer 234C1 present in the second area II, and an upper portion of the third work function adjustment metal containing layer 236 present in the third area III.

Referring to FIG. 15F, in a similar manner as described with reference to FIG. 9E, the first upper gate layer 142, the second upper gate layer 144, and the third upper gate layer 146 may be respectively formed on the conductive layers 132C1, 234C1, and 234C2 present in the first area I, the second area II, and the third area III, thereby forming the first transistor TR21, the second transistor TR22, and the third transistor TR23.

The examples of methods of forming integrated circuit devices according to the disclosed embodiments are described with reference to FIGS. 8A through 15F above, but the methods of forming integrated circuit devices are not limited to these examples. Integrated circuit devices having various structures may be manufactured from the examples of the methods of forming integrated circuit devices through various modifications and changes without departing from the spirit and scope of the disclosure.

Figure 16A:
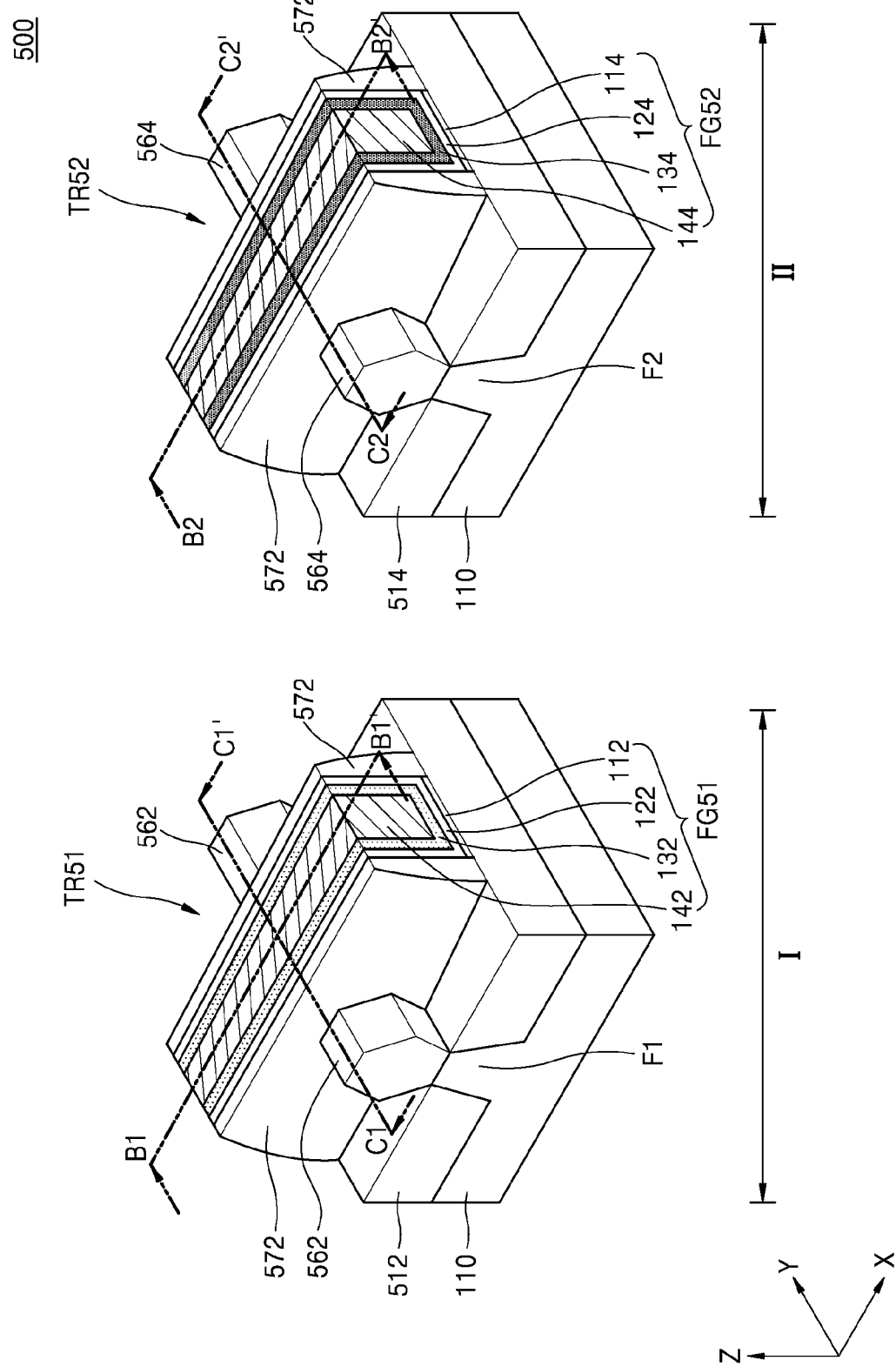
FIGS. 16A through 16C are diagrams for describing an integrated circuit device, according to exemplary embodiments, where
Figure 16B:
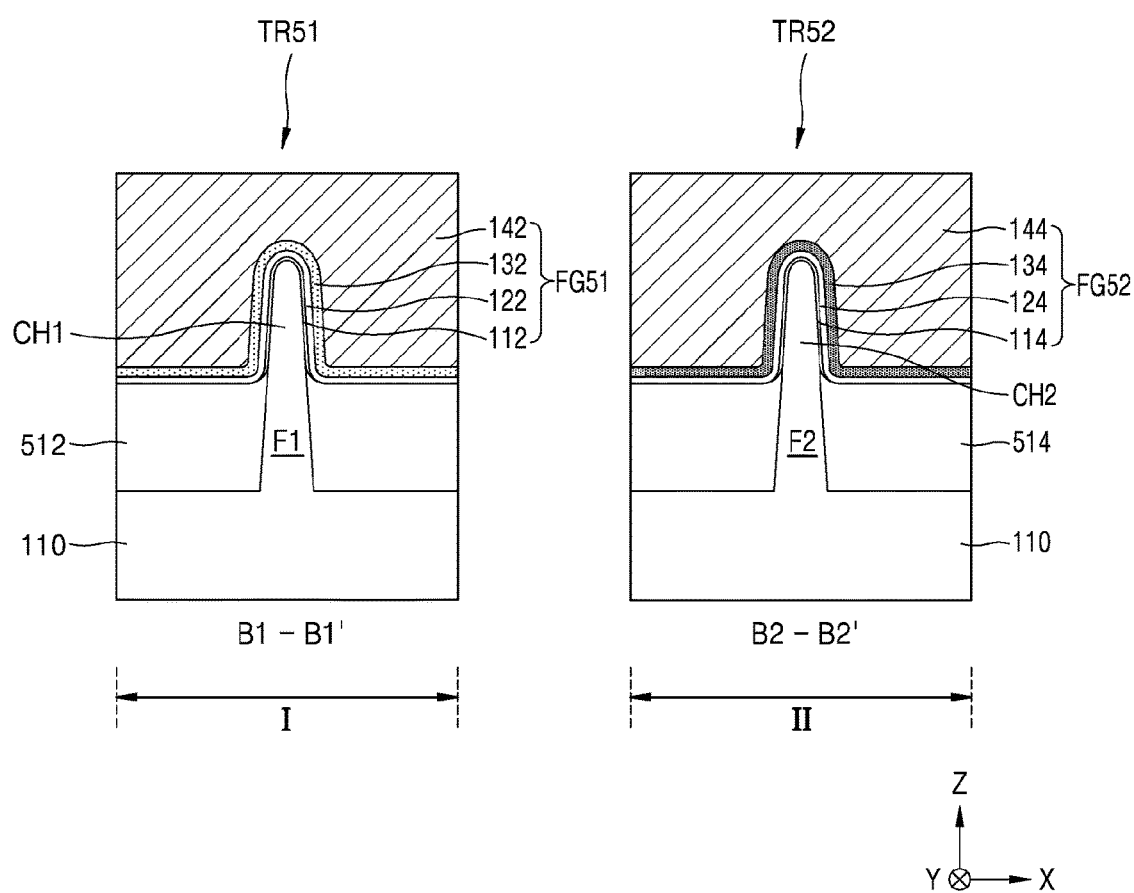
Figure 16C:
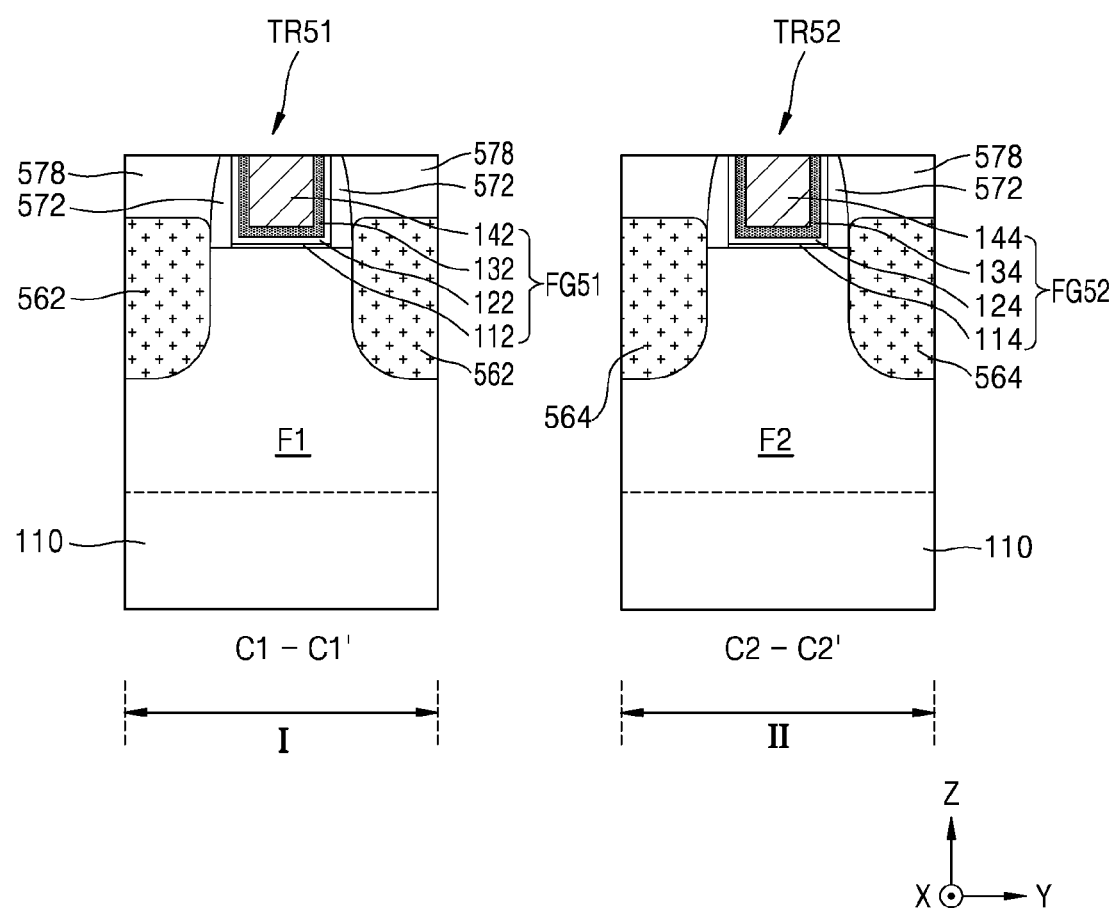

FIGS. 16A through 16C are diagrams for describing an integrated circuit device 500, according to embodiments, where FIG. 16A is a perspective view illustrating main components of the integrated circuit device 500 including a first transistor TR51 and a second transistor TR52 having a FinFET structure, FIG. 16B is a cross-sectional view of the integrated circuit device 500 taken along lines B1-B1' and B2-B2' of FIG. 16A, and FIG. 16C is a cross-sectional view of the integrated circuit device 500 taken along lines C1-C1' and C2-C2' of FIG. 16A. The same reference numerals between FIG. 1 and FIGS. 16A through 16C denote the same terms, and thus detailed descriptions thereof are omitted.

The integrated circuit device 500 may include a first fin-type active area F1 and a second fin-type active area F2 that protrude in a direction (Z direction) perpendicular to a main surface of the substrate 110 from the respective first area I and the second area II of the substrate 110.

The first fin-type active area F1 and the second fin-type active area F2 may extend along one direction (Y-direction in FIGS. 16A through 16C). A first device isolation layer 512 and a second device isolation layer 514 that cover lower side walls of the first fin-type active area F1 and the second fin-type active area F2, respectively, may be formed on the substrate 110 in the respective first area I and the second area II. The first fin-type active area F1 may protrude in a fin shape from the first device isolation layer 512. The second fin-type active area F2 may protrude in the fin shape from the second device isolation layer 514.

The first fin-type active area F1 and the second fin-type active area F2 may respectively include a first channel area CH1 and a second channel area CH2 in their respective upper portions.

In some embodiments, the first fin-type active area F1 and the second fin-type active area F2 may include single materials. For example, all areas of the first fin-type active area F1 and the second fin-type active area F2 including the first channel area CH1 and the second channel area CH2 may include Si. In some other embodiments, the first fin-type active area F1 and the second fin-type active area F2 may respectively include an area including Ge and an area including Si.

The first device isolation layer 512 and the second device isolation layer 514 may include a silicon containing insulating layer such as a silicon oxide layer, a silicon nitride layer, a silicon oxynitride layer, and a silicon tantalum carbonitride film, polysilicon, or a combination thereof.

In the first area I, a first gate structure FG51 in which the first interface layer 112, the first high dielectric layer 122, the first work function adjustment metal containing structure 132, and the first upper gate layer 142 are sequentially stacked on the first fin-type active area F1 may extend in a direction (X-direction in FIGS. 16A through 16C) perpendicular to and crossing the direction (Y-direction in FIGS. 16A through 16C) in which the first fin-type active area F1 extends. The first transistor TR51 may be formed in a part where the first fin-type active area F1 and the first gate structure FG51 cross each other.

In the second area II, a second gate structure FG52 in which the second interface layer 114, the second high dielectric layer 124, the second work function adjustment metal containing structure 134, and the second upper gate layer 144 are sequentially stacked on the second fin-type active area F2 may extend in a direction (X-direction in FIGS. 16A through 16C) perpendicular to and crossing the direction (Y-direction in FIGS. 16A through 16C) in which the second fin-type active area F2 extends. The second transistor TR52 may be formed in a part where the second fin-type active area F2 and the second gate structure FG52 cross each other.

A pair of first source and drain areas 562 may be formed on both sides of the first gate structure FG51 in the first fin-type active area F1. A pair of second source and drain areas 564 may be formed on both sides of the second gate structure FG52 in the second fin-type active area F2.

The first and second source and drain areas 562 and 564 may include semiconductor layers epitaxially grown from the first fin-type active area F1 and the second fin-type active area F2, respectively. The first and second source and drain areas 562 and 564 may have an embedded SiGe structure including a plurality of SiGe layers that are epitaxially grown, a Si layer that is epitaxially grown, or a SiC layer that is epitaxially grown.

Although FIGS. 16A and 16C show examples where the first and second source and drain areas 562 and 564 have specific shapes, cross-sections of the first and second source and drain areas 562 and 564 are not limited to the examples shown in FIGS. 16A and 16C, and the first and second source and drain areas 562 and 564 may have various shapes.

The first transistor TR51 and the second transistor TR52 may include MOS transistors of a three-dimensional (3D) structure in which channels are formed in upper surfaces and both side surfaces of the first fin-type active area F1 and the second fin-type active area F2, respectively. The MOS transistor may be an NMOS transistor or a PMOS transistor.

In the first area I and the second area II, insulating spacers 572 may be formed in both sides of the first gate structure FG51 and the second gate structure FG52. As shown in FIG. 16C, insulating layers 578 covering the insulating spacers 572 may be formed in opposite sides of the first gate structure FG51 and the second gate structure FG52 in relation to the insulating spacers 572. For example, insulating layers 578 may be formed to cover surfaces of the insulating spacers 572 of the first gate structure FG51, and insulating layers 578 may be formed to cover surfaces of the insulating spacers 572 of the second gate structure FG52.

The insulating spacers 572 may include a single layer or multilayers. In some embodiments, the insulating spacers 572 may include a silicon nitride layer, a silicon oxynitride layer, a carbon containing silicon oxynitride layer, a SiOCN layer, or a combination thereof. The insulating spacers 572 may have a multilayer structure including insulating layers of an I-shaped cross-section, insulating layers of an L-shaped cross-section, or a combination of these.

The insulating layers 578 may include silicon oxide layers but the examples are not limited thereto.

In the integrated circuit device 500, the first gate structure FG51 of the first transistor TR51, like the first transistor TR11 shown in FIG. 1, may have a stack structure including the first interface layer 112, the first high dielectric layer 122, and the first gate stack GS11, and the first gate stack GS11 may include the first work function adjustment metal containing structure 132 and the first upper gate layer 142. The second gate structure FG52 of the second transistor TR52, like the second transistor TR12 shown in FIG. 1, may include the second interface layer 114, the second high dielectric layer 124, and the second gate stack GS12, and the second gate stack GS12 may include the second work function adjustment metal containing structure 134 and the second upper gate layer 144. However, the concepts is not limited to the examples shown in FIGS. 16A through 16C. For example, the first gate structure FG51 and the second gate structure FG52 of the integrated circuit device 500 may have the same stack structures as the various gate structures described with reference to any of the embodiments of FIGS. 1 through 15F or variations thereof without departing from the spirit and scope of the disclosure.

Figure 17A:
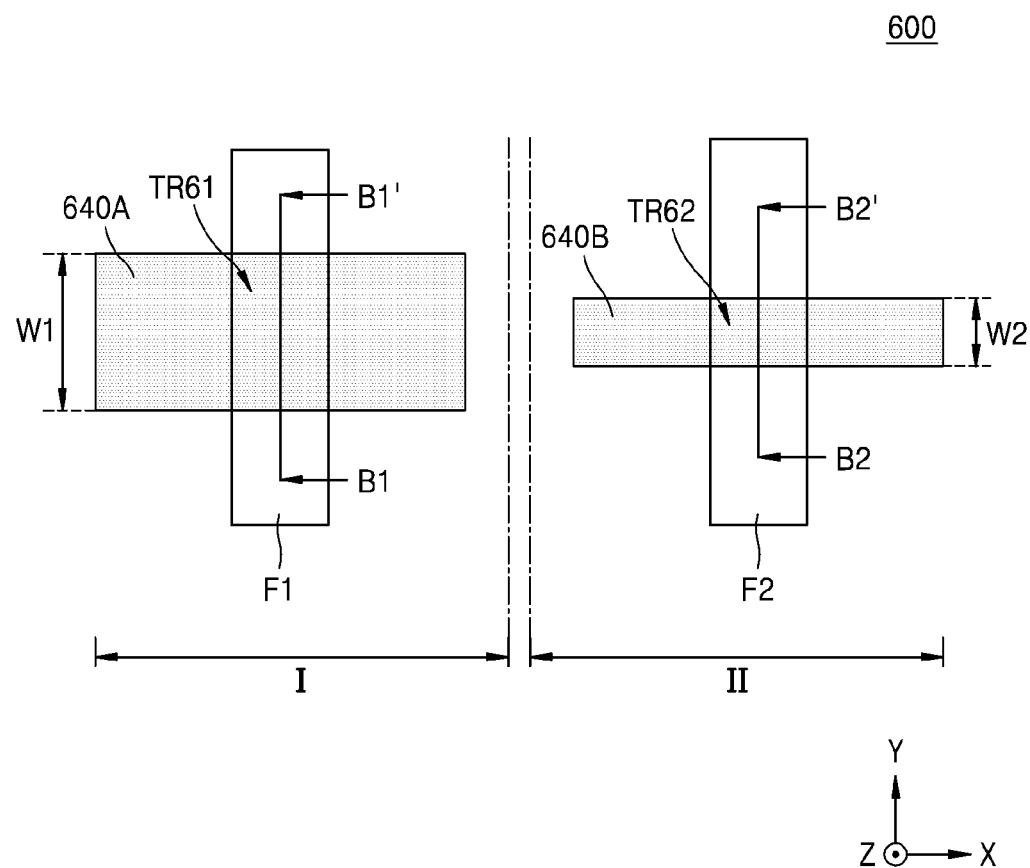
FIGS. 17A and 17B are diagrams for describing an integrated circuit device, according to exemplary embodiments, where
Figure 17B:
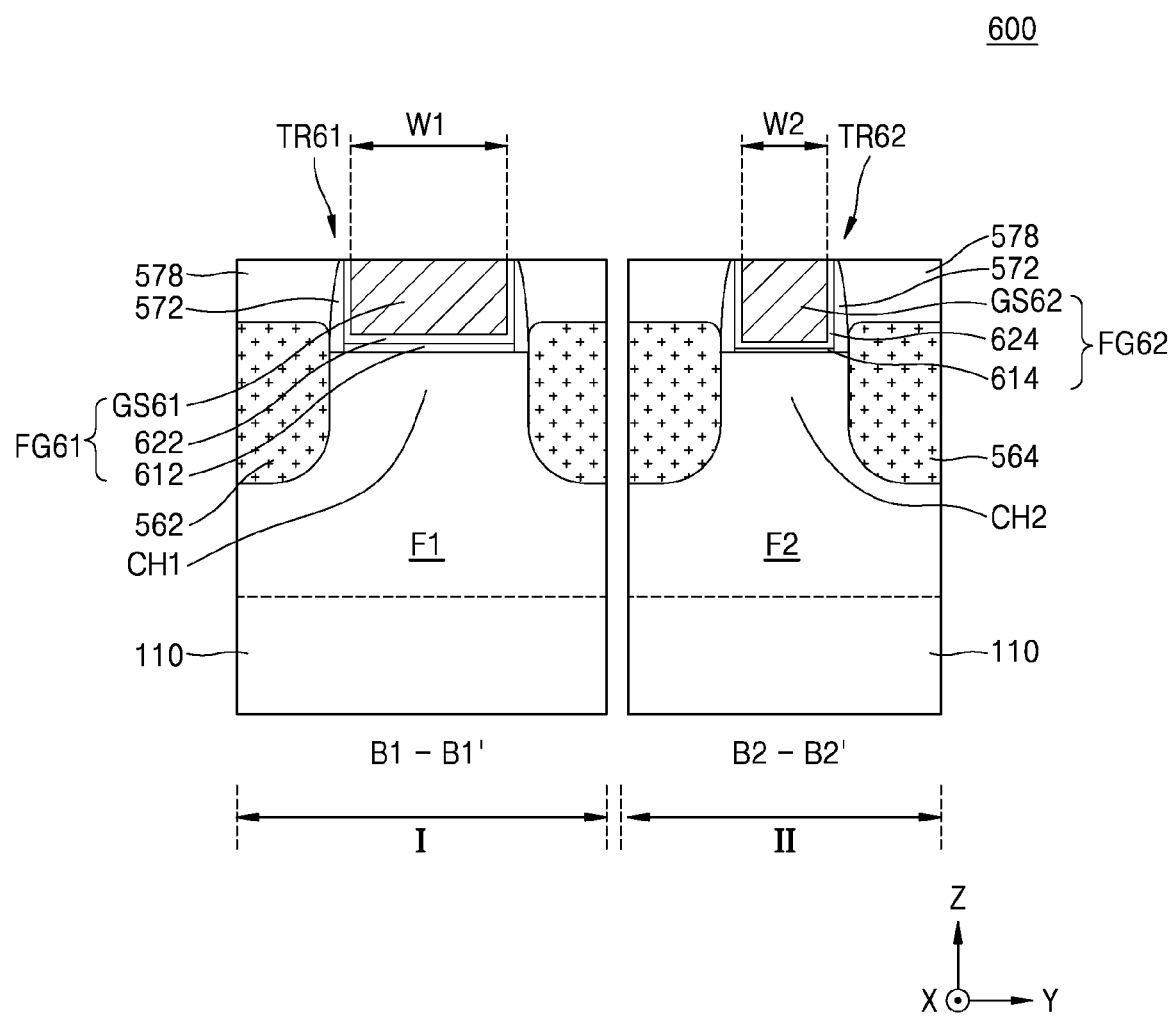

FIGS. 17A and 17B are diagrams for describing an integrated circuit device 600, according to embodiments, where FIG. 17A is a plan layout diagram of the integrated circuit device 600 including a first transistor TR61 and a second transistor TR62 having a FinFET structure and FIG. 17B is a cross-sectional view of the integrated circuit device 600 taken along lines B1-B1' and B2-B2' of FIG. 17A. The same reference numerals between FIGS. 1 through 16C and FIGS. 17A and 17B denote the same terms, and thus detailed descriptions thereof are omitted.

Referring to FIGS. 17A and 17B, the integrated circuit device 600 may include the first transistor TR61 and the second transistor TR62 having the FinFET structure in the respective first area I and the second area II of the substrate 110.

The first area I and the second area II of the integrated circuit device 600 may be areas performing different functions. In some embodiments, in the integrated circuit device 600, the first area I may be an area in which devices operating at a high power mode are formed, and the second area II may be an area in which devices operating at a low power mode are formed. For example, in the integrated circuit device 600, the first area I may be an area in which a peripheral circuit is formed as an input and output circuit device, and the second area II may be an area in which a memory device or a logic cell is formed.

A first gate line 640A may extend on the first fin-type active area F1 to cross the first fin-type active area F1 in the first area I. The first transistor TR61 may be formed at a point where the first fin-type active area F1 and the first gate line 640A cross each other. A second gate line 640B may extend on the second fin-type active area F2 to cross the second fin-type active area F2 in the second area II. The second transistor TR62 may be formed at a point where the second fin-type active area F2 and the second gate line 640B cross each other. A first width W1 of the first gate line 640A along a length direction (e.g., Y-direction) of the first fin-type active area F1 may be greater than a second width W2 of the second gate line 640B along a length direction (e.g., Y-direction) of the second fin-type active area F2. In some embodiments, the first gate line 640A and the second gate line 640B may be parallel to one another and perpendicular to the respective first fin-type active area F1 and second fin-type active area F2.

The first transistor TR61 and the second transistor TR62 may be configured as PMOS transistors or NMOS transistors.

FIG. 17A shows one first fin-type active area F1 and one second fin-type active area F2 and one first gate line 640A and one second gate line 640B in the first area I and the second area II, respectively, but numbers of the first and second fin-type active areas F1 and F2 and the first and second gate lines 640A and 640B are not limited thereto. A plurality of fin-type active areas and a plurality of gate lines may be formed to cross each other in the first area I and the second area II.

In the integrated circuit device 600, the first transistor TR61 formed in the first area I may include a first gate structure FG61 including the first fin-type active area F1 protruding from the substrate 110, the first interface layer 612 sequentially covering an upper surface and both side walls of the first channel area CH1 of the first fin-type active area F1, the first high dielectric layer 622, and the first gate stack GS61. The second transistor TR62 formed in the second area II may include a second gate structure FG62 including the second fin-type active area F2 protruding from the substrate 110, the second interface layer 614 sequentially covering an upper surface and both side walls of the second channel area CH2 of the second fin-type active area F2, the second high dielectric layer 624, and the second gate stack GS62.

In the integrated circuit device 600 described with reference to FIGS. 17A and 17B, the first gate structure FG61 of the first transistor TR61 and the second gate structure FG62 of the second transistor TR62 may have the same stack structures as the various gate structures described with reference to FIGS. 1 through 15F and variations thereof without departing from the spirit and scope of the disclosed embodiments.

FIGS. 18A through 18E are cross-sectional views for describing a method of manufacturing the integrated circuit device 500, according to embodiments. The method of manufacturing the integrated circuit device 500 shown in FIGS. 16A through 16C will now be described with reference to FIGS. 18A through 18E. The same reference numerals between FIGS. 1 to 17B and FIGS. 18A through 18E denote the same terms, and thus detailed descriptions thereof are omitted.

Figure 18A:
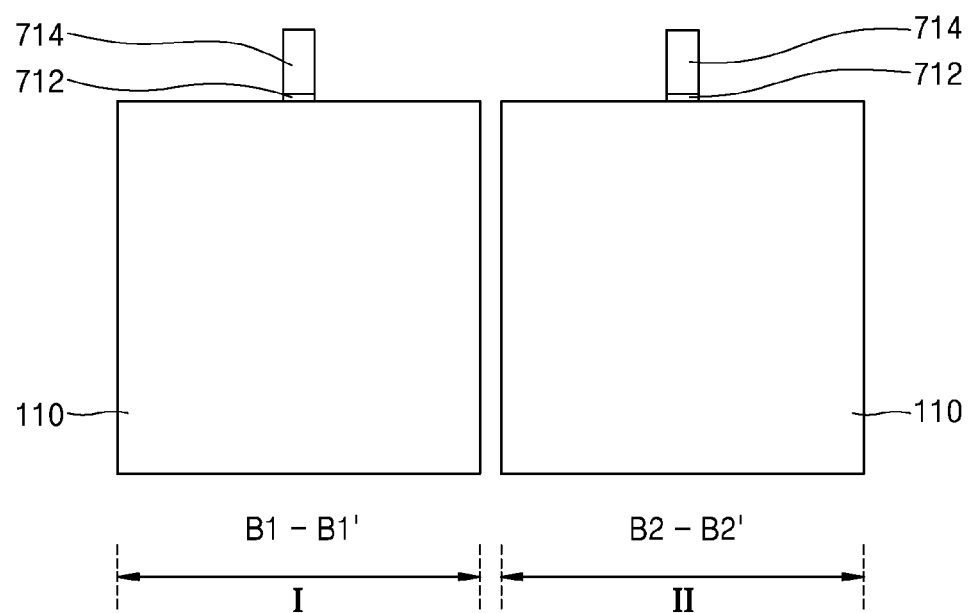
FIGS. 18A through 18E are cross-sectional views for describing a method of manufacturing an integrated circuit device including transistors having a FinFET structure, according to exemplary embodiments.

Referring to FIG. 18A, the substrate 110 including the first area I and the second area II may be prepared. A plurality of pad oxide layer patterns 712 and a plurality of mask patterns 714 may be formed on both the first area I and the second area II of the substrate 110.

The plurality of pad oxide layer patterns 712 and the plurality of mask patterns 714 may extend in parallel with each other along one direction (e.g., Y-direction) on the substrate 110. In some embodiments, the plurality of pad oxide layer patterns 712 may include oxide layers obtained by thermally oxidizing a surface of the substrate 110. The plurality of mask patterns 714 may include a silicon nitride layer, a silicon oxide nitride layer, a spin on gate (SOG) layer, a spin on hardmask (SOH) layer, a photoresist layer, or a combination of these, but they are not limited to these examples.

Figure 18B:
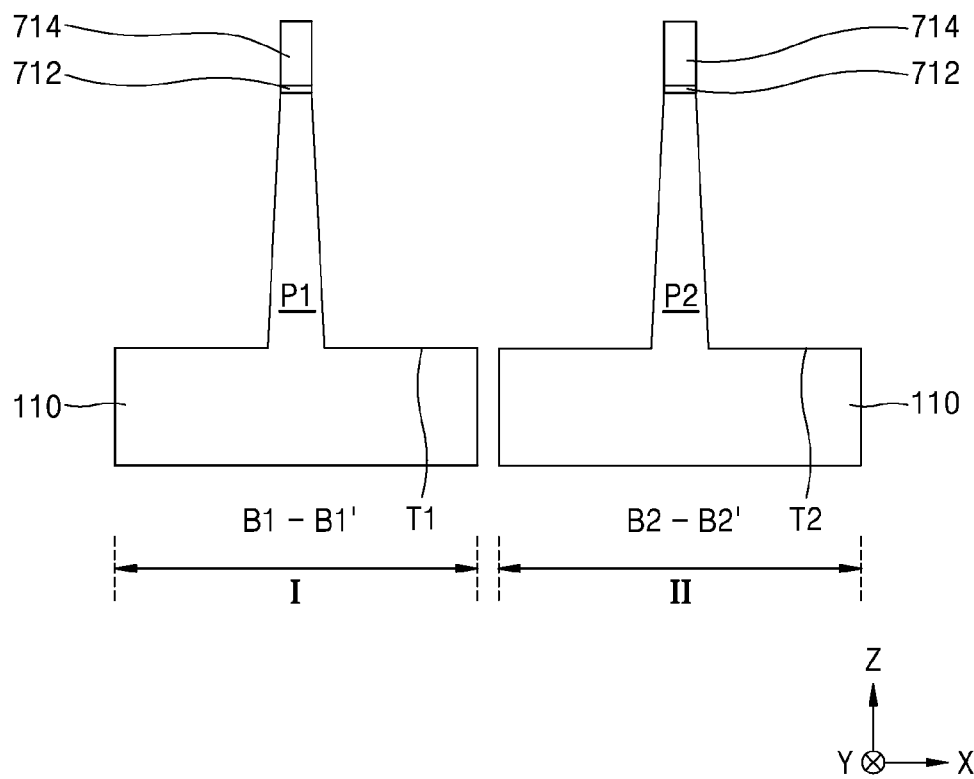

Referring to FIG. 18B, a part of the substrate 110 may be etched by using the plurality of mask patterns 714 as an etch mask so that a plurality of first trenches T1 may be formed in the first area I of the substrate 110 and a plurality of second trenches T2 may be formed in the second area II of the substrate 110. As a result of the formation of the plurality of first and second trenches T1 and T2, there may be obtained a plurality of first and second preparatory fin-type active areas P1 and P2 protruding upward from the substrate 110 along a first direction (e.g., Z-direction) perpendicular to a main surface of the substrate 110 and extending in a second direction orthogonal to the first direction (e.g., Y-direction).

Figure 18C:
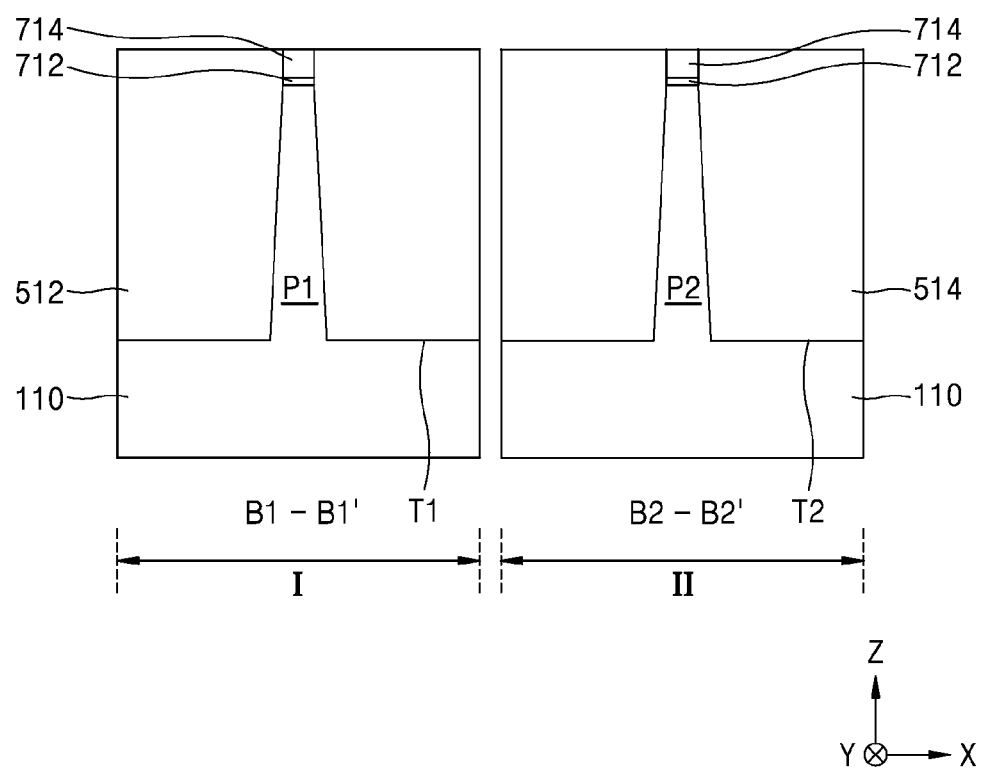

Referring to FIG. 18C, the first device isolation layer 512 and the second device isolation layer 514 respectively filling the plurality of first and second trenches T1 and T2 may be formed in the respective first area I and the second area II to cover exposed surfaces of the plurality of first and second preparatory fin-type active areas P1 and P2. For example, the first device isolation layer 512 may cover opposing side surfaces of the plurality of first preparatory fin-type active areas P1, and the second device isolation layer 514 may cover opposing side surfaces of the plurality of second preparatory fin-type active areas P2.

To form the first device isolation layer 512 and the second device isolation layer 514, a plasma-enhanced chemical vapour deposition (PECVD) process, a high density plasma CVD (HDP CVD) process, an inductively coupled plasma CVD (ICP CVD) process, a capacitor coupled plasma CVD (CCP CVD) process, a flowable chemical vapour deposition (FCVD) process, and/or a spin coating process may be used but the examples are not limited to those.

After the first device isolation layer 512 and the second device isolation layer 514 are formed, upper surfaces of the plurality of mask patterns 714 may be planarized in order to expose the plurality of mask patterns 714. In this regard, some of the plurality of mask patterns 714 may be consumed so that heights of the plurality of mask patterns 714 may be reduced.

Figure 18D:
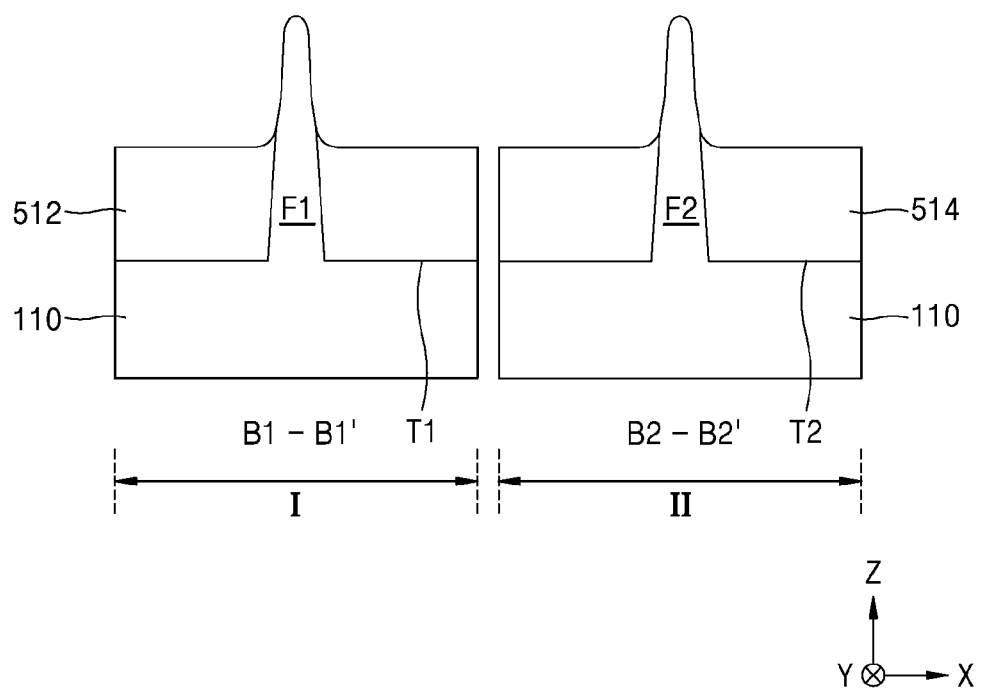

Referring to FIG. 18D, the plurality of mask patterns 714 and the plurality of pad oxide layer patterns 712 (see FIG. 18C) may be removed in order to expose upper surfaces and upper side walls of the plurality of first and second preparatory fin-type active areas P1 and P2 (see FIG. 18C), and then a recess process may be performed to partially remove the first device isolation layer 512 and the second device isolation layer 514.

As a result, heights of upper surfaces of the first device isolation layer 512 and the second device isolation layer 514 may be reduced in the first area I and the second area II, and upper portions of the plurality of first and second preparatory fin-type active areas P1 and P2 may be exposed by protruding upward from the first device isolation layer 512 and the second device isolation layer 514.

To perform the recess process, a dry etch process, a wet etch process, or an etch process combining the dry and wet processes may be used.

When the plurality of mask patterns 714 includes silicon nitride layers, a wet etch process using, for example, $H_3PO_4$, may be performed to remove the plurality of mask patterns 714. A wet etch process using, for example, diluted HF (DHF), may be performed to remove the plurality of pad oxide layer patterns 712.

For the recess process of the first device isolation layer 512 and the second device isolation layer 514, a wet etch process using HF, $NH_4OH$, tetramethyl ammonium hydroxide (TMAH), potassium hydroxide (KOH) solution, etc. as an etchant, or a dry etch process such as inductively coupled plasma (ICP), transformer coupled plasma (TCP), electron cyclotron resonance (ECR), reactive ion etch (RIE), etc. may be used. When the recess process of the first device isolation layer 512 and the second device isolation layer 514 is performed using dry etch, fluorine containing gas such as $CF_4$, etc., chlorine containing gas such as $Cl_2$, etc., HBr, may be used but the embodiments are not limited to these examples.

During the recess process, upper portions of the plurality of first and second preparatory fin-type active areas P1 and P2 exposed in the first area I and the second area II, respectively, may be exposed in an etch atmosphere such as plasma, and the plurality of first and second preparatory fin-type active areas P1 and P2 may be partially consumed in an etch atmosphere for the recess process or in a subsequent cleaning atmosphere, thereby obtaining the plurality of first and second preparatory fin-type active areas P1 and P2 having upper areas of a smaller width than that of lower areas covered by the first device isolation layer 512 and the second device isolation layer 514. For example, the width of the plurality of first and second preparatory fin-type active areas P1 and P2 may decrease or narrow as the plurality of first and second preparatory fin-type active areas P1 and P2 protrude in a direction away from the substrate 110 (i.e., Z-direction).

In some embodiments, an impurity ion injection process for adjusting a threshold voltage may be performed on the upper portions of the plurality of first and second preparatory fin-type active areas P1 and P2 in the first area I and the second area II. During the impurity ion injection process for adjusting the threshold voltage, boron (B) ions may be injected, as impurities, into an area among the first area I and the second area II in which an NMOS transistor is formed, and phosphorus (P) or arsenic (As) ions may be injected, as impurities, into an area among the first area I and the second area II in which a PMOS transistor is formed.

The plurality of first and second preparatory fin-type active areas P1 and P2 are formed into a plurality of first and second fin-type active areas F1 and F2, respectively.

Figure 18E:
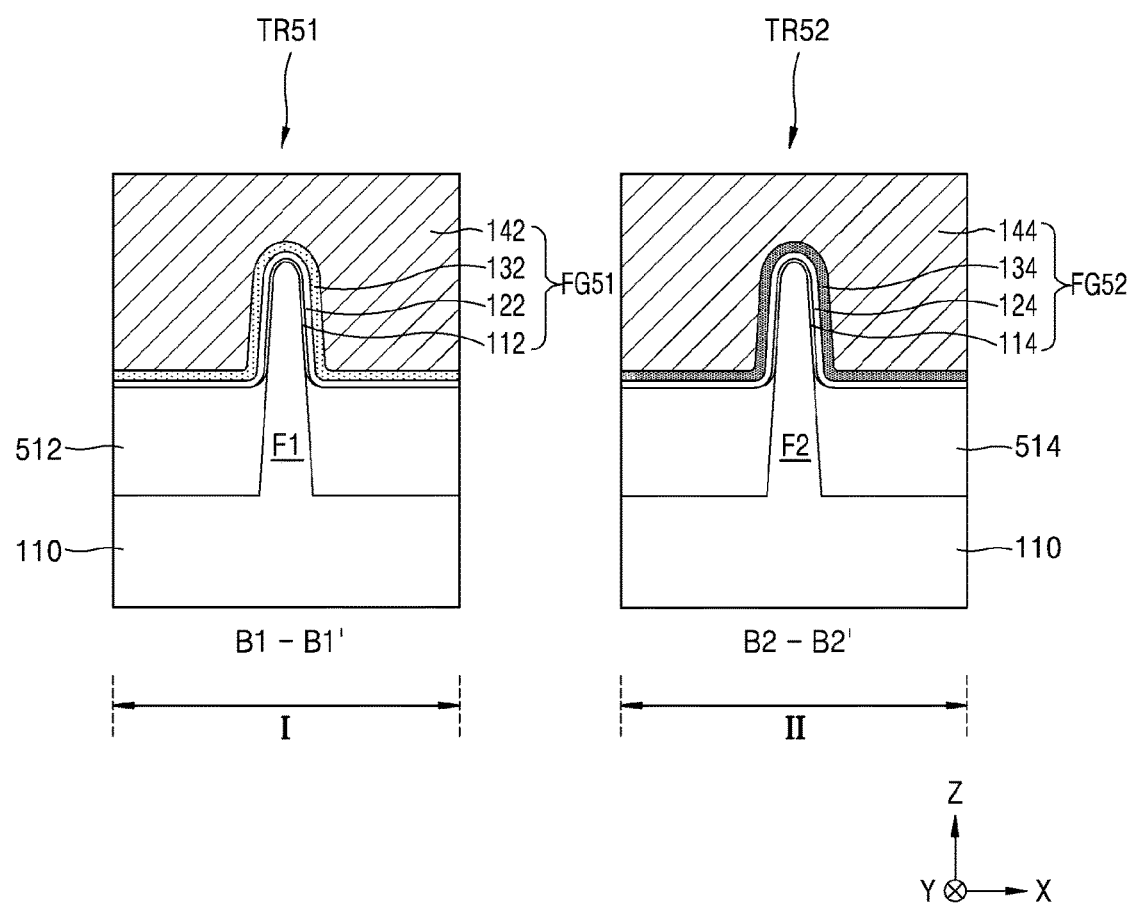

Referring to FIG. 18E, the first gate structure FG51 and the second gate structure FG52 covering the upper portions of the plurality of first and second fin-type active areas F1 and F2, respectively, may be formed in the first area I and the second area II, and the first transistor TR51 and the second transistor TR52 may be formed.

To form the first gate structure FG51 and the second gate structure FG52, gate structures having various structures may be formed using various processes described with reference to FIGS. 1 through 15F.

Integrated circuit devices including FinFETs having a channel of a 3D structure and methods of manufacturing the integrated circuit devices are described with reference to FIGS. 18A through 18E but the embodiments are not limited thereto. For example, it will be obvious to one of ordinary skill in the art that integrated circuit devices including planar MOSFETs having characteristics of the disclosed embodiments and methods of manufacturing the integrated circuit devices may be provided through various modifications and changes.

Figure 19:
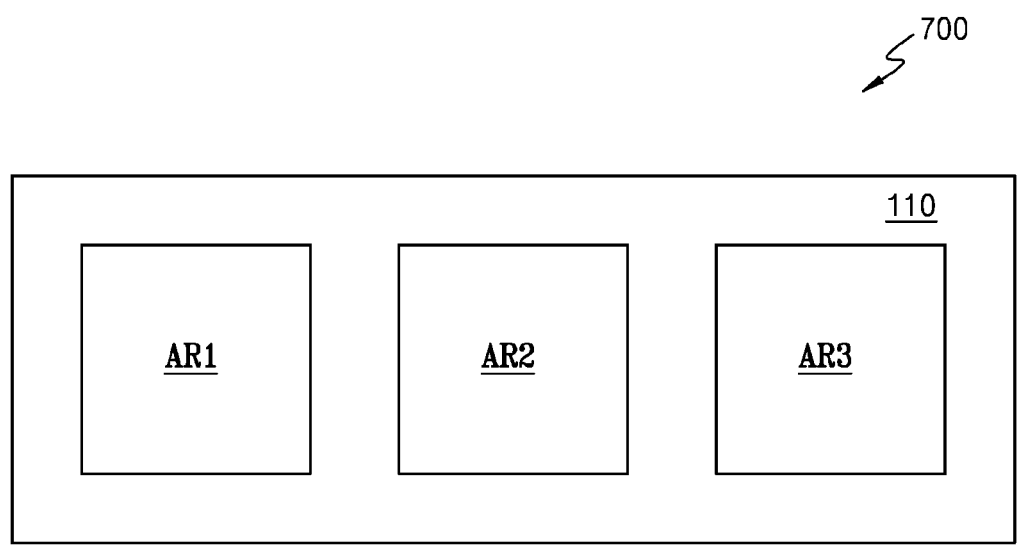
FIG. 19 is a block diagram of an integrated circuit device according to exemplary embodiments.

FIG. 19 is a block diagram of an electronic device 700 according to embodiments.

Referring to FIG. 19, the electronic device 700 may include a first area AR1, a second area AR2, and a third area AR3.

The first area AR1, the second area AR2, and the third area AR3 of the substrate 110 may refer to different areas.

In some embodiments, the first area AR1, the second area AR2, and the third area AR3 may be areas requiring different threshold voltages. As an example, the first area AR1 may be an NMOS transistor area, and the second area AR2 and the third area AR3 may be PMOS transistor areas. As another example, the first area AR1 and the second area AR2 may be NMOS transistor areas, and the third area AR3 may be a PMOS transistor area.

In some other embodiments, the first area AR1, the second area AR2, and the third area AR3 may be areas performing different functions. The first area AR1, the second area AR2, and the third area AR3 may be areas spaced apart from each other in an X- or Y-direction and/or first area AR1, the second area AR2, and the third area AR3 may be connected to each other.

In some embodiments, the first area AR1, the second area AR2, and the third area AR3 may be NMOS transistors areas. In this case, the first area AR1 may be a low voltage NMOS transistor area requiring a threshold voltage lower than that of the second area AR2, the third area AR3 may be a high voltage NMOS transistor area requiring a threshold voltage higher than that of the first area AR1, and the second area AR2 may be a middle voltage NMOS transistor area requiring higher than that of the first area AR1 and lower than that of the third area AR3.

In some other embodiments, the first area AR1, the second area AR2, and the third area AR3 may be PMOS transistors areas. In this case, the first area AR1 may be a high voltage PMOS transistor area requiring a threshold voltage higher than that of the second area AR2, the third area AR3 may be a low voltage PMOS transistor area requiring a threshold voltage lower than that of the first area AR1, and the second area AR2 may be a middle voltage PMOS transistor area requiring lower than that of the first area AR1 and higher than that of the third area AR3.

In the present specification, a high voltage transistor may be a transistor having a threshold voltage higher than 1 V, and a low voltage transistor may be a transistor having a threshold voltage lower than 1 V but the examples are not limited thereto.

In some embodiments, the first area AR1, the second area AR2, and the third area AR3 may be independently a logic cell area, a memory cell area, or a peripheral circuit area.

In some embodiments, at least one of the first area AR1, the second area AR2, and the third area AR3 may be an area in which a transistor having a relatively low threshold voltage and high reliability but slow switching speed is formed. In some embodiments, at least one of the first area AR1, the second area AR2, and the third area AR3 may be a peripheral circuit area in which are formed peripheral circuits performing a function of inputting data from the outside to an internal circuit of the electronic device 700 or outputting the data of the internal circuit of the electronic device 700 to the outside. In some embodiments, at least one of the first area AR1, the second area AR2, and the third area AR3 may be configured as a part of an input/output (I/O) circuit device.

In some other embodiments, at least one of the first area AR1, the second area AR2, and the third area AR3 may be an area in which a transistor having a relatively low threshold voltage and fast switching speed is formed. In some embodiments, at least one of the first area AR1, the second area AR2, and the third area AR3 may be a cell array area in which unit memory cells are arranged in a matrix form. In some embodiments, at least one of the first area AR1, the second area AR2, and the third area AR3 may be a logic cell area or a memory cell area.

The logic cell area may include various kinds of logic cells including a plurality of circuit elements such as transistors, registers, etc., as standard cells performing desired logic functions such as a counter, a buffer, etc. The logic cell may configure, e.g., AND, NAND, OR, NOR, XOR (exclusive OR), XNOR (exclusive NOR), INV (inverter), ADD (adder), BUF (buffer), DLY (delay), FILL (filter), multiplexer (MXT/MXIT). OAI (OR/AND/INVERTER), AO (AND/OR), AOI (AND/OR/INVERTER), D flip-flop, reset flip-flop, master-slaver flip-flop, latch, etc. However, the cells are merely examples, and the logic cells according to the embodiments are not limited to the above examples. The memory cell area may include at least one of SRAM, DRAM, MRAM, RRAM, and PRAM.

Each of the integrated circuit devices 100, 200, 300, 400, 500, and 600 according to the inventive concepts described with reference to FIGS. 1 through 17B, and other integrated circuit devices having various structures modified and changed from the above integrated circuit devices 100, 200, 300, 400, 500, and 600, may be formed in at least one of the first area AR1, the second area AR2, and the third area AR3 shown in FIG. 19. For example, each of the first area I and the second area II of the integrated circuit devices 100, 200, 500, and 600 shown in FIGS. 1, 4, 16A through 16C, and 17A and 17B may be included in the same area or different areas selected from the first area AR1, the second area AR2, and the third area AR3 shown in FIG. 19. Similarly, each of the first area I, the second area II, and the third area III of the integrated circuit devices 300 and 400 shown in FIGS. 6 and 7 may be included in the same area or different areas selected from the first area AR1, the second area AR2, and the third area AR3 shown in FIG. 19.

Figure 20:
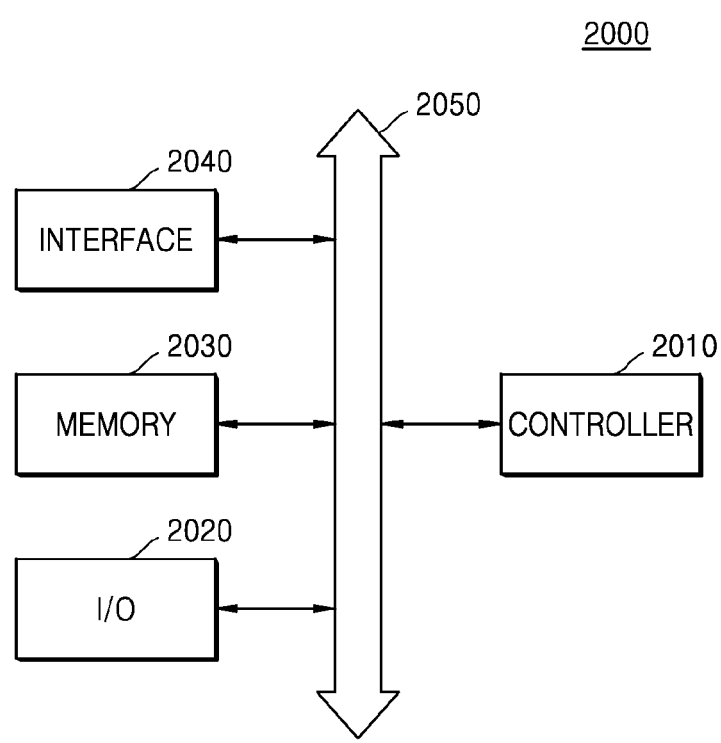
FIG. 20 is a block diagram of an electronic system according to exemplary embodiments.

FIG. 20 is a block diagram of an electronic system 2000 according to embodiments.

Referring to FIG. 20, the electronic system 2000 may include a controller 2010, an input/output (I/O) device 2020, a memory 2030, and an interface 2040 that are connected to one another via a bus 2050.

The controller 2010 may include at least one of a microprocessor, a digital signal processor, and other similar processors. The I/O device 2020 may include at least one of a keypad, a keyboard, and a display. The memory 2030 may be used to store a command executed by the controller 2010. For example, the memory 2030 may be used to store user data.

The electronic system 2000 may be configured as a wireless communication device, or a device capable of transmitting and/or receiving information under a wireless communication environment. The interface 2040 may include a wireless interface in order to transmit/receive data via a wireless communication network in the electronic system 2000. The interface 2040 may include an antenna and/or a wireless transceiver. In some embodiments, the electronic system 2000 may be used for a communication interface protocol of a third-generation communication system, e.g., code division multiple access (CDMA), global system for mobile communications (GSM), north American digital cellular (NADC), extended-time division multiple access (E-TDMA), and/or wide band code division multiple access (WCDMA). The electronic system 2000 may include at least one of the integrated circuit devices 100, 200, 300, 400, 500, and 600 illustrated in FIGS. 1 through 17B and other integrated circuit devices having various structures modified and changed from the above integrated circuit devices 100, 200, 300, 400, 500, and 600.

The disclosed embodiments provide an integrated circuit device of a gate structure having various optimized work functions with respect to a plurality of transistors requiring different threshold voltages.

While the concepts have been particularly shown and described with reference to embodiments thereof, it will be understood that various changes in form and details may be made therein without departing from the spirit and scope of the following claims.

What is claimed is:

1. An integrated circuit device comprising:
   a first high dielectric layer on a first active area of a substrate;
   a first gate stack on the first high dielectric layer and comprising a first work function adjustment metal containing structure having a first oxygen content;
   a second high dielectric layer formed on a second active area of the substrate; and
   a second gate stack formed on the second high dielectric layer and comprising a second work function adjustment metal containing structure having a second oxygen content that is greater than the first oxygen content of the first work function adjustment metal containing structure.

2. The integrated circuit device of claim 1,
   wherein the first high dielectric layer and the second high dielectric layer each comprise a metal oxide, and
   wherein the first high dielectric layer has a first oxygen vacancy density and the second high dielectric layer has a second oxygen vacancy density that is different from the first oxygen vacancy density.

3. The integrated circuit device of claim 1,
   wherein the first high dielectric layer and the second high dielectric layer each comprise a metal oxide, and
   wherein the first high dielectric layer has a first oxygen vacancy density and the second high dielectric layer has a second oxygen vacancy density that is lower than the first oxygen vacancy density.

4. The integrated circuit device of claim 1,
   wherein the first work function adjustment metal containing structure comprises a first conductive layer contacting the first high dielectric layer and including one layer of a first thickness,
   wherein the second work function adjustment metal containing structure comprises a second conductive layer formed at the same level as the first conductive layer and including multi-layers, the combined multi-layers having the first thickness, and
   wherein the multi-layers of the second conductive layer comprise:
   a lower second conductive layer contacting the second high dielectric layer; and
   an upper second conductive layer having an upper second oxygen content that is greater than the first oxygen content of the first conductive layer.

5. The integrated circuit device of claim 4, wherein a lower second oxygen content of the lower second conductive layer is the same as the first oxygen content of the first conductive layer.

6. The integrated circuit device of claim 1,
   wherein the first work function adjustment metal containing structure comprises a first conductive layer contacting the first high dielectric layer and including one layer of a first thickness,
   wherein the second work function adjustment metal containing structure comprises a second conductive layer having a second thickness that is greater than the first thickness, and
   wherein the second conductive layer comprises:
   a lower second conductive layer directly contacting the second high dielectric layer and having a lower second oxygen content that is greater that the first oxygen content of the first conductive layer; and
   an upper second conductive layer having the first thickness and an upper second oxygen content that is the same as the first oxygen content of the first conductive layer.

7. The integrated circuit device of claim 6, wherein the first conductive layer and the upper second conductive layer do not comprise oxygen.

8. The integrated circuit device of claim 6, wherein the first conductive layer and the upper second conductive layer comprise the same material.

9. The integrated circuit device of claim 1,
   wherein the first work function adjustment metal containing structure comprises a first conductive layer contacting the first high dielectric layer and including one layer of a first thickness, and
   wherein the second work function adjustment metal containing structure comprises a second conductive layer contacting the second high dielectric layer, the second conductive layer having the first thickness and having a second oxygen content that is greater than the first oxygen content of the first conductive layer.

10. The integrated circuit device of claim 1,
    wherein the first work function adjustment metal containing structure comprises a first conductive layer having the first oxygen content measured as per unit volume,
    wherein the second work function adjustment metal containing structure comprises a second conductive layer having the second oxygen content measured as the per unit volume, and wherein the second oxygen content is about 5~about 30 atom % per unit volume greater than the first oxygen content.

11. The integrated circuit device of claim 1,
wherein the first active area comprises a first channel area of a first conductive type covered by the first high dielectric layer, and
wherein the second active area comprises a second channel area of a second conductive type covered by the second high dielectric layer.

12. The integrated circuit device of claim 11,
wherein the first channel area is an N-type channel area, and
wherein the second channel area is a P-type channel area.

13. The integrated circuit device of claim 11, wherein the first channel area and the second channel area are N-type channel areas.

14. The integrated circuit device of claim 11, wherein the first channel area and the second channel area are P-type channel areas.

15. An integrated circuit device comprising:
a first gate structure comprising:
a first high dielectric layer formed on a first active area of a substrate and having a first oxygen vacancy density, and
a first work function adjustment metal containing structure formed on the first high dielectric layer and comprising a first conductive layer having a first oxygen content; and
a second gate structure comprising:
a second high dielectric layer formed on a second active area of the substrate and having a second oxygen vacancy density lower than the first oxygen vacancy density, and
a second work function adjustment metal containing structure formed on the second high dielectric layer and comprising a second conductive layer having a second oxygen content that is greater than the first oxygen content.

16. The integrated circuit device of claim 15,
wherein each of the first high dielectric layer and the second high dielectric layer comprises a first metal, and
wherein each of the first conductive layer and the second conductive layer comprises a second metal different from the first metal.

17. The integrated circuit device of claim 15, wherein the first conductive layer has a first thickness and the second conductive layer has a second thickness that is the same as the first thickness.

18. The integrated circuit device of claim 15, wherein the first work function adjustment metal containing structure has a first thickness and the second work function adjustment metal containing structure has a second thickness that is greater than the first thickness of the first work function adjustment metal containing structure.

19. The integrated circuit device of claim 15, further comprising:
a third gate structure comprising:
a third high dielectric layer formed on a third active area of the substrate and having a third oxygen vacancy density lower than the second oxygen vacancy density, and
a third work function adjustment metal containing structure formed on the third high dielectric layer and comprising a third conductive layer having a third oxygen content that is greater than the second oxygen content,
wherein the first conductive layer, the second conductive layer, and the third conductive layer comprise same metal.

20. The integrated circuit device of claim 19, wherein at least two of the first active area, the second active area, and the third active area comprise channel areas in which channels of the same conductive type are formed.

* * * * *